(12) United States Patent
Itoh et al.

(10) Patent No.: US 6,649,310 B2
(45) Date of Patent: Nov. 18, 2003

(54) METHOD OF MANUFACTURING PHOTOMASK

(75) Inventors: Masamitsu Itoh, Yokohama (JP); Shigeki Nojima, Yokohama (JP); Shoji Mimotogi, Yokohama (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 09/940,578

(22) Filed: Aug. 29, 2001

(65) Prior Publication Data

US 2002/0025480 A1 Feb. 28, 2002

(30) Foreign Application Priority Data

Aug. 30, 2000 (JP) ........................... 2000-260285
May 28, 2001 (JP) ........................... 2001-159380

(51) Int. Cl.[7] .................................................. G03F 9/00
(52) U.S. Cl. ................. 430/5; 430/30; 716/19; 716/21; 700/108; 700/109; 700/110
(58) Field of Search ................. 430/5, 22, 30; 382/144; 716/19, 21; 700/51, 108, 109, 110

(56) References Cited

U.S. PATENT DOCUMENTS

| | | | | |
|---|---|---|---|---|
| 5,202,748 A | * | 4/1993 | MacDonald et al. | 356/508 |
| 5,821,015 A | * | 10/1998 | Sugawara | 430/5 |
| 5,877,861 A | * | 3/1999 | Ausschnitt et al. | 430/30 |
| 5,965,306 A | * | 10/1999 | Mansfield et al. | 430/22 |
| 6,016,357 A | * | 1/2000 | Neary et al. | 430/30 |
| 6,366,822 B1 | * | 4/2002 | Heavlin | 700/31 |

FOREIGN PATENT DOCUMENTS

JP       2000-241959       9/2000

OTHER PUBLICATIONS

Wong and co-workers; "Level specific Lithography Optimization for 1–Gb DRAM" IEEE Trans on SC Mfg, v13(1), 2000, PP. 76–87.*

M. Sugawara et al.; "Influence of process latitude on exposure characteristics"; SPIE vol. 2726, pp. 583–597.

* cited by examiner

Primary Examiner—Mark F. Huff
Assistant Examiner—Kripa Sagar
(74) Attorney, Agent, or Firm—Finnegan, Henderson, Farabow, Garrett & Dunner, L.L.P.

(57) ABSTRACT

A method of manufacturing a photomask includes determining an average value of dimensions of a pattern in a photomask. determining an in-plane uniformity of the dimensions, determining an exposure latitude on the basis of the average value and the in-plane uniformity. The exposure latitude depends on dimensional accuracy of the pattern. Judging if the photomask is defective or non-defective is made on the basis of whether or not the exposure latitude falls within a prescribed exposure latitude

60 Claims, 30 Drawing Sheets

| ITEMS | SPECIFICATION VALUES |
|---|---|
| Deviation of average value of patterned dimension from target dimension | ±10nm or less |
| In-plane uniformity of patterned dimension | 8nm (3σ) or less |
| Linearity of patterned dimension | ±20nm or less |
| Residual error of patterned location | 20nm (3σ) or less |
| Magnification error of patterned location | 0.2ppm or less |
| Orthogonal error of patterned location | 0.2ppm or less |
| Defect | Free from defects 150nm or more in size |
| Deviation of average value of transmittance from target transmittance | ±0.2% |
| In-plane uniformity of permeability | ±0.1% |
| Deviation of average value of phase from 180 degrees | ±3 degrees |
| In-plane uniformity of phase | ±1.5 degrees |

FIG. 1

| ITEMS | SPECIFICATION VALUES | MEASURED VALUES |
|---|---|---|
| Deviation of average value of patterned dimension from target dimension | ±10nm or less | 13nm |
| In-plane uniformity of patterned dimension | 8nm (3σ) or less | 4nm |
| Linearity of patterned dimension | ±20nm or less | 15nm |
| Residual error of patterned location | 20nm (3σ) or less | 13nm |
| Magnification error of patterned location | 0.2ppm or less | 0.1ppm |
| Orthogonal error of patterned location | 0.2ppm or less | 0.1ppm |
| Defect | Free from defects 150nm or more in size | Free from defect |
| Deviation of average value of transmittance from target transmittance | ±0.2% | -0.15% |
| In-plane uniformity of permeability | ±0.1% | ±0.07% |
| Deviation of average value of phase from 180 degrees | ±3 degrees | ±2.1 degrees |
| In-plane uniformity of phase | ±1.5 degrees | ±1.1 degrees |

FIG. 2

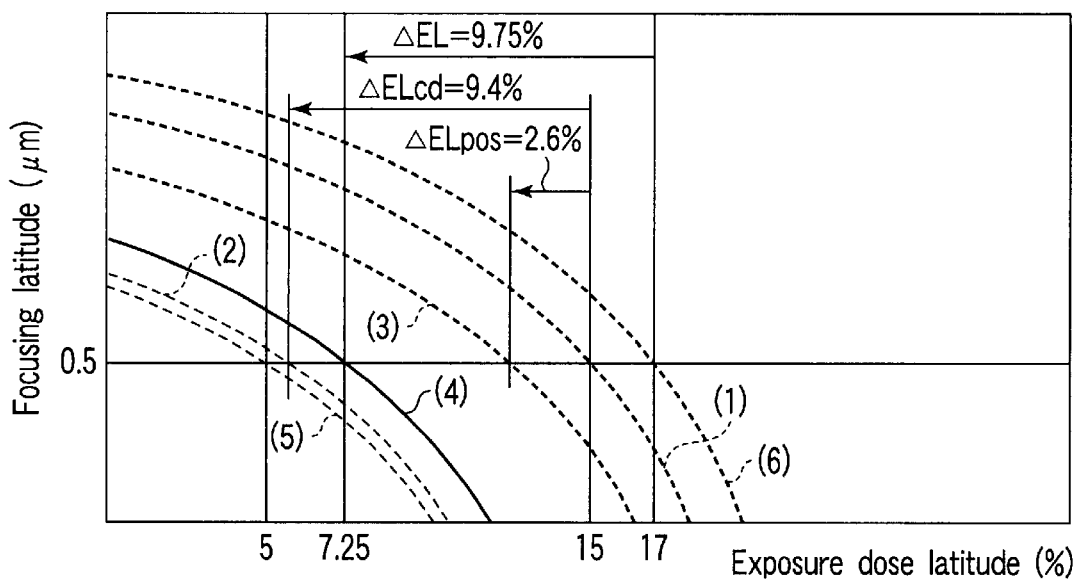
F I G. 16

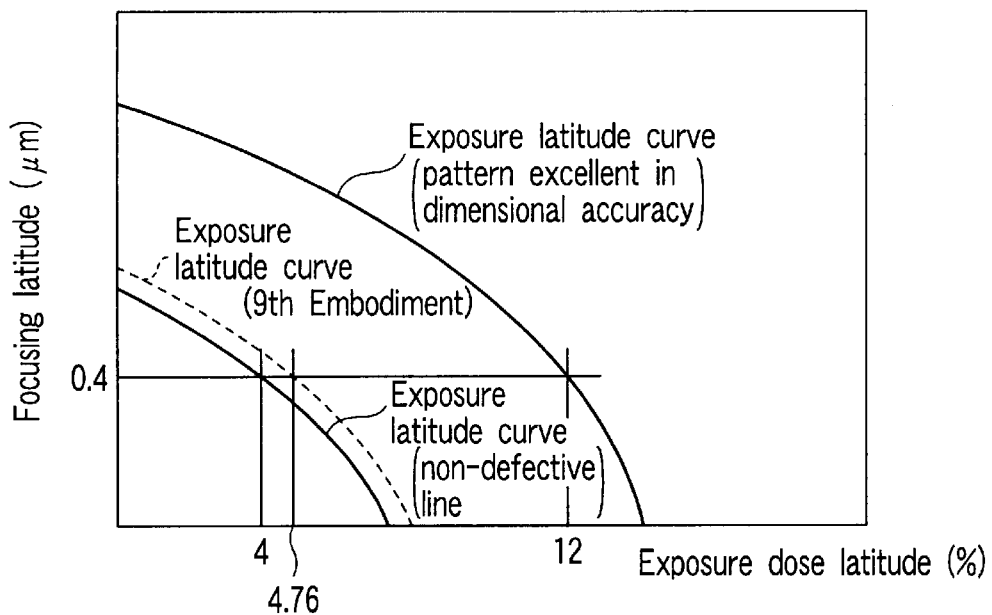
F I G. 20
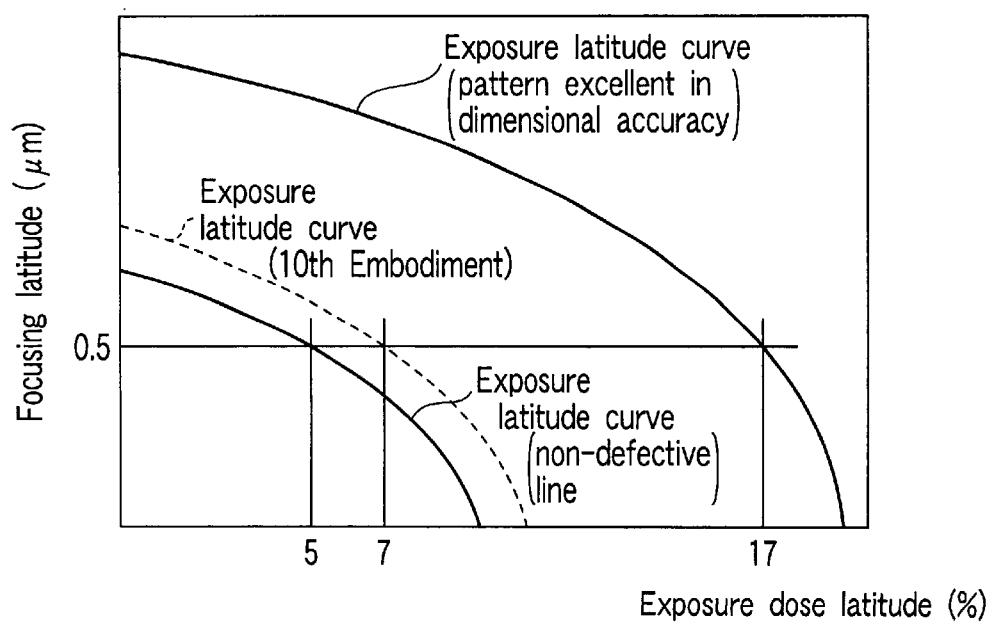
F I G. 22

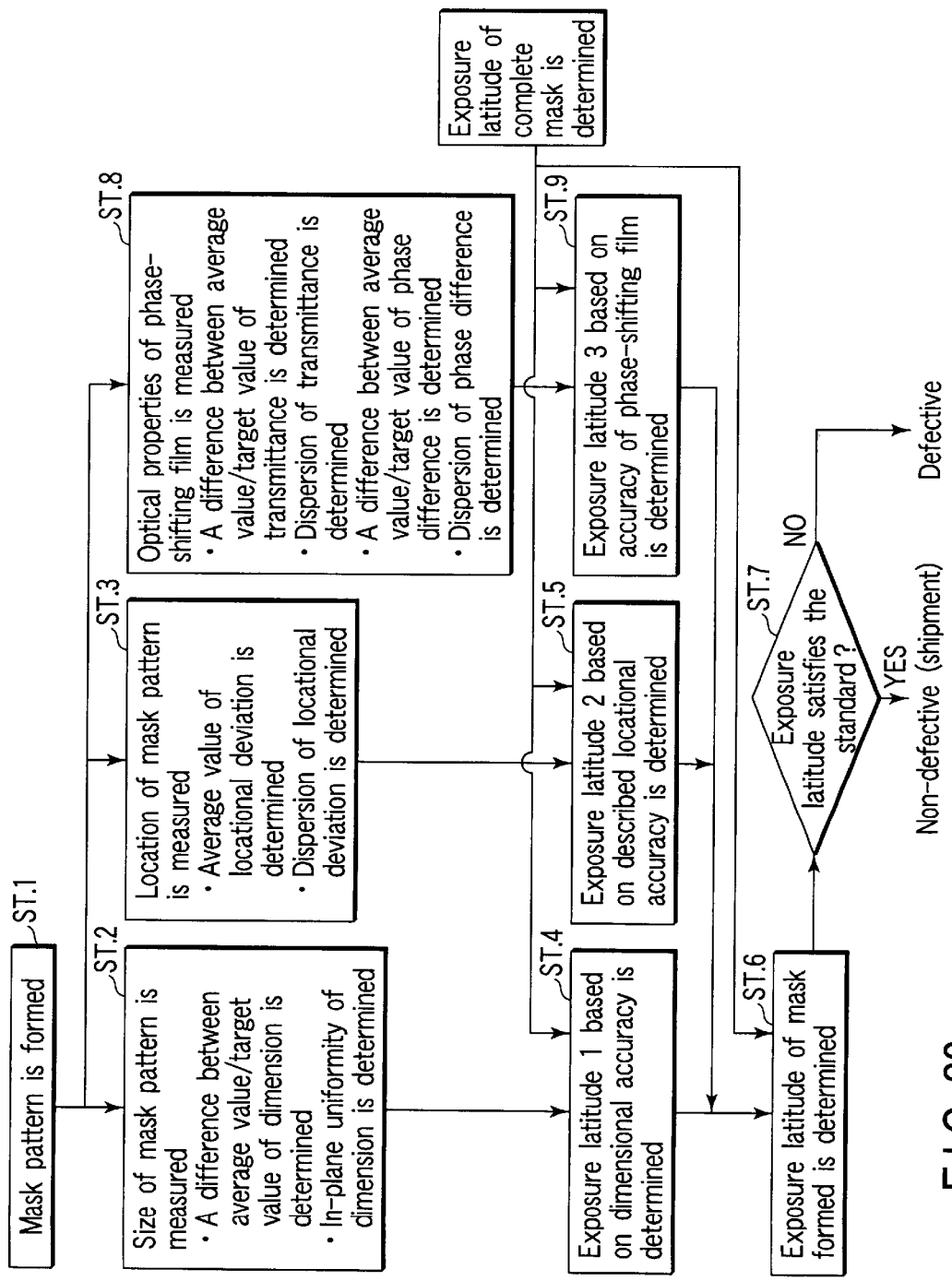
F I G. 23

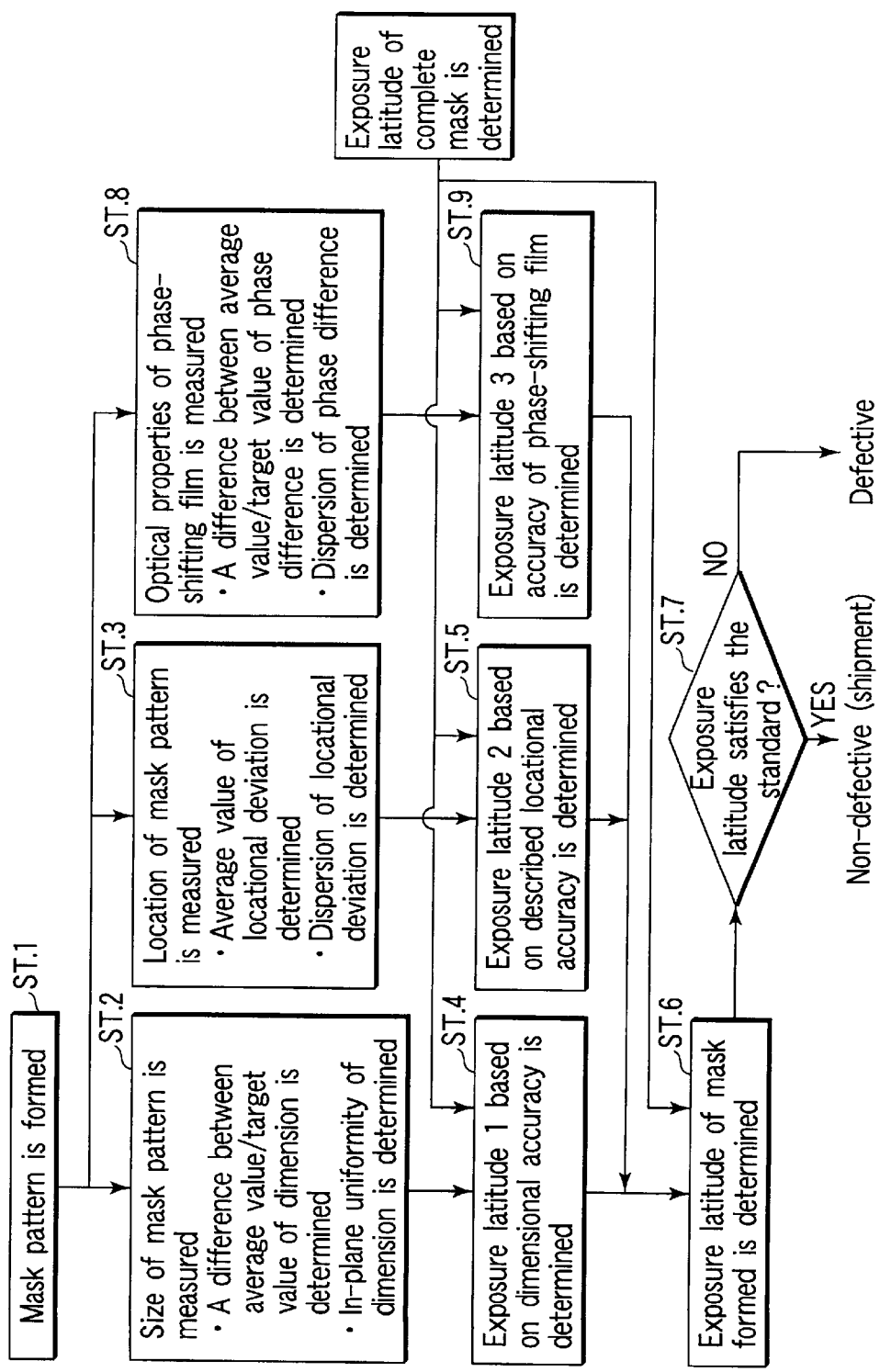
F I G. 25

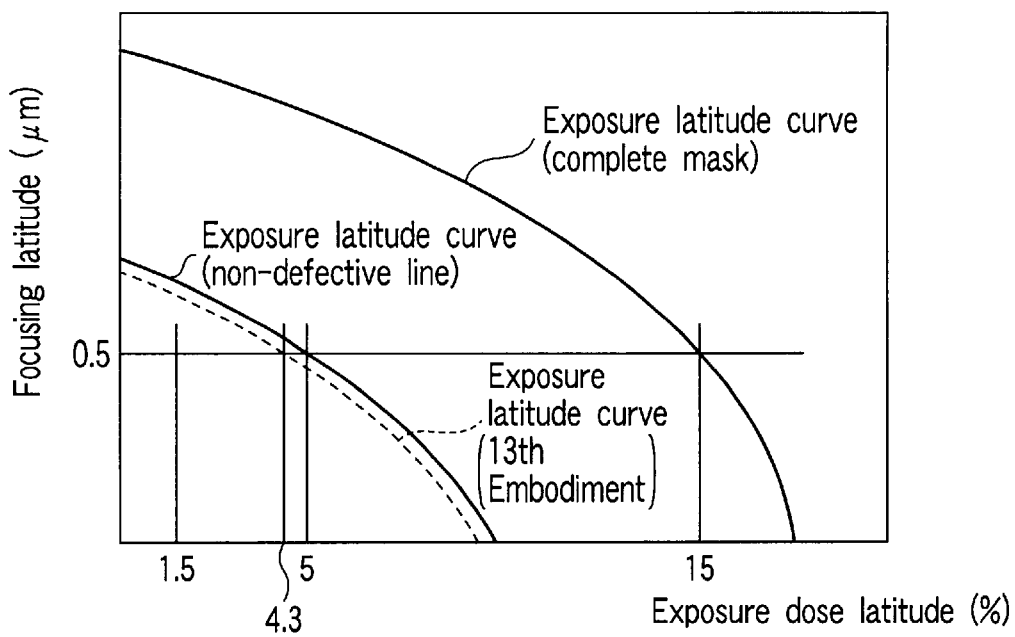
F I G. 28
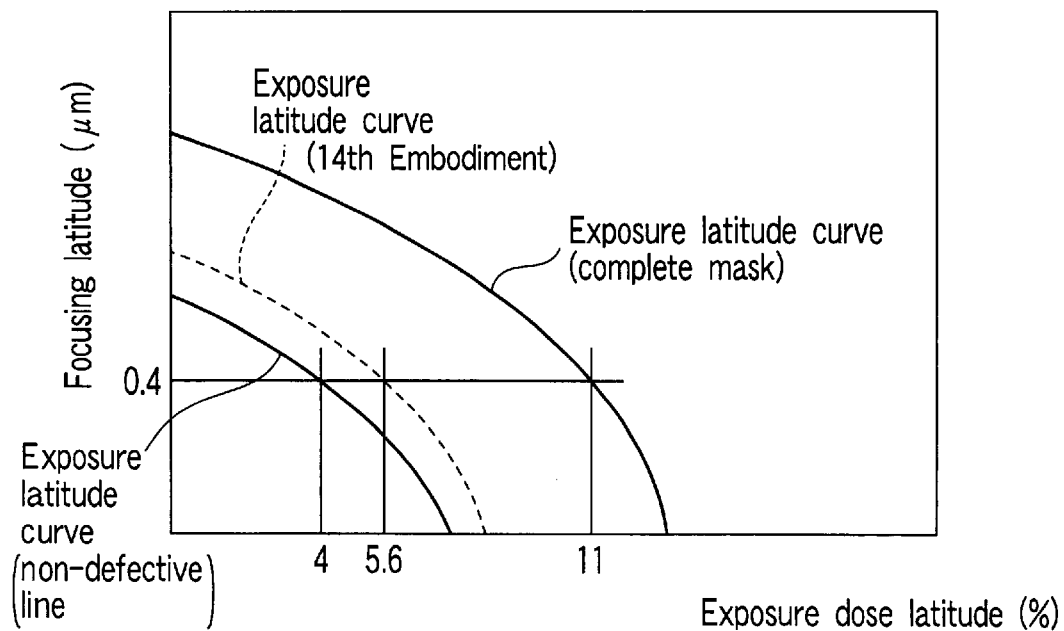
F I G. 30

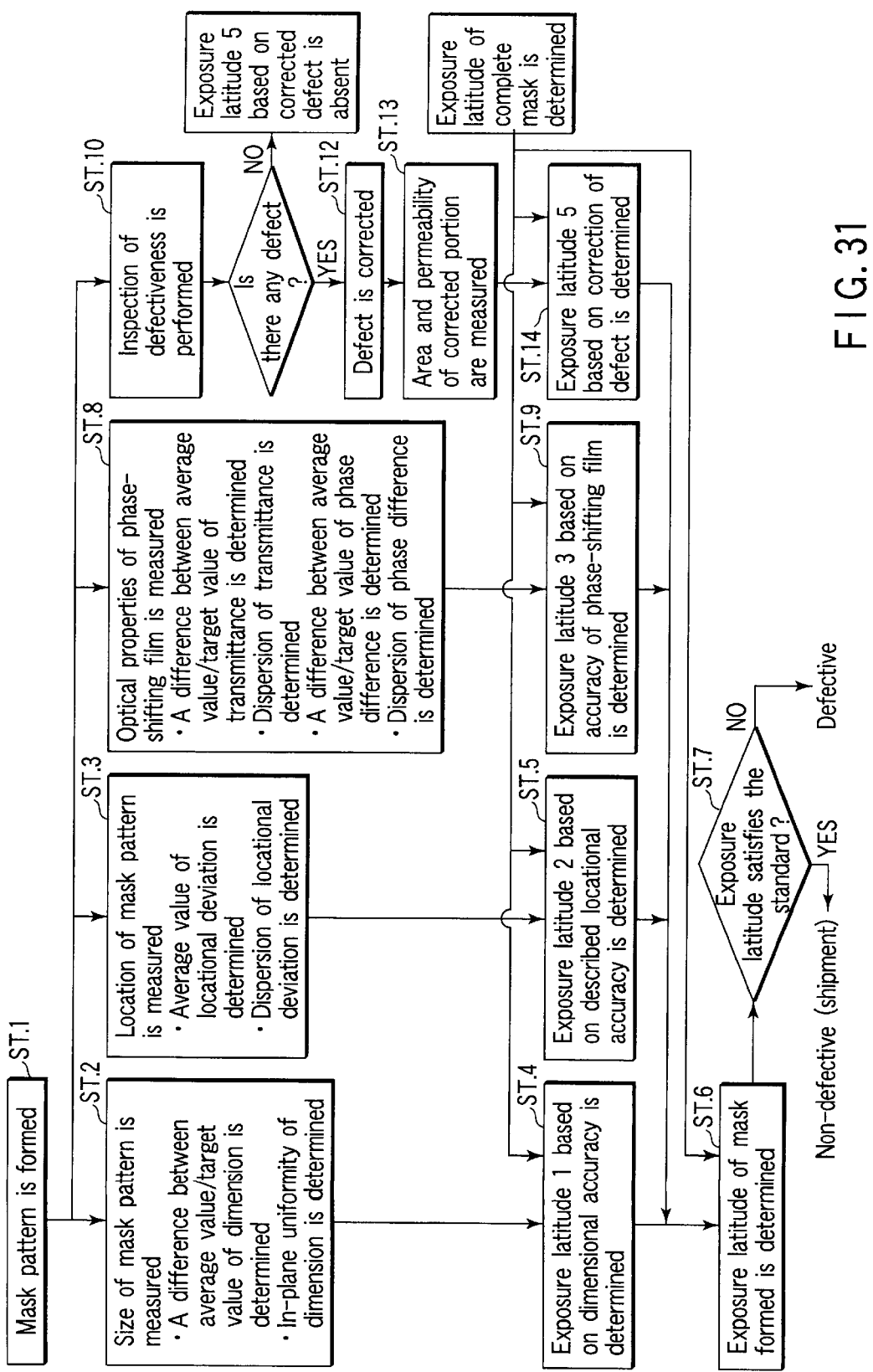
F I G. 31

METHOD OF MANUFACTURING PHOTOMASK

CROSS-REFERENCE TO RELATED APPLICATIONS

This application is based upon and claims the benefit of priority from prior Japanese Patent Applications No. 2000-260285, filed Aug. 30, 2000; and No. 2001-159380, filed May 28, 2001, the entire contents of both of which are incorporated by reference.

BACKGROUND OF THE INVENTION

1. Field of the Invention

This invention relates to a method of manufacturing a mask, such as a photomask, a phase-shifting mask, etc.

2. Description of the Related Art

The process of manufacturing a semiconductor device involves a pattern-forming step or so-called lithography step for forming various kinds of patterns on a semiconductor wafer. In this lithography step, a mask, such as a photomask, a phase-shifting mask, etc. is employed.

In recent years, to meet the trend to further refine or miniaturize a semiconductor device, an increasingly severe dimensional accuracy is now required for the mask of this kind. For example, the dimensional uniformity in-plane (in-plane uniformity) of mask is now required not to exceed over 10 nm.

According to the conventional manufacturing method of a photomask, a mask pattern is formed on a mask blank on the basis of specifications at first, and then, it is determined whether or not the mask is non-defective or defective. There are a large number of judgment items, and if any one of these judgment items fails to meet a specified condition, the mask is deemed as defective.

For example, in the case of a half-tone type phase-shifting mask, there are 11 items as representative specification items and specification values involved therein as shown in FIG. 1. If a mask fails to satisfy any one of these specification values among these items, the mask is deemed to be defective according to conventional practice. Therefore, in spite of the recent developments in enhancing the fineness in the mask manufacturing technique, the yield of the mask is very low.

BRIEF SUMMARY OF THE INVENTION

A method of manufacturing a photomask according to an aspect of the present invention comprises determining an average value of dimensions of a pattern in a photomask, determining an in-plane uniformity of the dimensions, determining an exposure latitude on the basis of the average value and the in-plane uniformity, and judging if the photomask is defective or non-defective on the basis of whether or not the exposure latitude falls within a prescribed exposure latitude.

BRIEF DESCRIPTION OF THE SEVERAL VIEWS OF THE DRAWING

FIG. 1 illustrates examples of specification values for a half-tone phase-shifting mask;

FIG. 2 illustrates examples of the results obtained with respect to the specification values for a half-tone phase-shifting mask;

FIG. 16 is a graph showing an example of a relationship between the focusing latitude and the exposure dose latitude according to an eighth example of the present invention;

FIG. 20 is a graph showing an example of a relationship between the focusing latitude and the exposure dose latitude according to a ninth example of the present invention;

FIG. 22 is a graph showing an example of a relationship between the focusing latitude and the exposure dose latitude according to a tenth example of the present invention;

FIG. 23 is a flow chart showing a method of manufacturing a half-tone phase-shifting mask according to an eleventh embodiment of the present invention;

FIG. 25 is a flow chart showing a method of manufacturing an alternating phase-shifting mask according to a twelfth embodiment of the present invention;

FIG. 28 is a graph showing an example of a relationship between the focusing latitude and the exposure dose latitude according to a thirteenth example of the present invention;

FIG. 30 is a graph showing an example of a relationship between the focusing latitude and the exposure dose latitude according to a fourteenth example of the present invention;

FIG. 31 is a flow chart showing a method of manufacturing a half-tone phase-shifting mask according to a fifteenth embodiment of the present invention;

DETAILED DESCRIPTION OF THE INVENTION

Figure 3:
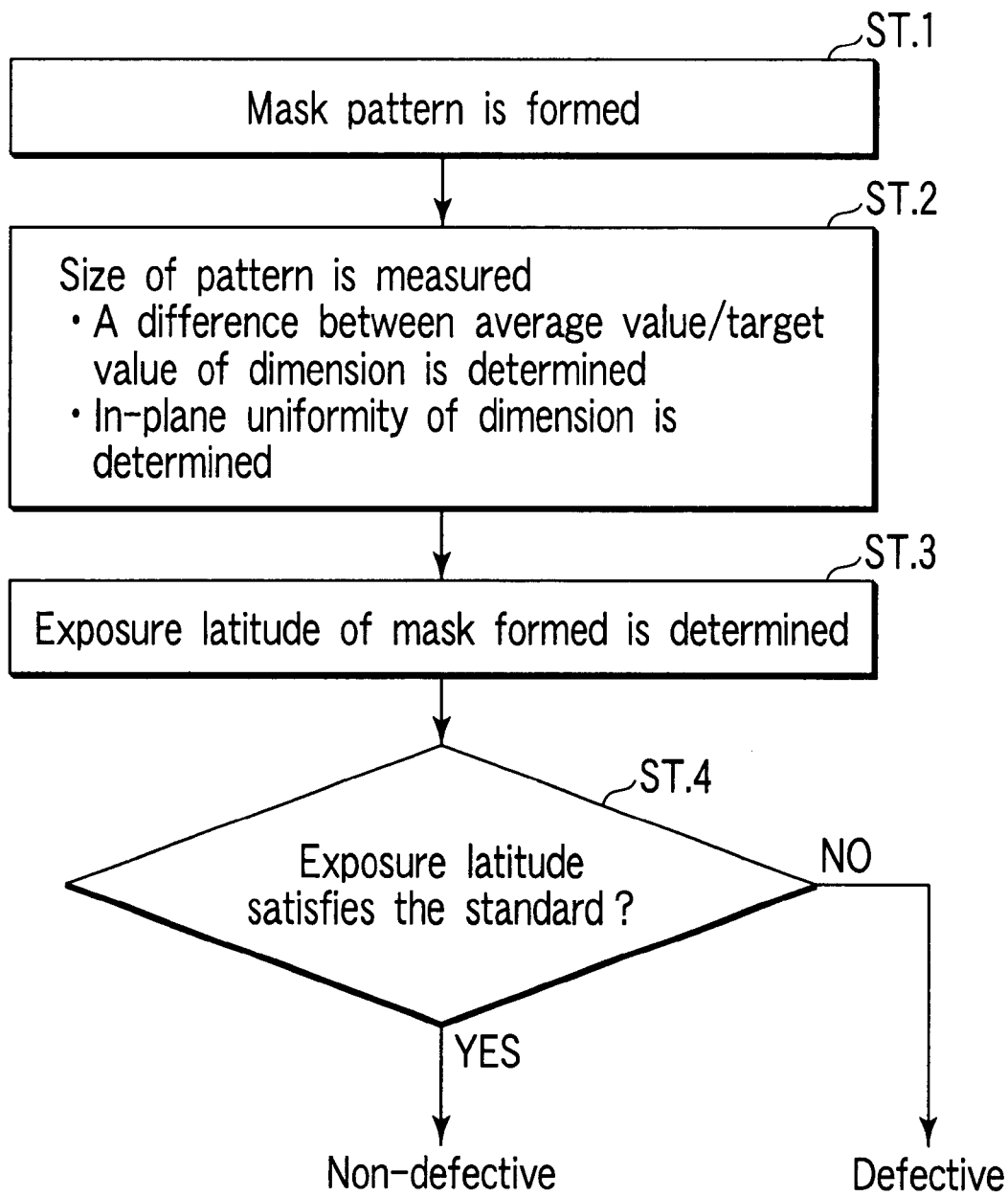
FIG. 3 is a flow chart showing a method of manufacturing a photomask according to a first embodiment of the present invention.

The present inventors have performed various analyses on masks which have been deemed defective according to the prior art, finding the following facts.

Generally, specifications for a photomask are required for securing a desirable predetermined exposure latitude in executing a patterning exposure to a semiconductor wafer. The specifications for a photomask are formulated so as to secure a desired exposure latitude even if a photomask is such that the features thereof, regarding the items specified in the specifications, are all satisfied but are very close to these limiting specification values.

However, it is very rare that all of the features of a photomask turn out to be very close to the specification values. Thus, most of the photomasks will be turned out such that even if some of the features of a photomask exceed specification values, the other features thereof would sufficiently satisfy the specification values. Assuming that while some of the features of a photomask may exceed specification values, the other features thereof would sufficiently satisfy the specification values, if a decrement of exposure latitude due to some defective features of a photomask that exceed specification values is smaller than an increment of exposure latitude owing to the other non-defective features thereof that sufficiently satisfy the specification values, it would become possible to obtain a desired exposure latitude as a whole.

For example, FIG. 2 illustrates one example of a half-tone type phase-shifting mask which is deemed as being defective according to the prior art, wherein an average dimensional value of the pattern of the mask that has been accomplished is deviated 13 nm from a target value, thus exceeding the specification value of ±10 nm, and the in-plane uniformity in dimension of the pattern of the mask is as small as 4 nm (3σ), which is sufficiently smaller than a specification value of 8 nm(3σ). When this mask was actually employed for performing the exposure process of a wafer so as to measure the defocusing latitude and exposure latitude, it was possible to obtain a desired exposure latitude.

As explained above, it has been found by the present inventors that the average value and in-plane uniformity of the dimensions of the pattern are both main items that decisively influence the exposure latitude in the case of a photomask. Based on this finding, the present inventors have performed the experiments as follows. Namely, after a mask pattern was formed on a photomask, the average value and in-plane uniformity of the dimensions of the pattern were measured, and based on the data thus measured, an exposure latitude was calculated so as to determine if the photomask had a desired exposure latitude, the photomask having a desired exposure latitude being judged non-defective. Further, for the purpose of confirming the usefulness of this exposure latitude, this mask was actually employed for performing the exposure process of a wafer so as to evaluate this exposure latitude. As a result, this mask was found employable as a non-defective mask in the practical use thereof. Therefore, it is now possible, according to the present invention, to recover a mask which has been conventionally deemed defective as a non-defective mask.

In the case of a half-tone phase-shifting mask, it is required, in addition to the measurement of the average value and in-plane uniformity of the dimensions of the pattern, to measure the average value and in-plane uniformity of transmittance of the semi-light shielding region and also the average value and in-plane uniformity of the magnitude of the phase-shift of the semi-light-shielding region. Then, based on the data thus obtained, the exposure latitude is calculated so as to determine if the mask is capable of exhibiting a desired exposure latitude.

In the case of an alternating phase-shifting mask, for example, a Levenson type phase-shifting mask, it is required, in addition to the measurement of the average value and in-plane uniformity of the dimensions of the pattern, to measure the average value and in-plane uniformity of the magnitude of the phase-shift of the light-transmitting region. Then, based on the data thus obtained, the exposure latitude is calculated to determine if the mask is capable of exhibiting a desired exposure latitude.

As explained above, the present inventors have found out a simple method wherein even a mask that has been deemed defective according to the conventional criterion can be easily recovered as non-defective, thus making it possible to enhance the yield of the mask. Namely, the method of manufacturing a mask according to the present invention is based on this finding.

In the following, various embodiments of the present invention will be explained with reference to drawings.

1st Embodiment

FIG. 3 is a flow chart showing a method of manufacturing a photomask according to a first embodiment of the present invention.

First, a pattern for 1GDRAM including a line-and-space (abbreviated as L/S hereinafter) type pattern of 0.15 μm rule was drawn on chromium mask blanks (hereinafter referred to as Cr mask blanks) coated thereon with a 500 nm-thick layer of chemical amplification type positive tone resist by making use of an electron beam writing apparatus (TOSHIBA MACHINE Co., Ltd., EBM3000) with an accelerating voltage of 50 keV. After finishing the writing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a mask pattern, for example, a Cr pattern (a light-shielding pattern). The etching apparatus employed in this case was MEPS-6025 (ULVAC COATING Co., Ltd.). Further, the etching gas employed in this case was a mixed gas comprising chlorine gas and oxygen gas. Thereafter, the resist pattern was subjected to an ashing process by making use of an ashing apparatus to remove the resist layer, and then, washed using a washing machine to obtain a photomask. (ST. 1)

Subsequently, the dimension of the Cr pattern of the photomask was measured using a dimension measuring device (LWM, Leica Co., Ltd.). As a result, a difference between an average value of the dimension of the Cr pattern and the target value was 5 nm, and the in-plane uniformity in the dimensions of the pattern was 15 nm (3σ). (ST. 2)

Then, on the basis of the data thus obtained on the difference between an average value of the dimensions of the Cr pattern and the target value, and on the in-plane uniformity of the dimensions of the pattern, the exposure latitude to be obtained when this photomask was employed for the exposure process of a wafer was calculated. The exposure latitude is calculated, for example, by obtaining a deposited energy profile distribution of an optical image on the wafer. (ST. 3)

As a result, it was found that the fluctuation in the dimensions of the pattern could be confined within 10%, while making it possible to secure a defocusing latitude of 0.4 μm, and to obtain an exposure dose latitude of 13%. The conditions of exposure employed for this calculation were selected to be the same as the exposure conditions to be actually employed for the mask, e.g., the wavelength of exposure light=248 nm; NA=0.6; σ=0.75; and a ⅔ annular illumination. Since a desired exposure latitude in this case was: for enabling the fluctuation in the dimensions of the pattern to be confined to not more than 10%, not less than 0.4 μm with respect to the defocusing latitude, and not less than 10% with respect to the exposure dose latitude, the mask thus obtained was found non-defective. (ST. 4)

The specification values for this photomask are conventionally set such that a difference between an average value of the dimensions of the Cr pattern and the target value should fall within ±10 nm, and the in-plane uniformity should be 3σ<10 nm. Therefore, this photomask satisfies the specification value with regard to the difference between an average value of the dimensions of the Cr pattern and the target value, but fails to satisfy the specification value with regard to the in-plane uniformity. As a result, according to the conventional criterion, this photomask would be deemed to be defective.

However, this photomask is capable of attaining the aforementioned desired exposure latitude as explained in this first embodiment, and hence is non-defective.

Additionally, for the purpose of confirming the exposure latitude of this photomask in the exposure process of a wafer, this photomask was employed for the exposure process of a wafer by making use of a KrF scanner (Nikon Co., Ltd.) to thereby evaluate the exposure latitude. This evaluation was performed by measuring the dimension of a resist pattern formed on the surface of wafer by making use of an SEM while changing the magnitude of defocusing as well as the exposure dose. As a result, the defocusing latitude that enables confining the magnitude of dimensional fluctuation of the resist pattern to not more than 10% was 0.45 μm, and the exposure dose latitude on this occasion was 12%, thus confirming that this photomask was clearly non-defective, even in the practical use.

According to the first embodiment, the following effects can be derived.

According to the prior art, a specification value is set in advance for the difference between an average value of the dimensions of the Cr pattern and the target value as well as for the in-plane uniformity, and if a photomask fails to satisfy any one of these specification values, the photomask is deemed as being defective and is discarded.

By contrast, according to this first embodiment, an exposure latitude is calculated at first on the basis of the data on the difference between an average value of the dimensions of the Cr pattern and the target value, as well as on the in-plane uniformity, and based on the magnitude of the exposure latitude thus calculated, it is determined if a desired or prescribed exposure latitude can be obtained, thus judging whether or not the mask is defective. As a result, among the photomasks that have been deemed as being defective according to the conventional criterion, some of them which are capable of obtaining a desired exposure latitude can be recovered as a non-defective photomask, thereby making it possible to enhance the yield of photomask.

2nd Embodiment

Next, a method of manufacturing a half-tone type phase-shifting mask according to a second embodiment of the present invention will be explained.

Figure 4:
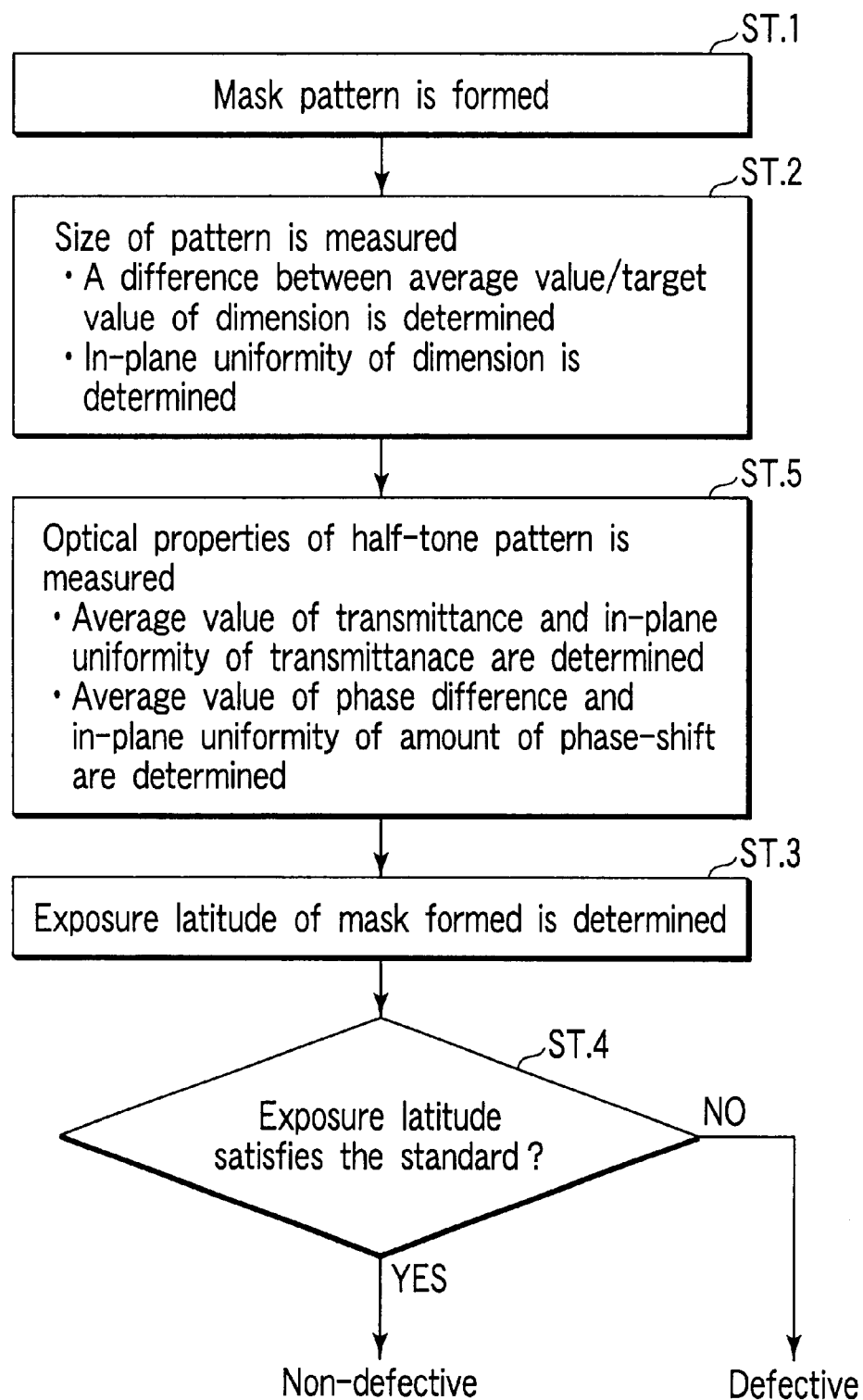
FIG. 4 is a flow chart showing a method of manufacturing a half-tone phase-shifting mask according to a second embodiment of the present invention.

FIG. 4 is a flow chart showing a method of manufacturing a half-tone phase-shifting mask according to a second embodiment of the present invention.

First, a pattern for 1GDRAM including a hole type pattern of 0.15 μm rule was drawn on half-tone mask blanks (hereinafter referred to as HT mask blanks) coated thereon with a 500 nm-thick layer of chemical amplification type positive tone resist by making use of an electron beam drawing apparatus (TOSHIBA MACHINE Co., Ltd., EBM3000) with an accelerating voltage of 50 keV. After finishing the drawing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a Cr pattern. The etching apparatus employed in this case was MEPS-6025 (ULVAC COATING Co., Ltd.). Further, the etching gas employed in this case was a mixed gas comprising chlorine gas and oxygen gas.

Thereafter, the resist pattern was subjected to an ashing process by making use of an ashing apparatus to remove the resist layer, and then, washed using a washing machine to obtain a half-tone phase-shifting mask. (ST. 1)

Subsequently, the dimension of the half-tone pattern (semi-light-shielding pattern) of the phase-shifting mask was measured using a dimension measuring device (LWM, Leica Co., Ltd.). As a result, a difference between an average value of the dimensions of the pattern and the target value was 11 nm, and the in-plane uniformity in dimension of the half-tone pattern was 8 nm (3σ). (ST. 2)

Thereafter, the in-plane multipoint measurement on the transmittance of the half-tone pattern was performed. As a result, the transmittance thereof was 5.7%±0.1%. Likewise, the in-plane multi-point measurement on the magnitude of phase-shift of the half-tone pattern was performed. As a result, the magnitude of the phase-shift thereof was 176.5 degrees ±0.5 degree. (ST. 5)

Then, on the basis of the data on the average value and in-plane uniformity of dimensions of this half-tone pattern, of the data on the average value and in-plane uniformity of the transmittance, and of the data on the average value and in-plane uniformity of the magnitude of phase-shift, the exposure latitude to be obtained when this phase-shifting mask was employed for the exposure process of a wafer was calculated. (ST. 3)

As a result, it was found that the fluctuation in the dimensions of the pattern could be confined within 10%, that it was possible to secure a defocusing latitude of 0.4 μm, and that it was possible to obtain an exposure dose latitude of 15%. The conditions of the exposure employed for this calculation were selected to be the same as the exposure conditions to be actually employed for the mask, e.g., the wavelength of exposure light=248 nm; NA=0.6; and σ=0.75. Since a desired exposure latitude in this case was: for enabling the fluctuation in the dimensions of the pattern to be confined to not more than 10%, not less than 0.4 μm with respect to the defocusing latitude; and not less than 10% with respect to the exposure dose latitude, the mask thus obtained was found non-defective. (ST. 4)

The specification values for this phase-shifting mask are conventionally set such that a difference between an average value of the dimensions of the pattern and the target value should fall within ±10 nm; the in-plane uniformity should be 3σ<10 nm; the average value of the transmittance should be in the range of 5.5 to 6.5%; the in-plane uniformity of the transmittance should be ±0.1%; the average magnitude of phase-shift should be in the range of 177 to 183 degrees, and the in-plane uniformity in the magnitude of the phase-shift should be ±1.2 degrees. Therefore, this phase-shifting mask fails to satisfy the specification value with respect to the average value of the dimensions of the pattern and also with respect to the average value of the magnitude of the phase-shift, thus making this phase-shifting mask defective according to the conventional criterion.

However, this photomask is capable of attaining the aforementioned desired exposure latitude as explained in this second embodiment, and hence, is non-defective.

Further, for the purpose of confirming the exposure latitude of this phase-shifting mask in the exposure process of a wafer, this phase-shifting mask was employed for the exposure process of a wafer by making use of a KrF scanner (Nikon Co., Ltd.) to thereby evaluate the exposure latitude. This evaluation was performed by measuring the dimension of a resist pattern formed on the surface of the wafer by making use of an SEM while changing the magnitude of defocusing as well as the exposure dose. As a result, the defocusing latitude that enables confining the magnitude of the dimensional fluctuations of the resist pattern to not more than 10% was 0.4 μm, and the exposure dose latitude on this occasion was 16%, thus confirming that this phase-shifting mask was clearly non-defective, even in the practical use.

According to the second embodiment, the following effects can be derived.

Namely, according to the prior art, a specification value is set in advance for the average value and in-plane uniformity of the dimensions of the pattern, for the average value and in-plane uniformity of the transmittance of the half-tone pattern, and for the average value and in-plane uniformity of the magnitude of the phase-shift of the half-tone pattern, respectively, and if a phase-shifting mask fails to satisfy any one of these specification values, the phase-shifting mask is deemed as being defective and is discarded.

By contrast, according to this second embodiment, an exposure latitude is calculated at first on the basis of the data on the average value and in-plane uniformity of the dimensions of the pattern, of the data on the average value and in-plane uniformity of the transmittance of the half-tone pattern, and of the data on the average value and in-plane uniformity of the magnitude of the phase-shift of the half-tone pattern, and based on the magnitude of exposure latitude thus calculated, it is determined if a desired or prescribed exposure latitude can be obtained, thus judging whether or not the mask is defective. As a result, among the photomasks that have been deemed as being defective according to the conventional criterion, some of them which may fail to satisfy the specification value regarding the average value but can sufficiently satisfy the specification value regarding the in-plane uniformity, for example, and therefore, are capable of obtaining a desired exposure latitude can be recovered as a non-defective photomask, thereby making it possible to enhance the yield of photomask.

3rd Embodiment

Next, a method of manufacturing an alternating phase-shifting mask, for example, a Levenson type phase-shifting mask according to a third embodiment of the present invention will be explained.

Figure 5:
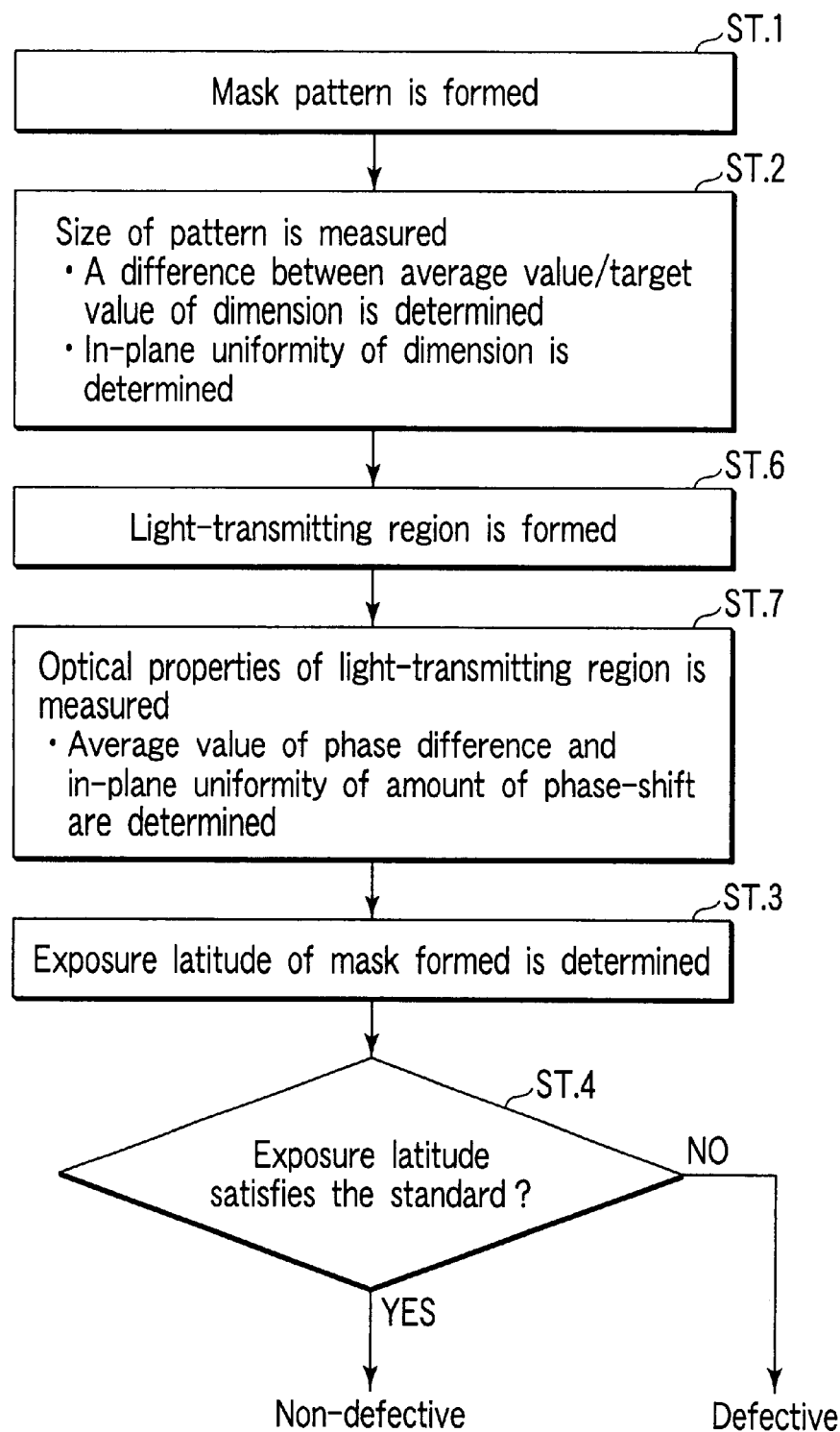
FIG. 5 is a flow chart showing a method of manufacturing an alternating phase-shifting mask according to a third embodiment of the present invention.

FIG. 5 is a flow chart showing a method of manufacturing an alternating phase-shifting mask according to a third embodiment of the present invention.

First, a pattern for 1GDRAM including an L/S type pattern of 0.15 μm rule was drawn on Cr mask blanks coated thereon with a 500 nm-thick layer of chemical amplification type positive tone resist by making use of an electron beam drawing apparatus (TOSHIBA MACHINE Co., Ltd., EBM3000) with an accelerating voltage of 50 keV. After finishing the drawing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a Cr pattern. The etching apparatus employed in this case was MEPS-6025 (ULVAC COATING Co., Ltd.). Further, the etching gas employed in this case was a mixed gas comprising chlorine gas and oxygen gas. Thereafter, the resist pattern was subjected to an ashing process by making use of an ashing apparatus to remove the resist layer, and then, washed using a washing machine to obtain a Levenson phase-shifting mask. (ST. 1)

Subsequently, the dimensions of the Cr pattern thus formed was measured using a dimension measuring device (LWM, Leica Co., Ltd.). As a result, a difference between an average value of the dimensions of the pattern and the target value was 11 nm, and the in-plane uniformity of the dimensions of the Cr pattern was 8 nm (3σ). (ST. 2)

Then, a resist for i-beam (hereinafter referred to as i-beam resist) was coated on the mask, and a region for etching quartz glass was drawn by making use of a laser beam-writing apparatus. After being developed, the resultant i-beam resist pattern was employed as an etching mask in the etching of a quartz substrate by making use of a reactive ion etching apparatus (MEPS-6025) wherein the etching was performed so as to make the magnitude of the phase-shift become 175 degrees. Then, by means of wet etching, the quartz substrate was further etched so as to increase the magnitude of the phase-shift by 5 degrees. As a result, the magnitude of the phase-shift at the light-transmitting portion of this so-called Levenson type phase-shifting mask became 180 degrees. Thereafter, the i-beam resist layer was peeled away, and the resultant substrate was washed using a washing machine. (ST. 6)

Then, the in-plane distribution of the magnitude of the phase-shift was investigated by way of multi-point measurement. As a result, the magnitude of the phase-shift thereof was found 178.5 degrees ±1.0 degree. (ST. 7)

Then, on the basis of the data on the average value and in-plane uniformity of the dimensions of this pattern, and of the data on the average value and in-plane uniformity of the magnitude of the phase-shift, the exposure latitude to be obtained when this phase-shifting mask was employed for the exposure process of a wafer was calculated. As a result, it was found that the fluctuation in the dimensions of the pattern could be confined within 10%, that it was possible to secure a defocusing latitude of 0.4 µm, and that it was possible to obtain an exposure dose latitude of 15%. The conditions of exposure employed for this calculation were selected to be the same as the exposure conditions to be actually employed for the mask, e.g., the wavelength of exposure light=248 nm; NA=0.6; and σ=0.75. Since a desired exposure latitude in this case was: for enabling the fluctuation in the dimensions of the pattern to be confined to not more than 10%, not less than 0.4 µm with respect to the defocusing latitude, and not less than 10% with respect to the exposure dose latitude, the mask thus obtained was found non-defective. (ST. 4)

The specification values for this phase-shifting mask are conventionally set such that a difference between an average value of the dimensions of the pattern and the target value should fall within ±10 nm; the in-plane uniformity should be 3≦<10 nm; the average magnitude of the phase-shift should be in the range of 177 to 183 degrees; and the in-plane uniformity of the magnitude of the phase-shift should be ±1.2 degrees. Therefore, this phase-shifting mask fails to satisfy the specification value with respect to the average value of the dimensions of the pattern, thus making this phase-shifting mask defective according to the conventional criterion.

However, this photomask is capable of attaining the aforementioned desired exposure latitude as explained in this second embodiment, and hence is non-defective.

Further, for the purpose of confirming the exposure latitude of this phase-shifting mask in the exposure process of a wafer, this phase-shifting mask was employed for the exposure process of a wafer by making use of a KrF scanner (Nikon Co., Ltd.) to thereby evaluate the exposure latitude. This evaluation was performed by measuring the dimensions of a resist pattern formed on the surface of the wafer by making use of an SEM while changing the magnitude of defocusing as well as the exposure dose. As a result, the defocusing latitude that enables confining the magnitude of the dimensional fluctuation of the resist pattern to not more than 10% was 0.4 µm, and the exposure dose latitude on this occasion was 16%, thus confirming that this phase-shifting mask was clearly non-defective, even in the practical use.

According to the second embodiment, the following effects can be derived.

Namely, according to the prior art, a specification value is set in advance for the average value and in-plane uniformity of the dimensions of the pattern, and for the average value and in-plane uniformity of the magnitude of the phase-shift of the pattern, respectively, and if a phase-shifting mask fails to satisfy any one of these specification values, the phase-shifting mask is deemed as being defective and is discarded.

By contrast, according to this third embodiment, an exposure latitude is calculated at first on the basis of the data on the average value and in-plane uniformity of the dimensions of the pattern, and of the data on the average value and in-plane uniformity of the magnitude of the phase-shift of the pattern, and based on the magnitude of the exposure latitude thus calculated, it is determined if a desired or prescribed exposure latitude can be obtained, thus judging whether or not the mask is defective. As a result, among the photomasks that have been deemed as being defective according to the conventional criterion, some of them which may fail to satisfy the specification value regarding the average value but can sufficiently satisfy the specification value regarding the in-plane uniformity, for example, and therefore, are capable of obtaining a desired exposure latitude, can be recovered as a non-defective photomask, thereby making it possible to enhance the yield of the photomask.

4th Embodiment

Next, a method of manufacturing a photomask according to a fourth embodiment of the present invention will be explained.

Figure 6:
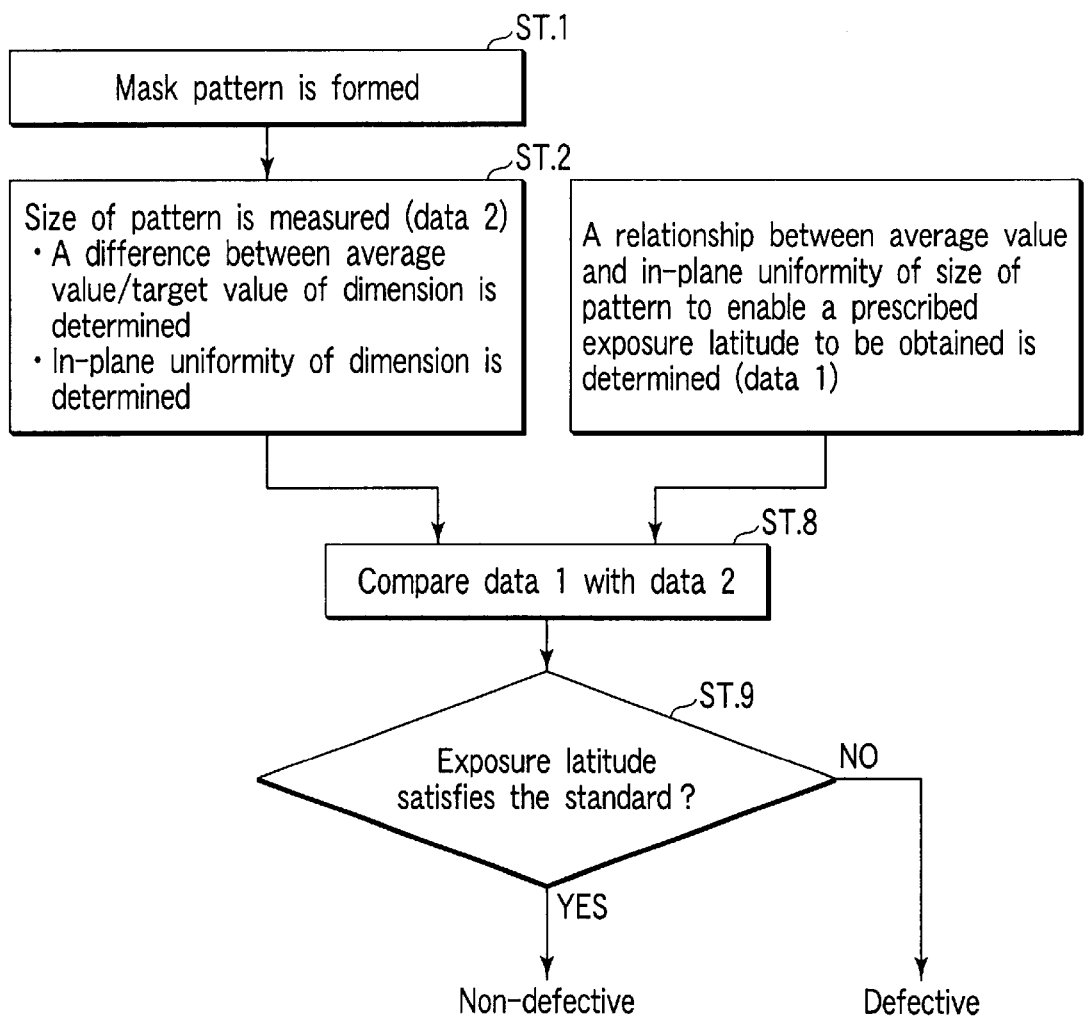
FIG. 6 is a flow chart showing a method of manufacturing a photomask according to a fourth embodiment of the present invention.
Figure 7:
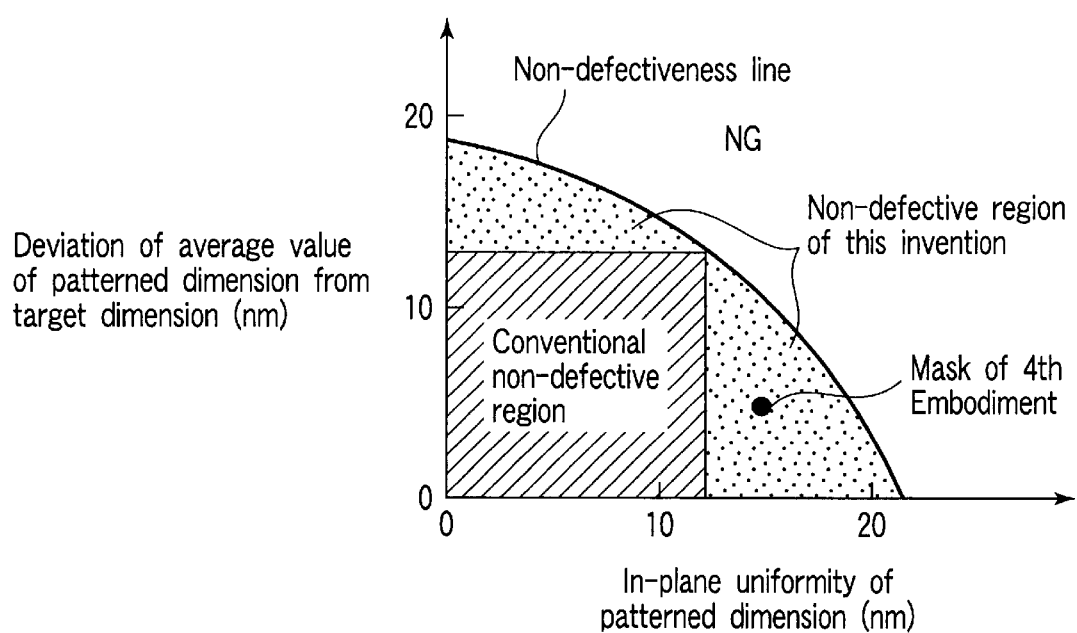
FIG. 7 is a graph showing an example of a relationship between an average value and an in-plane uniformity of dimensions of a pattern that enables a prescribed exposure latitude to be obtained.

FIG. 6 is a flow chart showing a method of manufacturing a photomask according to a fourth embodiment of the present invention. FIG. 7 is a graph showing an example of a relationship between an average value and an in-plane uniformity of the dimensions of a pattern that enables a prescribed exposure latitude to be obtained.

First, a pattern for 1GDRAM including an L/S type pattern of 0.15 µm rule was drawn on Cr mask blanks coated thereon with a 500 nm-thick layer of chemical amplification type positive tone resist by making use of an electron beam drawing apparatus (TOSHIBA MACHINE Co., Ltd., EBM3000) with an accelerating voltage of 50 keV. After finishing the drawing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a Cr pattern. The etching apparatus employed in this case was MEPS-6025 (ULVAC COATING Co., Ltd.). Further, the etching gas employed in this case was a mixed gas comprising chlorine gas and oxygen gas. Thereafter, the resist pattern was removed by making use of an ashing apparatus to remove the resist layer, and then, washed using a washing machine to obtain a photomask. (ST. 1)

Subsequently, the dimensions of the Cr pattern of the photomask was measured using a dimension measuring device (LWM, Leica Co., Ltd.). As a result, a difference between an average value of the dimensions of the Cr pattern and the target value was 5 nm, and the in-plane uniformity of the dimensions of the pattern was 15 nm (3σ). (ST. 2)

Then, by comparing the relationship between the average value of the dimensions of the pattern and the in-plane uniformity of the dimensions of the pattern, that enables obtaining the prescribed exposure latitude and that has been determined in advance through calculation (a curve shown in FIG. 7), with the data on the average value and in-plane uniformity of the dimensions of the pattern that have been actually obtained through measurements, it was determined whether or not the aforementioned prescribed exposure latitude could be obtained with this mask. (ST. 8 and ST. 9)

Namely, if this relationship falls within a region inside the curve, the mask can be judged as being non-defective, whereas if this relationship falls within a region outside the curve, the mask can be judged as being defective. In the case of this mask, since this relationship was found to fall within a region inside the curve of FIG. 7, this mask was judged as being non-defective. The conditions of exposure employed for calculation to obtain the curve of FIG. 7 were selected to be the same as the exposure conditions to be actually employed for the mask, e.g., the wavelength of exposure light=248 nm; NA=0.6; σ=0.75; and a ⅔ annular illumination. A desired exposure latitude in this case was: for enabling the fluctuation in the dimensions of the pattern to be confined to not more than 10%, not less than 0.4 μm with respect to the defocusing latitude, and not less than 10% with respect to the exposure dose latitude.

The specification values for this photomask are conventionally set such that a difference between an average value of the dimensions of the Cr pattern and the target value should fall within ±10 nm, and the in-plane uniformity should be 3σ<10 nm. Therefore, this photomask satisfies the condition on the average value of the dimensions of the pattern, but fails to satisfy the specification value with regard to the in-plane uniformity. As a result, according to the conventional criterion, this photomask would be deemed to be defective.

However, this photomask is capable of attaining the aforementioned desired exposure latitude as explained in this fourth embodiment.

Additionally, for the purpose of confirming the exposure latitude of this photomask in the exposure process of a wafer, this photomask was employed for the exposure process of a wafer by making use of a KrF scanner (Nikon Co., Ltd.) to thereby evaluate the exposure latitude. This evaluation was performed by measuring the dimensions of a resist pattern formed on the surface of the wafer by making use of an SEM while changing the magnitude of defocusing as well as the exposure dose. As a result, the defocusing latitude that enables confining the magnitude of dimensional fluctuation of the resist pattern to not more than 10% was 0.45 μm, and the exposure dose latitude on this occasion was 12%, thus confirming that this photomask was clearly non-defective, even in the practical use.

According to the fourth embodiment, the relationship between the average value and the in-plane uniformity of the dimensions of the pattern, that enables obtaining the prescribed exposure latitude is determined in advance. Then, this relationship is compared with the data on the average value and on the in-plane uniformity of the dimensions of the pattern that have been actually measured so as to determine whether or not the aforementioned prescribed exposure latitude can be obtained with the mask, thereby judging whether the mask is defective or non-defective. As a result, among the photomasks that have been deemed as being defective according to the conventional criterion, some of them which may fail to satisfy the specification value regarding the average value but can sufficiently satisfy the specification value regarding the in-plane uniformity, for example, and therefore, are capable of obtaining a desired exposure latitude can be recovered as a non-defective photomask, thereby making it possible to enhance the yield of the photomask.

5th Embodiment

Next, a method of manufacturing a half-tone phase-shifting mask according to a fifth embodiment of the present invention will be explained.

Figure 8:
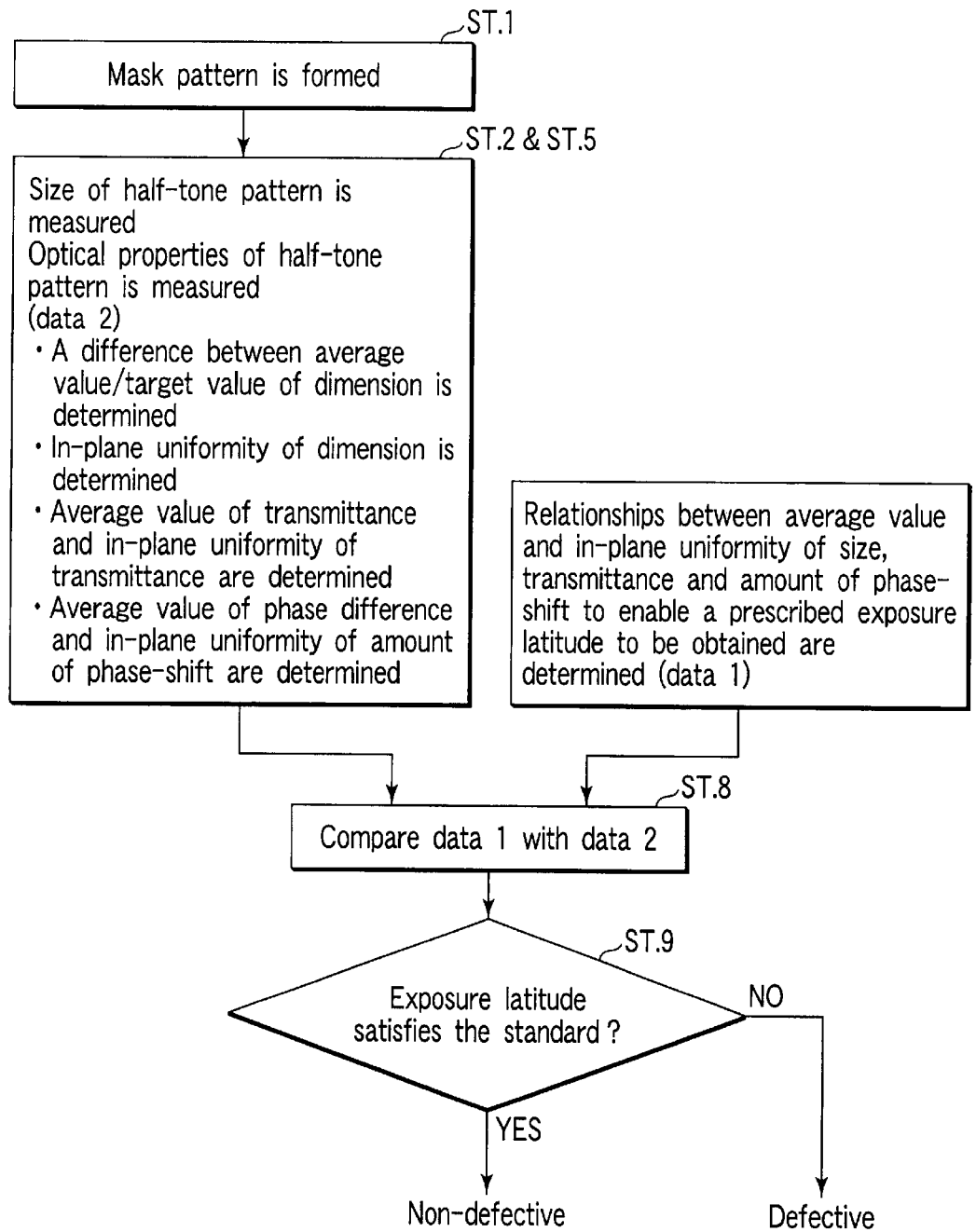
FIG. 8 is a flow chart showing a method of manufacturing a half-tone phase-shifting mask according to a fifth embodiment of the present invention.

FIG. 8 is a flow chart showing a method of manufacturing a half-tone phase-shifting mask according to a fifth embodiment of the present invention.

First, a pattern for 1GDRAM including a hole type pattern of 0.15 μm rule was drawn on HT mask blanks coated thereon with a 500 nm-thick layer of chemical amplification type positive tone resist by making use of an electron beam drawing apparatus (TOSHIBA MACHINE Co., Ltd., EBM3000) with an accelerating voltage of 50 keV. After finishing the drawing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a Cr pattern. The etching apparatus employed in this case was MEPS-6025 (ULVAC COATING Co., Ltd.). Further, the etching gas employed in this case was a mixed gas comprising chlorine gas and oxygen gas. Thereafter, the resist pattern was subjected to an ashing process by making use of an ashing apparatus to remove the resist layer, and then, washed using a washing machine to obtain a half-tone phase-shifting mask. (ST. 1)

Subsequently, the dimensions of the half-tone pattern (semi-light-shielding pattern) of the phase-shifting mask were measured using a dimension measuring device (LWM, Leica Co., Ltd.). As a result, a difference between an average value of the dimensions of the pattern and the target value was 11 nm, and the in-plane uniformity of the dimensions of the half-tone pattern was 8 nm (3σ). Thereafter, the in-plane multi-point measurement on the transmittance of the half-tone pattern was performed. As a result, the transmittance thereof was 5.7%±0.1%. Likewise, the in-plane multi-point measurement on the magnitude of the phase-shift of the half-tone pattern was performed. As a result, the magnitude of the phase-shift thereof was 176.5 degrees ±0.5 degree. (ST. 2 and ST. 5)

Then, the data on the average value and in-plane uniformity of the dimensions of this half-tone pattern, the data on the average value and in-plane uniformity of the transmittance, and the data on the average value and in-plane uniformity of the magnitude of the phase-shift were compared with a relationship between an average value and an in-plane uniformity of the dimensions of the pattern for enabling a prescribed exposure latitude to be obtained, with a relationship between an average value and an in-plane uniformity of transmittance for enabling a prescribed exposure latitude to be obtained, and with a relationship between an average value and an in-plane uniformity of the magnitude of the phase-shift for enabling a prescribed exposure latitude to be obtained, these relationships being calculated in advance, to thereby determine if the mask was capable of obtaining the prescribed exposure latitude (since these relationships are six dimensional, they are not shown in the graph). As a result, this mask was found capable of obtaining the prescribed desired exposure latitude. The conditions of exposure employed for this calculation were selected to be the same as the exposure conditions to be actually employed for the mask, e.g., the wavelength of exposure light=248 nm; NA=0.6; and σ=0.75. A desired exposure latitude in this case was: for enabling the fluctuation of the dimensions of the pattern to be confined to not more than 10%, not less than 0.4 μm with respect to the defocusing latitude, and not less than 10% with respect to the exposure dose latitude. (ST. 8 and ST. 9)

The specification values for this phase-shifting mask are conventionally set such that a difference between an average value of the dimensions of the pattern and the target value should fall within ±10 nm; the in-plane uniformity should be 3σ<10 nm; the average value of the transmittance should be in the range of 5.5 to 6.5%; the in-plane uniformity of the transmittance should be ±0.1%; the average magnitude of the phase-shift should be in the range of 177 to 183 degrees; and the in-plane uniformity of the magnitude of the phase-shift should be ±1.2 degrees. Therefore, this phase-shifting mask fails to satisfy the specification value with respect to the average value of the dimensions of the pattern and also with respect to the average value of the magnitude of the phase-shift, thus making this phase-shifting mask defective according to the conventional criterion.

However, this photomask is capable of attaining the aforementioned desired exposure latitude as explained in this fifth embodiment, and hence is non-defective.

Further, for the purpose of confirming the exposure latitude of this phase-shifting mask in the exposure process of a wafer, this phase-shifting mask was employed for the exposure process of a wafer by making use of a KrF scanner (Nikon Co., Ltd.) to thereby evaluate the exposure latitude. This evaluation was performed by measuring the dimensions of a resist pattern formed on the surface of the wafer by making use of an SEM while changing the magnitude of defocusing as well as the exposure dose. As a result, the defocusing latitude that enables confining the magnitude of the dimensional fluctuation of the resist pattern to not more than 10% was 0.4 μm, and the exposure dose latitude on this occasion was 16%, thus confirming that this phase-shifting mask was clearly non-defective, even in the practical use.

According to the fifth embodiment, a relationship between an average value and an in-plane uniformity of the dimensions of the pattern for enabling a prescribed exposure latitude to be obtained, a relationship between an average value and an in-plane uniformity of the transmittance of the half-tone pattern for enabling a prescribed exposure latitude to be obtained, and a relationship between an average value and an in-plane uniformity of the magnitude of the phase-shift of the half-tone pattern for enabling a prescribed exposure latitude to be obtained are determined in advance, and these relationships are compared with the data measured on the average value and in-plane uniformity of the dimensions of the mask pattern, with the data measured on the average value and in-plane uniformity of the transmittance of the half-tone pattern, and with the data measured on the average value and in-plane uniformity of the magnitude of the phase-shift of the half-tone pattern, respectively, to thereby determine if the mask was capable of obtaining the prescribed exposure latitude, thus judging if the mask was defective or non-defective. As a result, among the photomasks that have been deemed as being defective according to the conventional criterion, some of them which may fail to satisfy the specification value regarding the average value but can sufficiently satisfy the specification value regarding the in-plane uniformity, for example, and therefore, are capable of obtaining a desired exposure latitude can be recovered as a non-defective photomask, thereby making it possible to greatly enhance the yield of the photomask.

6th Embodiment

Next, the method of manufacturing an alternating phase-shifting mask, for example, a Levenson type phase-shifting mask according to a sixth embodiment of the present invention will be explained.

Figure 9:
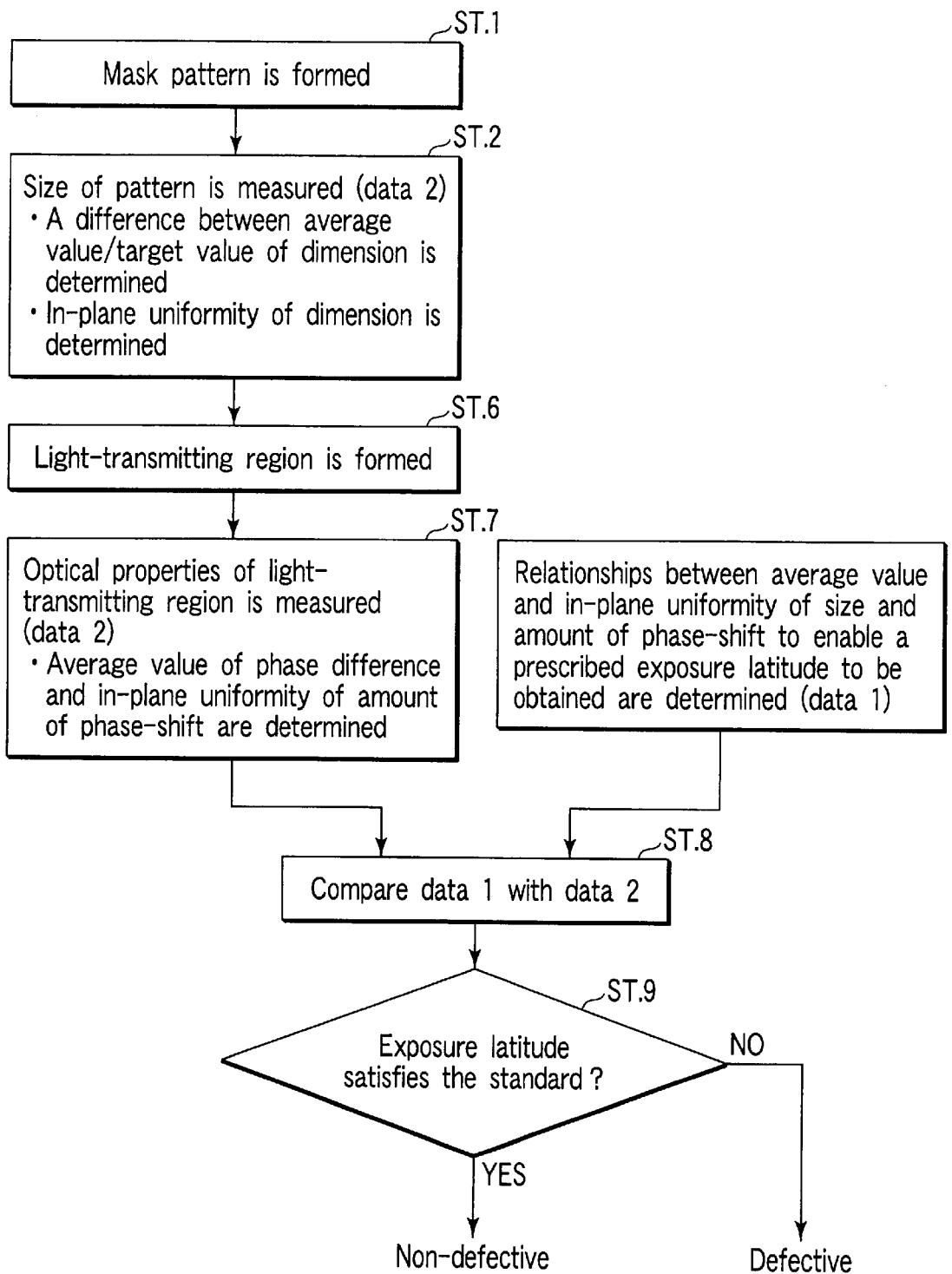
FIG. 9 is a flow chart showing a method of manufacturing an alternating phase-shifting mask according to a sixth embodiment of the present invention.

FIG. 9 is a flow chart showing a method of manufacturing an alternating phase-shifting mask according to a sixth embodiment of the present invention.

First, a pattern for 1GDRAM including an L/S type pattern of 0.15 m rule was drawn on Cr mask blanks coated thereon with a 500 nm-thick layer of chemical amplification type positive tone resist by making use of an electron beam drawing apparatus (TOSHIBA MACHINE Co., Ltd., EBM3000) with an accelerating voltage of 50 keV. After finishing the drawing, the resist was baked for 15 minutes at a temperature of 110° C., and was subjected to a spray development using an alkaline developing solution to form a resist pattern. Then, by making use of this resist pattern as an etching mask, the Cr film was etched by way of reactive ion etching to form a Cr pattern. The etching apparatus employed in this case was MEPS-6025 (ULVAC COATING Co., Ltd.). Further, the etching gas employed in this case was a mixed gas comprising chlorine gas and oxygen gas. Thereafter, the resist pattern was subjected to an ashing process by making use of an ashing apparatus to remove the resist layer, and then, washed using a washing machine to obtain a Levenson phase-shifting mask. (ST. 1)

Subsequently, the dimensions of the Cr pattern thus formed were measured using a dimension measuring device (LWM, Leica Co., Ltd.). As a result, a difference between an average value of the dimensions of the pattern and the target value was 11 nm, and the in-plane uniformity of the dimensions of the Cr pattern was 8 nm (3σ). (ST. 2)

Then, a resist for an i-beam resist was coated on the mask, and a region for etching quartz glass was drawn by making use of a laser beam-writing apparatus.

After being developed, the resultant i-beam resist pattern was employed as an etching mask in the etching of a quartz substrate by making use of a reactive ion etching apparatus (MEPS-6025) wherein the etching was performed so as to make the magnitude of the phase-shift become 175 degrees. Then, by means of wet etching, the quartz substrate was further etched so as to increase the magnitude of the phase-shift by 5 degrees. As a result, the magnitude of the phase-shift at the light-transmitting portion of this so-called Levenson type phase-shifting mask became 180 degrees. Thereafter, the i-beam resist layer was peeled away, and the resultant substrate was washed using a washing machine. (ST. 6)

Then, the in-plane distribution of the magnitude of the phase-shift was investigated by way of multipoint measurement. As a result, the magnitude of the phase-shift thereof was 178.5 degrees ±1.0 degrees. (ST. 7)

Then, the data on the average value and in-plane uniformity of the dimensions of this pattern, and the data on the average value and in-plane uniformity of the magnitude of the phase-shift were compared with a relationship between an average value and an in-plane uniformity of the dimensions of the pattern for enabling a prescribed exposure latitude to be obtained, and with a relationship between an average value and an in-plane uniformity of the magnitude of the phase-shift for enabling a prescribed exposure latitude to be obtained, these relationships being calculated in advance, to thereby determine if the mask was capable of obtaining the prescribed exposure latitude (since these relationships are four dimensional, they are not shown in the graph). As a result, this mask was found capable of obtaining the prescribed desired exposure latitude. The conditions of exposure employed for this calculation were selected to be the same as the exposure conditions to be actually employed for the mask, e.g., the wavelength of exposure light=248 nm; NA=0.6; and σ=0.75. A desired exposure latitude in this case was: for enabling the fluctuation in the dimensions of the pattern to be confined to not more than 10%, not less than 0.4 μm with respect to the defocusing latitude, and not less than 10% with respect to the exposure dose latitude. (ST. 8 and ST. 9)

The specification values for this phase-shifting mask are conventionally set such that a difference between an average value of the dimensions of the pattern and the target value should fall within ±10 nm; the in-plane uniformity should be 3σ<10 nm; the average magnitude of the phase-shift should be in the range of 177 to 183 degrees; and the in-plane uniformity of the magnitude of the phase-shift should be ±1.2 degrees. Therefore, this phase-shifting mask fails to satisfy the specification value with respect to the average value of the dimensions of the pattern, thus making this phase-shifting mask defective according to the conventional criterion.

However, this photomask is capable of attaining the aforementioned desired exposure latitude as explained in this embodiment, and hence is non-defective.

Further, for the purpose of confirming the exposure latitude of this phase-shifting mask in the exposure process of a wafer, this phase-shifting mask was employed for the exposure process of a wafer by making use of a KrF scanner (Nikon Co., Ltd.) to thereby evaluate the exposure latitude. This evaluation was performed by measuring the dimensions of a resist pattern formed on the surface of the wafer by making use of an SEM while changing the magnitude of defocusing as well as the exposure dose. As a result, the defocusing latitude that enables confining the magnitude of the dimensional fluctuation of the resist pattern to not more than 10% was 0.4 μm, and the exposure dose latitude on this occasion was 16%, thus confirming that this phase-shifting mask was clearly non-defective, even in the practical use.

According to the sixth embodiment, a relationship between an average value and an in-plane uniformity of the dimensions of the pattern for enabling a prescribed exposure latitude to be obtained, and a relationship between an average value and an in-plane uniformity of the magnitude of the phase-shift of the pattern for enabling a prescribed exposure latitude to be obtained are determined in advance, and these relationships are compared with the data measured on the average value and in-plane uniformity of the dimensions of the mask pattern, and with the data measured on the average value and in-plane uniformity of the magnitude of the phase-shift of the mask pattern, respectively, to thereby determine if the mask was capable of obtaining the prescribed exposure latitude, thus judging if the mask was defective or non-defective. As a result, among the photomasks that have been deemed as being defective according to the conventional criterion, some of them which may fail to satisfy the specification value regarding the average value but can sufficiently satisfy the specification value regarding the in-plane uniformity, for example, and therefore, are capable of obtaining a desired exposure latitude can be recovered as a non-defective photomask, thereby making it possible to greatly enhance the yield of the photomask.

7th Embodiment

Next, a method of manufacturing a photomask according to a seventh embodiment of the present invention will be explained FIGS. 10 to 14.

Figure 10:
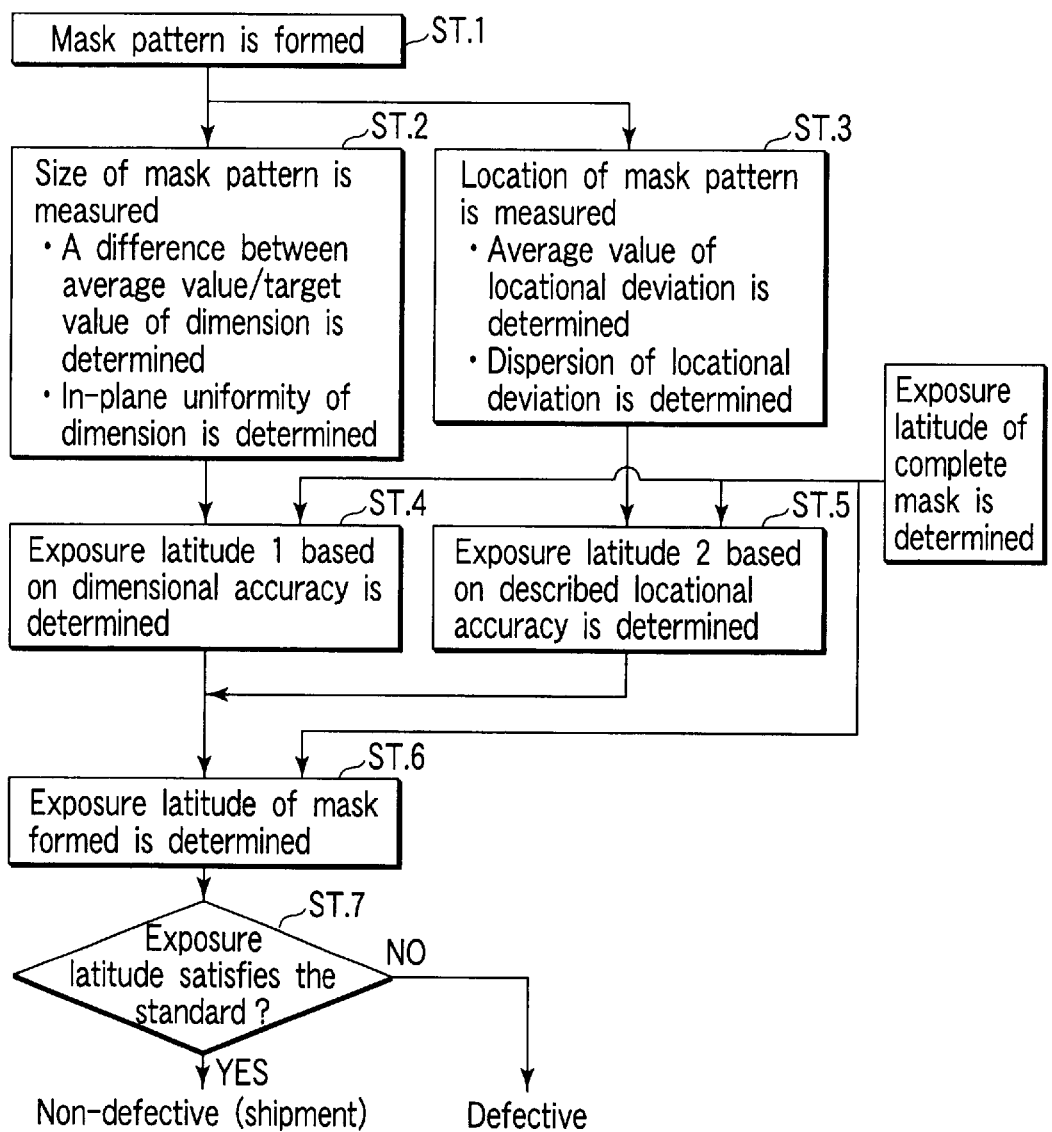
FIG. 10 is a flow chart showing a method of manufacturing a photomask according to a seventh embodiment of the present invention.
Figures 11A, 11B:
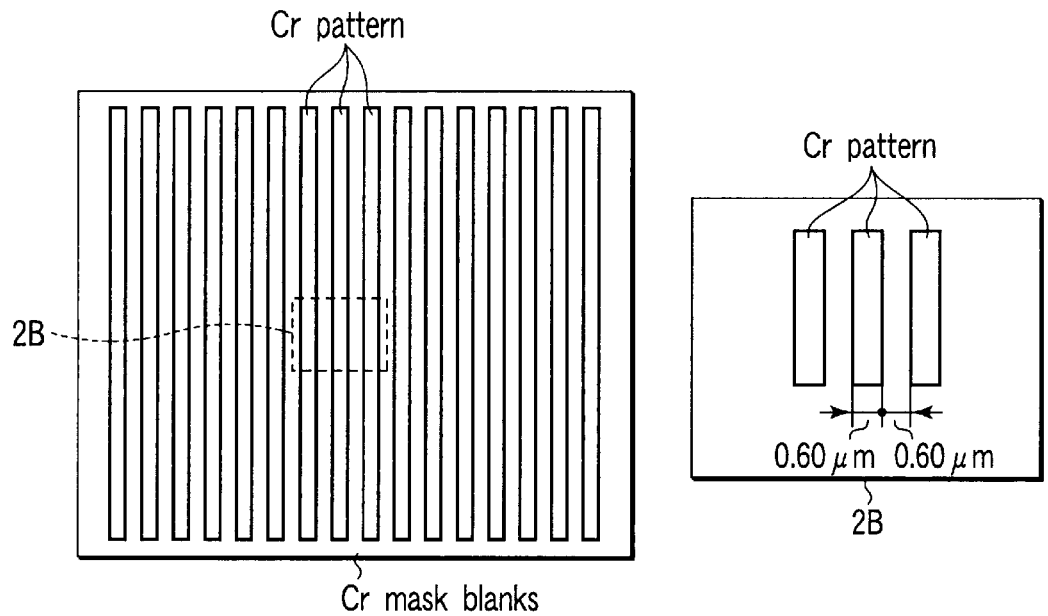
FIGS. 11A and 11B are plan views, each showing an example of a Cr mask blank.
Figures 12A, 12B:
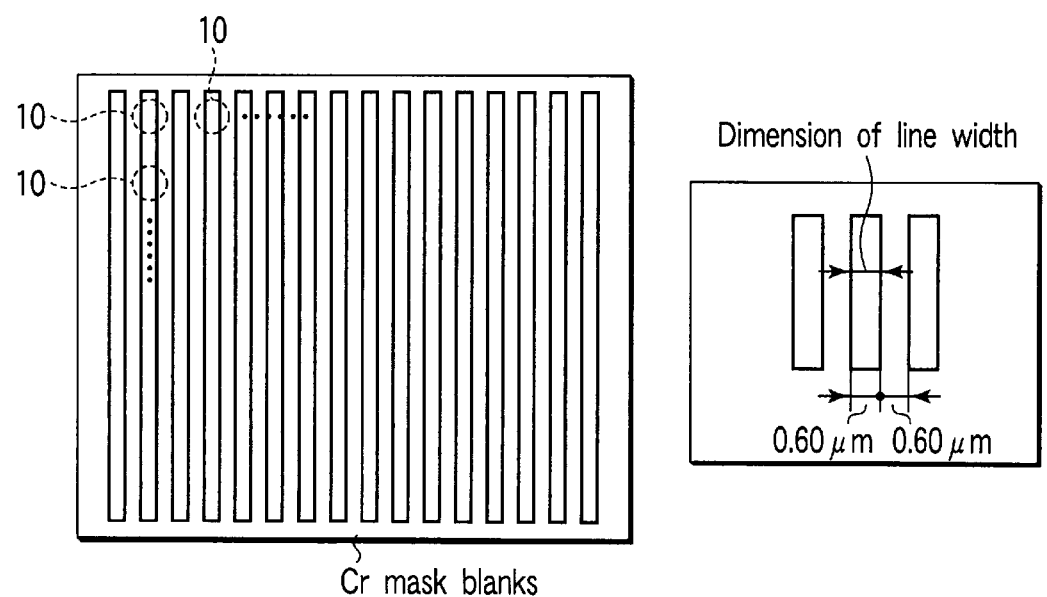
FIGS. 12A and 12B are plan views, each showing an example of a method for measuring dimensions of a pattern.
Figure 13:
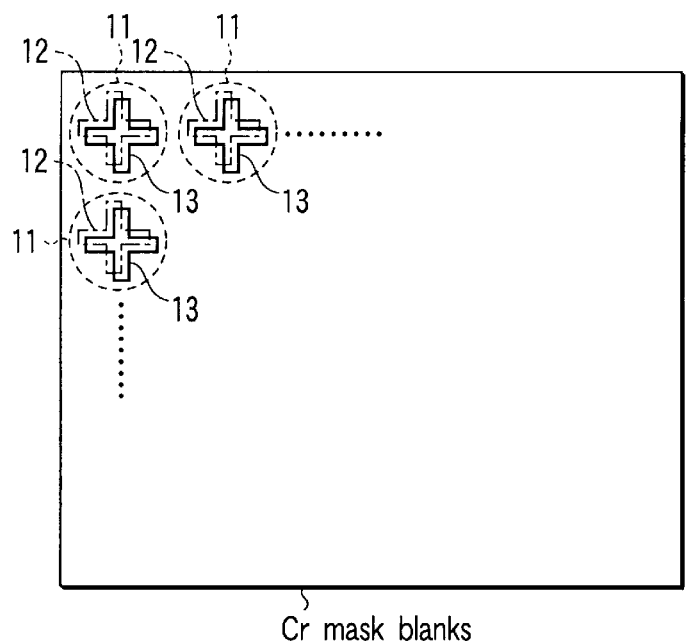
FIG. 13 is a plan view showing an example of a method for measuring the location of a pattern.
Figure 14:
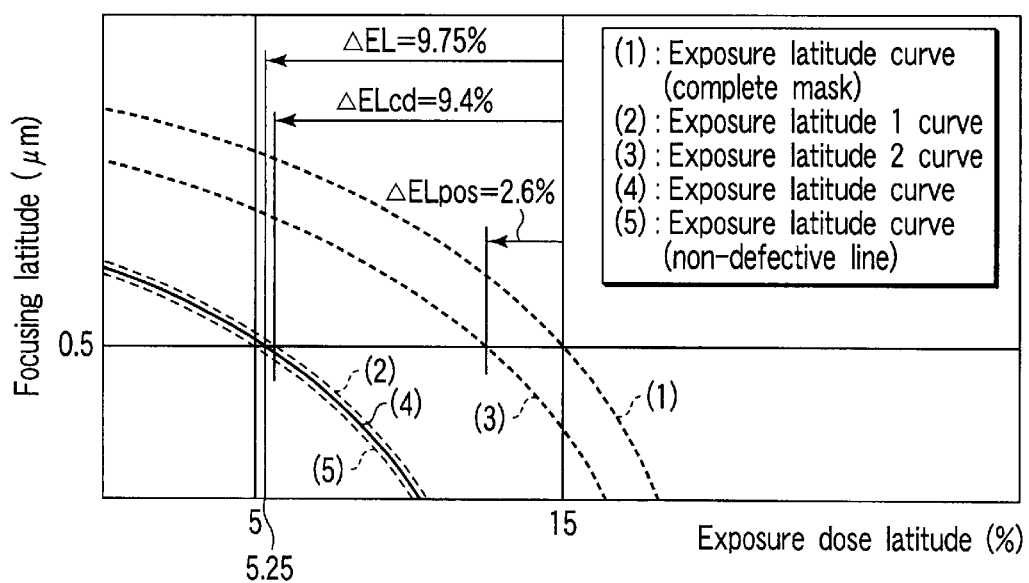
FIG. 14 is a graph showing an example of a relationship between the focusing latitude and the exposure dose latitude according to a seventh example of the present invention.

FIG. 10 is a flow chart showing a method of manufacturing a photomask according to a seventh embodiment of the present invention. FIGS. 11A and 11B are plan views, each showing an example of Cr mask blanks. FIGS. 12A and 12B are plan views, each showing an example of a method for measuring the dimension of a pattern. FIG. 13 is a plan view showing an example of a method for measuring the location of a pattern. FIG. 14 is a graph showing an example of a relationship between the focusing latitude and the exposure dose latitude according to a seventh example of the present invention.

First, a mask pattern is formed on the surface of the mask blanks (ST. 1).

In this embodiment, an L/S type pattern of 0.60 μm was drawn on the Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (a mask pattern). FIG. 11A shows a plan view of the Cr mask after finishing the formation of the Cr pattern. An enlarged view inside the frame 2B indicated by a dotted line is shown by FIG. 11B.

Then, the dimensions of the mask pattern are measured (ST. 2).

Further, the location of the mask pattern drawn is measured (ST. 3).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 20 nm (3σ).

An example of the method of measuring the dimensions is shown in FIG. 12A, wherein the dimension-measuring points 10 are arranged in a matrix-like configuration within the plane of the Cr mask. Then, as shown in FIG. 12B, the dimensions of the line width of the Cr pattern, for example, were measured for every point 10. On the basis of the data measured of the dimensions of every point 10, a difference between the average value of the dimensions of the Cr pattern and the target value of the dimensions, as well as the in-plane uniformity of the dimensions of the Cr pattern were determined.

Further, in this embodiment, as an item for measuring the described location of the pattern, an average value of the locational deviation of the Cr pattern as well as a dispersion of the locational deviation were determined. As a result, the average value of the locational deviation was 5 nm, and the dispersion of the locational deviation was 10 nm (3σ).

One specific example of the method of measuring the described location of the pattern is shown in FIG. 13, wherein a location-measuring mark 11 of cross-shaped configuration, for example, is arranged in a matrix-like configuration within the plane of the Cr mask, and any deviation component between the target describing position 12 and the actually described location 13 is measured at every location-measuring mark 11. In this manner, data on the described location thus measured is obtained from every mark 11. Then, on the basis of the data measured on the described location, an average value of the locational deviation of the Cr pattern, as well as the dispersion of the locational deviation, are determined.

Then, on the basis of the results obtained from the measurement of the dimensions, an exposure latitude 1 to be determined depending on the dimensional accuracy on the occasion of transcribing a pattern onto a wafer by making use of this mask is determined (ST. 4).

In this embodiment, the exposure latitude to be determined depending on the dimensional accuracy is defined as exposure latitude 1, and the magnitude of deterioration deviated from the latitude of the exposure dose of a complete mask which is not deviated at all from a target value (which is hereinafter referred to simply as a complete mask) was calculated.

The conditions of exposure employed for this calculation were selected to be the same as the exposure conditions to be actually employed for the mask, e.g., KrF stepper (the wavelength of exposure light=248 nm); NA=0.6; σ=0.75; and an annular illumination of a ⅔ shielding factor.

First, the exposure latitude of the complete mask was calculated. As a result of this calculation, the exposure latitude of the complete mask was found such that, under the condition wherein the fluctuation in the dimensions of the pattern could be confined to not more than 10%, and the focusing latitude could be retained at least 0.5 μm, it was possible to secure an exposure dose latitude of 15% (FIG. 14, see (1): an exposure latitude curve (complete mask)).

Then, the exposure latitude 1 of the Cr mask was calculated, finding that, under the condition wherein the fluctuation in the dimensions of the pattern could be confined to not more than 10%, and the focusing latitude could be retained at least 0.5 μm, the exposure dose latitude of the Cr mask was deteriorated 9.4% (ΔELcd) from the exposure dose latitude of the complete mask (FIG. 14, see (2): the curve of the exposure latitude 1).

Then, on the basis of the results obtained from the measurement of the described location, an exposure latitude 2 to be determined depending on the accuracy of the described location on the occasion of transcribing a pattern onto a wafer by making use of this mask is determined (ST. 5).

In this embodiment, the exposure latitude to be determined depending on the accuracy of the described location is defined as exposure latitude 2, and the magnitude of deterioration deviated from the exposure dose latitude of the complete mask was calculated. The conditions of exposure employed for this calculation were the same as those of the exposure latitude 1.

As a result of the calculation, the exposure latitude 2 of the Cr mask was such that, under the condition wherein the fluctuation in the dimensions of the pattern could be confined to not more than 10%, and the focusing latitude could be retained at least 0.5 μm, the exposure dose latitude of the Cr mask was deteriorated 2.6% (ΔELpos) from the exposure dose latitude of the complete mask (FIG. 14, see (3): the curve of the exposure latitude 2).

Then, on the basis of the results of the exposure latitudes 1 and 2, an exposure latitude for the occasion of transcribing a pattern onto a wafer by making use of this mask is determined (ST. 6).

In this embodiment, as the exposure latitude of the Cr mask is formed as described above, a total magnitude of deterioration ΔEL was calculated on the basis of the aforementioned ΔElcd and ΔELpos. One example of this calculation formula was as follows.

$$\Delta EL = \sqrt{((\Delta ELcd)^2 + (\Delta ELpos)^2)}$$

As a result of the calculation, the exposure latitude of the Cr mask was such that, under the condition wherein the fluctuation in the dimensions of the pattern could be confined to not more than 10%, and the focusing latitude could be retained at least 0.5 μm, the exposure dose latitude of the Cr mask was deteriorated 9.75% from the exposure dose latitude of the complete mask.

As a result, it was found possible to obtain an exposure latitude of 5.25% under the condition wherein the fluctuation in the dimensions of the pattern could be confined to not more than 10%, and the focusing latitude could be retained at least 0.5 μm (FIG. 14, see (4): the curve of the exposure latitude).

Then, a determination is made to determine if the exposure latitude of this mask satisfies the specified standard (ST. 7).

In the case of this embodiment, the exposure latitude desired as the standard was such that, under the condition wherein the fluctuation in the dimensions of the pattern could be confined to not more than 10%, and the focusing latitude could be retained at least 0.5 μm, the exposure dose latitude of the mask was not less than 5% (FIG. 14, see (S): the curve of the exposure latitude (non-defective limit line)).

The exposure latitude of the Cr mask formed as described above was 5.25% as determined in the ST. 6. Therefore, as shown in FIG. 14, this Cr mask was found to satisfy the standard, thus judging this Cr mask as being non-defective.

The specification values for this Cr mask are conventionally set such that the in-plane uniformity of the dimensions of the pattern should be not more than 16 nm (3σ). Therefore, this Cr mask fails to satisfy this specification value with respect to the in-plane uniformity of the dimensions of the pattern, thus rendering this Cr mask to be defective and to be discarded.

According to this embodiment, the following effects can be derived.

Namely, according to the prior art, a specification value is set in advance for the average value and in-plane uniformity of the dimensions of the pattern, respectively, and if a Cr mask fails to satisfy any one of these specification values, the Cr mask is deemed as being defective and is discarded.

By contrast, according to this embodiment, the exposure latitude of the mask formed as described above was determined on the basis of the exposure latitude 1 to be determined depending on the dimensional accuracy and of the exposure latitude 2 to be determined depending on the accuracy of the described location, and based on the exposure latitude thus determined, it was determined if a desired or standard exposure latitude could be satisfied, thus judging whether or not the mask was defective. As a result, among the photomasks that have been deemed as being defective according to the conventional criterion, some of them which can sufficiently satisfy the specification value regarding the average value but may fail to satisfy the specification value regarding the in-plane uniformity, for example, and therefore, are capable of satisfying a desired or standard exposure latitude can be recovered as a non-defective photomask, thereby making it possible to enhance the yield of the photomask.

Further, according to this seventh embodiment, the exposure latitude of the mask was determined by additionally taking the data measured of the described location, for example the average value and dispersion of the locational deviation of the Cr pattern, into consideration. Therefore, it would be possible to make a more accurate determination on the defectiveness or non-defectiveness of the mask as compared with the aforementioned first to sixth embodiments.

8th Embodiment

This eighth embodiment differs from the seventh embodiment in that the latitude of the exposure dose of the complete mask was not employed in the determination of the mask in the ST. 6. Namely, a pattern excellent in dimensional precision, or a pattern exhibiting a minimal deviation in terms of the average value of the dimensions, for example, was extracted from the Cr mask formed in advance. Then, the exposure dose latitude was determined on the basis of the results to be obtained as this excellent pattern was actually employed in the exposure process of the wafer.

Figure 15:
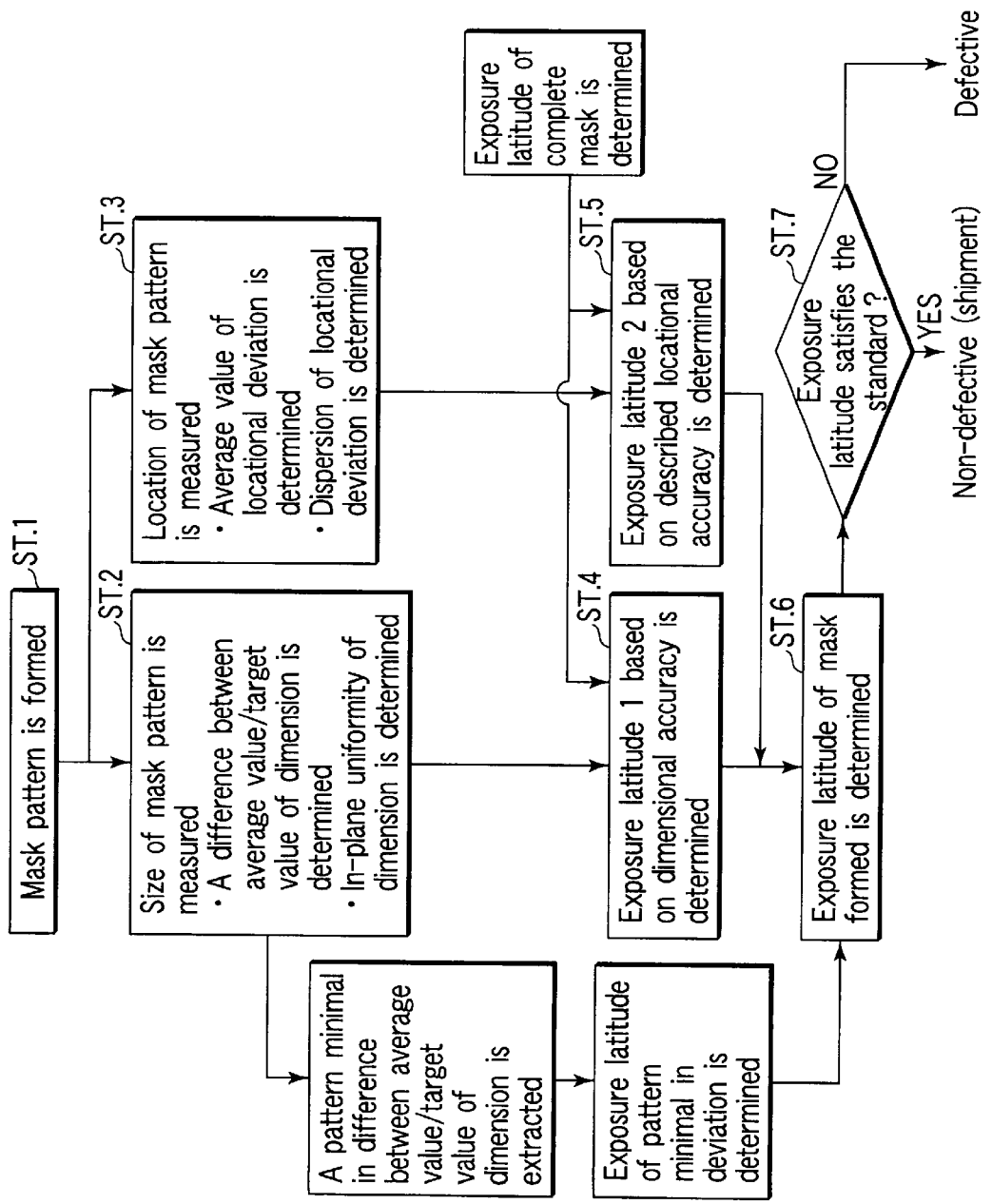
FIG. 15 is a flow chart showing a method of manufacturing a photomask according to an eighth embodiment of the present invention.

FIG. 15 is a flow chart showing a method of manufacturing a photomask according to an eighth embodiment of the present invention. FIG. 16 is a graph showing an example of a relationship between the focusing latitude and the exposure dose latitude according to an eighth example of the present invention.

First, a mask pattern is formed on the surface of mask blanks as shown in FIG. 15 (ST. 1).

In this embodiment, an L/S type pattern of 0.60 $\mu$m was drawn on Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (a mask pattern).

Then, the dimensions of the mask pattern are measured (ST. 2).

Further, the location of the mask pattern drawn is measured (ST. 3).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 20 nm (3$\sigma$).

Further, in this embodiment, as an item for measuring the described location of the pattern, an average value of the locational deviation of the Cr pattern as well as the dispersion of the locational deviation were determined. As a result, the average value of the locational deviation was 5 nm, and the dispersion of the locational deviation was 10 nm (3$\sigma$).

Then, on the basis of the results obtained from the measurement of the dimensions, an exposure latitude 1 to be determined depending on the dimensional accuracy on the occasion of transcribing a pattern onto a wafer by making use of this mask is determined (ST. 4).

In this embodiment, as the exposure latitude 1 to be determined depending on the dimensional accuracy, the magnitude of deterioration deviated from the exposure dose latitude of a complete mask was calculated.

The conditions of exposure employed for this calculation were selected to be the same as the exposure conditions to be actually employed for the mask, e.g., KrF stepper; NA=0.68; $\sigma$=0.75; and an annular illumination of a ⅔ shielding factor.

First, the exposure latitude of the complete mask was calculated. As a result of this calculation, the exposure latitude of the complete mask was found such that, under the condition wherein the fluctuation in the dimensions of the pattern could be confined to not more than 10%, and the focusing latitude could be retained at least 0.5 $\mu$m, it was possible to secure an exposure dose latitude of 15% (FIG. 16, see (1): an exposure latitude curve (complete mask)).

Then, the exposure latitude 1 of the Cr mask was calculated, finding that, under the condition wherein the fluctuation in the dimensions of the pattern could be confined to not more than 10%, and the focusing latitude could be retained at least 0.5 $\mu$m, the exposure dose latitude of the Cr mask was deteriorated 9.4% ($\Delta$ELcd) from the exposure dose latitude of the complete mask (FIG. 16, see (2): the curve of the exposure latitude 1).

Then, on the basis of the results obtained from the measurement of the described location, an exposure latitude 2 to be determined depending on the accuracy of the described location on the occasion of transcribing a pattern onto a wafer by making use of this mask is determined (ST. 5).

As a result of the calculation performed under the same conditions as those of the exposure latitude 1, the exposure latitude 2 to be determined depending on the accuracy of the described location was such that, under the condition wherein the fluctuation in the dimensions of the pattern could be confined to not more than 10%, and the focusing latitude could be retained at least 0.5 $\mu$m, the exposure dose latitude of the Cr mask was deteriorated 2.6% ($\Delta$ELpos) from the exposure dose latitude of the complete mask (FIG. 16, see (3): the curve of the exposure latitude 2).

Then, on the basis of the results of the exposure latitudes 1 and 2, an exposure latitude on the occasion of transcribing a pattern onto a wafer by making use of this mask is determined (ST. 6).

In this embodiment, as the exposure latitude of the Cr mask is formed as described above, a total magnitude of deterioration $\Delta$EL was calculated on the basis of the aforementioned $\Delta$Elcd and $\Delta$ELpos.

As a result of the calculation, the exposure latitude of the Cr mask was such that, under the condition wherein the fluctuation in the dimensions of the pattern could be confined to not more than 10%, and the focusing latitude could be retained at least 0.5 $\mu$m, the exposure dose latitude of the Cr mask was deteriorated 9.75% from the exposure dose latitude of the complete mask.

Also, a pattern which was minimal in difference between the average value of the dimensions of the Cr pattern and the target dimension value was extracted from the surface of the Cr mask and employed in the actual exposure process of the wafer under the conditions of: KrF stepper; NA=0.68; $\sigma$=0.75; and an illumination of a ⅔ shielding factor. Then, the dimensions of the pattern formed on a wafer by way of development and etching processes was measured. It was found as a result of this actual exposure that the exposure latitude of this pattern which was minimal in the difference between the average value of the dimensions of the Cr pattern, and the target dimension value was of such a magnitude that makes it possible to obtain an exposure dose latitude of 17% under the condition wherein the focusing latitude was set to 0.5 $\mu$m (FIG. 16, see (6): the curve of the exposure latitude (a pattern excellent in dimensional precision)).

As a result, it was found possible to obtain an exposure latitude of 7.25% under the condition wherein the focusing latitude was set to 0.5 μm (FIG. 16, see (4): the curve of the exposure latitude).

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.5 μm, the exposure dose latitude of the mask was not less than 4% (FIG. 16, see (5): the curve of the exposure latitude (non-defective limit line)).

The exposure latitude of the Cr mask formed as described above was 7.25% as determined in the ST. 6. Therefore, as shown in FIG. 16, this Cr mask was found to satisfy the standard, thus judging this Cr mask as being non-defective.

The specification values for this Cr mask are conventionally set such that the in-plane uniformity of the dimensions of the pattern should be not more than 13 nm(3σ). Therefore, this Cr mask fails to satisfy this specification value with respect to the in-plane uniformity of the dimensions of the pattern, thus rendering this Cr mask to be defective and discarded.

According to this eighth embodiment, almost the same effects as those of the aforementioned seventh embodiment can be derived.

Further, according to this eighth embodiment, the latitude of exposure latitude which was determined on the basis of the data obtained by the actual exposure of a wafer in the determination of ST. 6, it would be possible to make a judgment on the non-defectiveness of mask in a manner which is more adapted to the actual exposure as compared with the aforementioned seventh embodiment.

9th Embodiment

This ninth embodiment illustrates one example wherein the present invention is applied to a phase-shifting mask, in particular, a half-tone type phase-shifting mask.

Figure 17:
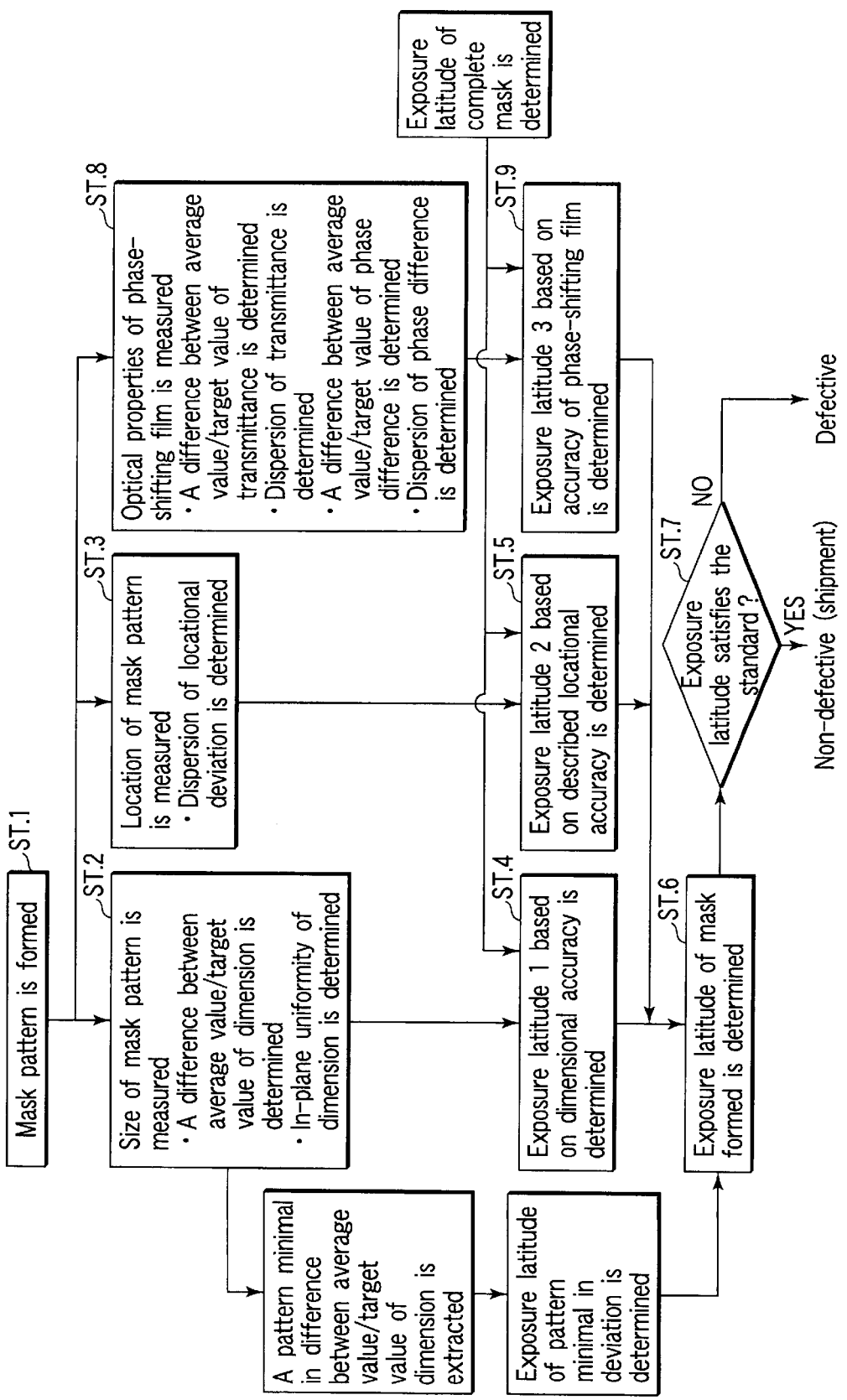
FIG. 17 is a flow chart showing a method of manufacturing a half-tone phase-shifting mask according to a ninth embodiment of the present invention.
Figure 18:
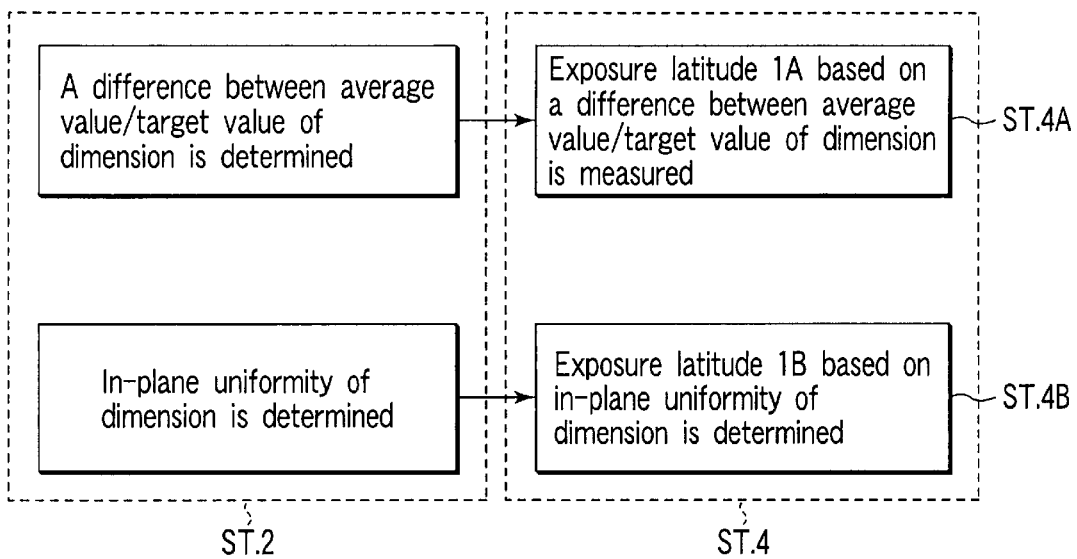
FIG. 18 is a flow chart showing an example of the step ST. 2 and the step ST. 4.
Figure 19:
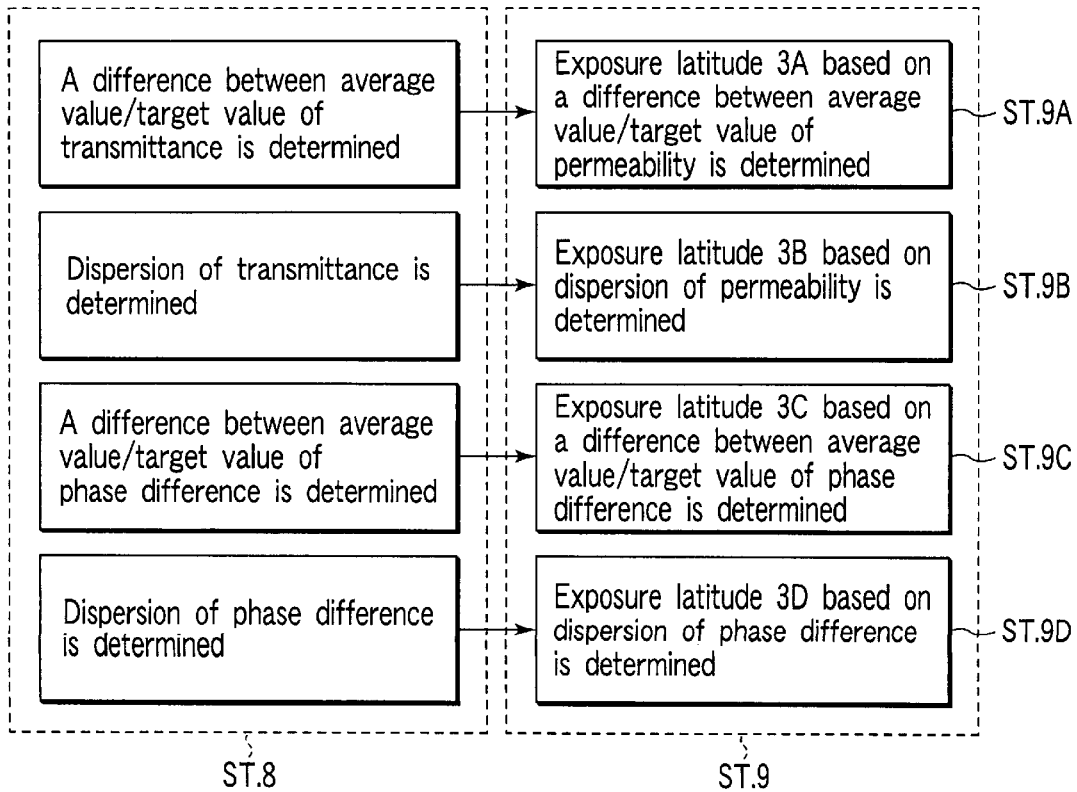
FIG. 19 is a flow chart showing an example of the step ST. 8 and the step ST. 9.

FIG. 17 is a flow chart showing a method of manufacturing a half-tone phase-shifting mask according to a ninth embodiment of the present invention. FIG. 18 is a flow chart showing an example of the step ST. 2 and the step ST.4. FIG. 19 is a flow chart showing an example of the step ST. 8 and the step ST.9. FIG. 20 is a graph showing an example of a relationship between the focusing latitude and the exposure dose latitude according to a ninth example of the present invention.

First, a mask pattern is formed on the surface of mask blanks as shown in FIG. 17 (ST. 1).

In this embodiment, an L/S type pattern of 0.52 μm and an isolated space line of 0.70 μm which was spaced away 2.0 μm from a neighboring pattern were drawn on HT mask blanks coated thereon with a layer of chemical amplification type positive tone resist, and then, subjected to a development process to form a resist pattern.

Then, by making use of this resist pattern as an etching mask, the Cr film and the half-tone film were etched to form a mask pattern.

Then, the dimensions of the mask pattern are measured (ST. 2).

Further, the location of the mask pattern drawn is measured (ST. 3).

In this embodiment, as an item for measuring the dimensions, the width of space in the mask pattern thus formed was measured to thereby determine the difference between an average value of the width of space and a target value of the dimensions, as well as the in-plane uniformity of the width of space. As a result, the difference between the average value of the width of space and a target value of the dimensions was −4 nm in the L/S pattern of 0.52 μm, and +4nm in the isolated space pattern of 0.70 μm, and the in-plane uniformity of the width of space was 14 nm (3σ).

Further, in this embodiment, as an item for measuring the described location of the pattern, the dispersion of the locational deviation of the mask pattern was determined. As a result, the dispersion of the locational deviation was 3 nm (3σ).

Moreover, in this embodiment, as an item for measuring the optical properties of the half-tone type phase-shifting film, a difference between the average value of the transmittance of the phase-shifting film and a target transmittance, the dispersion of the transmittance, a difference between the average value of the phase difference and a target phase difference, and the dispersion of the phase difference were determined. As a result, the difference between the average value of the transmittance and the target transmittance was 0.05%, the dispersion of the transmittance was 0.1%, the difference between the average value of the phase difference and the target phase difference was 6°, and the dispersion of the phase difference was 5° (3σ).

Then, on the basis of the results obtained from the measurement of the dimensions, an exposure latitude 1 to be determined depending on the dimensional accuracy on the occasion of transcribing a pattern onto a wafer by making use of this half-tone type phase-shifting mask is determined (ST. 4).

In this embodiment, as shown in FIG. 18, among the precision of the dimensions, the exposure latitude 1A to be determined depending on a difference between the average value of the width of space and the target value of the dimensions, and the exposure latitude 1B to be determined depending on the in-plane uniformity of the width of space are determined (ST. 4A, ST. 4B).

As for the exposure latitude 1A, the magnitude of deterioration from the exposure latitude of the complete mask was calculated. The conditions of exposure employed for this calculation were selected to be the same as the exposure conditions to be actually employed for the mask, e.g., KrF stepper; NA=0.68; σ=0.75; and an annular illumination of a ⅔ shielding factor.

As a result of this calculation, the exposure latitude 1A was found such that, under the condition wherein the fluctuation in the dimensions of the pattern could be confined to not more than 10%, and the focusing latitude could be retained at least 0.4 μm, the exposure dose latitude of the half-tone type phase-shifting mask was caused to deteriorate by a ratio of 0.39% from the exposure dose latitude of the complete mask.

Likewise, the exposure latitude 1B was found such that, under the condition wherein the fluctuation in the dimensions of the pattern could be confined to not more than 10%, and the focusing latitude could be retained at least 0.4 μm, the exposure dose latitude of the half-tone type phase-shifting mask was caused to deteriorate by a ratio of 6.5% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this half-tone type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 $\mu$m, the exposure dose latitude of the half-tone type phase-shifting mask was deteriorated 0.8% from the exposure dose latitude of the complete mask.

Then, on the basis of the results measured of the optical properties of the half-tone film, an exposure latitude 3 to be determined depending on the optical properties of the half-tone type phase-shifting film on the occasion of transcribing a pattern onto a wafer by making use of this half-tone type phase-shifting mask is determined (ST. 9).

In this embodiment, as shown in FIG. 19, among the optical properties of the phase-shifting film, the exposure latitude 3A to be determined depending on a difference between the average value of the transmittance and the target value of the transmittance, the exposure latitude 3B to be determined depending on the dispersion of the transmittance, the exposure latitude 3C to be determined depending on a difference between the average value of the phase difference and the target value of the phase difference, and the exposure latitude 3D to be determined depending on the dispersion of the phase difference are determined (ST. 9A to ST. 9D).

As a result of the calculation performed under the same conditions as those of the exposure latitude 1, the exposure latitude 3A was such that, under the condition wherein the fluctuation in the dimensions of the pattern could be confined to not more than 10%, and the focusing latitude could be retained at least 0.4 $\mu$m, the exposure dose latitude of the half-tone type phase-shifting mask was deteriorated 0.055% from the exposure dose latitude of the complete mask.

Likewise, the exposure latitude 3B was found such that, under the condition wherein the fluctuation in the dimensions of the pattern could be confined to not more than 10%, and the focusing latitude could be retained at least 0.4 $\mu$m, the exposure dose latitude of the half-tone type phase-shifting mask was caused to deteriorate by a ratio of 0.33% from the exposure dose latitude of the complete mask.

Likewise, the exposure latitude 3C was found such that, under the condition wherein the fluctuation in the dimensions of the pattern could be confined to not more than 10%, and the focusing latitude could be retained at least 0.4 $\mu$m, the exposure dose latitude of the half-tone type phase-shifting mask was caused to deteriorate by a ratio of 0.017% from the exposure dose latitude of the complete mask.

Likewise, the exposure latitude 3D was found such that, under the condition wherein the fluctuation in the dimensions of the pattern could be confined to not more than 10%, and the focusing latitude could be retained at least 0.4 $\mu$m, the exposure dose latitude of the half-tone type phase-shifting mask was caused to deteriorate by a ratio of 0.12% from the latitude of the exposure dose of the complete mask.

Then, on the basis of the results of the exposure latitudes 1A, 1B, the exposure latitude 2, and the exposure latitudes 3A to 3D, an exposure latitude on the occasion of transcribing a pattern onto a wafer by making use of this mask is determined (ST. 6).

In this embodiment, as the exposure latitude of the Cr mask is formed as described above, a total magnitude of the deterioration was calculated on the basis of the exposure latitudes 1A, 1B, the exposure latitude 2, and the exposure latitudes 3A to 3D.

As a result of the calculation, under the condition wherein the fluctuation in the dimensions of the pattern could be confined to not more than 10%, and the focusing latitude could be retained at least 0.5 $\mu$m, the exposure dose latitude of the half-tone type phase-shifting mask was deteriorated 7.24% from the exposure dose latitude of the complete mask.

Further in this embodiment, in the same manner as in the eighth embodiment, a pattern which was minimal in a difference between the average value of the dimensions of the Cr pattern and the target dimensions values was extracted from the surface of the half-tone type phase-shifting mask and employed in the actual exposure process of wafer under the conditions of: KrF stepper; NA=0.68; $\sigma$=0.75; and an illumination of a ⅔ shielding factor. Then, the dimensions of the pattern formed on the wafer were measured. It was found as a result of this actual exposure that the exposure latitude of this pattern which was minimal in the difference between the average value of the dimensions of the Cr pattern of the half-tone type phase-shifting mask and the target dimensions values was of such a magnitude that makes it possible to obtain an exposure dose latitude of 12% under the condition wherein the focusing latitude was set to 0.4 $\mu$m.

As a result, the exposure latitude of the halftone type phase-shifting mask was found such that it was possible to obtain an exposure latitude of 4.76% under the condition wherein the focusing latitude was set to 0.4 $\mu$m.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.4 $\mu$m, the exposure dose latitude of the mask was not less than 4%.

The exposure latitude of the half-tone type phase-shifting mask formed as described above was 4.76% as determined in the ST. 6. Therefore, as shown in FIG. 20, this half-tone type phase-shifting mask was found to satisfy the standard, thus judging this half-tone type phase-shifting mask as being non-defective.

The specification values for this half-tone type phase-shifting mask are conventionally set such that the in-plane uniformity of the dimensions of the pattern should be not more than 13 nm(3$\sigma$). Therefore, this half-tone type phase-shifting mask fails to satisfy this specification value with respect to the in-plane uniformity of the dimensions of the pattern, thus rendering this half-tone type phase-shifting mask to be defective and to be discarded.

According to this ninth embodiment, almost the same effects as those of the aforementioned seventh embodiment can be derived.

10th Embodiment

Figure 21:
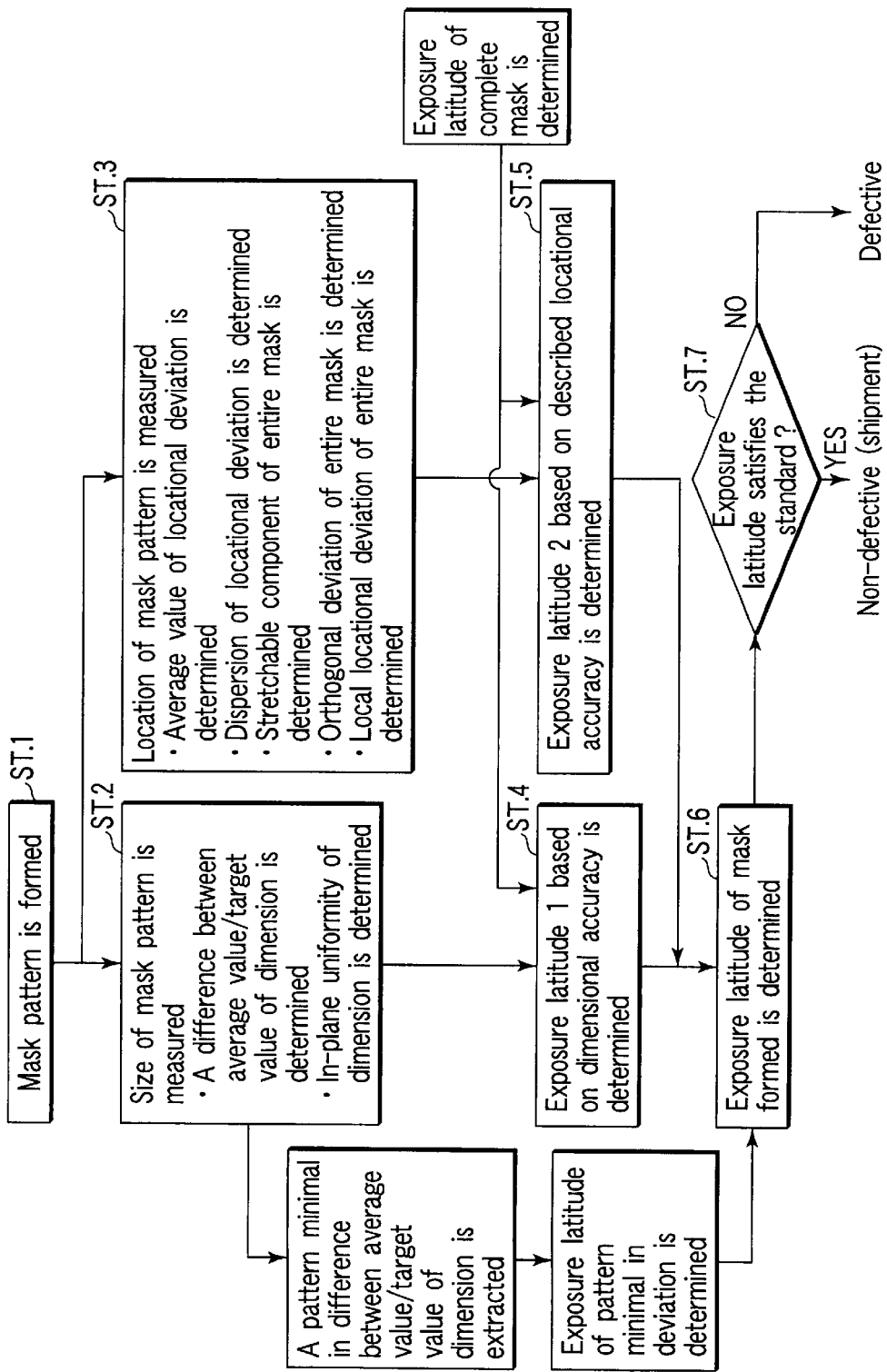
FIG. 21 is a flow chart showing a method of manufacturing a photomask according to a tenth embodiment of the present invention.

FIG. 21 is a flow chart showing a method of manufacturing a photomask according to a tenth embodiment of the present invention. FIG. 22 is a graph showing an example of a relationship between the focusing latitude and the exposure dose latitude according to a tenth example of the present invention.

First, a mask pattern is formed on the surface of mask blanks as shown in FIG. 21 (ST. 1).

In this embodiment, an L/S type pattern of 0.60 $\mu$m was drawn on Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (a mask pattern).

Then, the dimensions of the mask pattern are measured (ST. 2).

Further, the location of the mask pattern drawn is measured (ST. 3).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 20 nm (3σ).

Further, in this embodiment, as an item for measuring the described location of the pattern, an average value of the locational deviation of the Cr pattern, the dispersion of the locational deviation, the stretchable component of the entire photomask, the orthogonal deviating component of the entire photomask, and the local locational deviation of the entire photomask were determined. As a result, the average value of the locational deviation was 5 nm, the dispersion of the locational deviation was 10 nm (3σ), the stretchable component and the orthogonal deviating component were both 1.5 ppm, and the local locational deviation was 15 nm (3σ).

Then, on the basis of the results obtained from the measurement of the dimensions, an exposure latitude 1 to be determined depending on the dimensional accuracy on the occasion of transcribing a pattern onto a wafer by making use of this Cr mask is determined (ST. 4).

In this embodiment, among the dimensional accuracy, the exposure latitude 1A to be determined depending on the difference between the average value of the dimensions of the Cr pattern and the target dimensional value, and the exposure latitude 1B to be determined depending on the in-plane uniformity of the dimensions of the Cr pattern were determined. Then, as the exposure latitude 1A, the magnitude of deterioration deviated from the exposure dose latitude of the complete mask was calculated. The conditions of exposure employed for this calculation were selected to be the same as the exposure conditions to be actually employed for the mask, e.g., KrF stepper; NA=0.68; σ=0.75; and an annular illumination of a ⅔ shielding factor.

As a result of this calculation, the exposure latitude 1A was such that, under the condition wherein the fluctuation in the dimensions of the pattern could be confined to not more than 10%, and the focusing latitude could be retained at least 0.5 μm, the exposure dose latitude of the Cr mask was deteriorated 9.4% from the exposure dose latitude of the complete mask.

Likewise, the exposure latitude 1B was such that, under the condition wherein the fluctuation in the dimensions of the pattern could be confined to not more than 10%, and the focusing latitude could be retained at least 0.5 μm, the exposure dose latitude of the Cr mask was deteriorated 0.3% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this mask is determined (ST. 5).

As a result of the calculation performed under the same conditions as those of the exposure latitudes 1A and 1B, the exposure latitude 2 to be determined depending on the accuracy of the described location was such that, under the condition wherein the fluctuation in the dimensions of the pattern could be confined to not more than 10%, and the focusing latitude could be retained at least 0.5 μm, the exposure dose latitude of the Cr mask was deteriorated 2.6% from the exposure dose latitude of the complete mask.

Then, on the basis of the results of the exposure latitudes 1A and 1B, and the exposure latitude 2, an exposure latitude on the occasion of transcribing a pattern onto a wafer by making use of this mask is determined (ST. 6).

In this embodiment, as the exposure latitude of the Cr mask is formed as described above, a total magnitude of the deterioration was calculated on the basis of the aforementioned three types of deterioration which were determined from the exposure latitudes 1A and 1B, and the exposure latitude 2.

As a result of the calculation, the exposure latitude of the Cr mask was such that, under the condition wherein the fluctuation in the dimensions of the pattern could be confined to not more than 10%, and the focusing latitude could be retained at least 0.5 μm, the exposure dose latitude of the Cr mask was deteriorated 10% from the exposure dose latitude of the complete mask.

Further in this embodiment, in the same manner as in the second embodiment, a pattern which was minimal in difference between the average value of the dimensions of the Cr pattern and the target dimension values was extracted from the surface of the Cr mask and employed in the actual exposure process of the wafer under the conditions of: KrF stepper; NA=0.68; σ=0.75; and an illumination of a ⅔ shielding factor. Then, the dimensions of the pattern formed on the wafer were measured. It was found as a result of this actual exposure that the exposure latitude of this pattern which was minimal in the difference between the average value of the dimensions of the Cr pattern and the target dimension values was of such a magnitude that makes it possible to obtain an exposure dose latitude of 17% under the condition wherein the focusing latitude was set to 0.5 μm.

As a result, the exposure latitude of the Cr mask was found such that it was possible to obtain an exposure latitude of 7% under the condition wherein the focusing latitude was set to 0.5 μm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.5 μm, the exposure dose latitude of the mask was not less than 5%.

The exposure latitude of the Cr mask formed as described above was 7% as determined in the ST. 6. Therefore, as shown in FIG. 22, this Cr mask was found to satisfy the standard, thus judging this Cr mask as being non-defective.

According to this tenth embodiment, almost the same effects as those of the aforementioned seventh embodiment can be derived.

11th Embodiment

Figure 24:
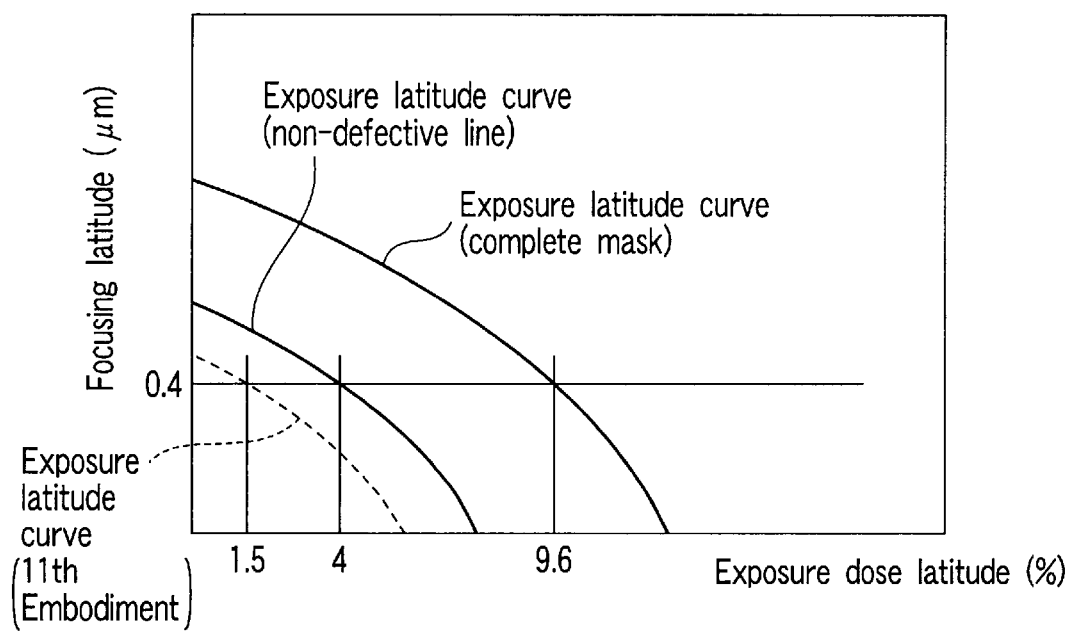
FIG. 24 is a graph showing an example of a relationship between the focusing latitude and the exposure dose latitude according to an eleventh example of the present invention.

FIG. 23 is a flow chart showing a method of manufacturing a half-tone phase-shifting mask according to an eleventh embodiment of the present invention. FIG. 24 is a graph showing an example of a relationship between the focusing latitude and the exposure dose latitude according to an eleventh example of the present invention.

First, a mask pattern is formed on the surface of mask blanks as shown in FIG. 23 (ST. 1).

In this embodiment, an isolated line pattern of 0.70 μm was drawn on HT mask blanks coated thereon with a layer of chemical amplification type positive tone resist, and then, subjected to a development process to form a resist pattern.

Then, by making use of this resist pattern as an etching mask, the half tone film was etched to form a mask pattern.

Then, the dimensions of the mask pattern are measured (ST. 2).

Further, the location of the mask pattern drawn is measured (ST. 3).

Then, the optical properties of a phase-shifting film, i.e., in this embodiment, the optical properties of a half-tone type phase-shifting film are measured (ST. 8).

In this embodiment, as an item for measuring the dimensions, the difference between an average value of the dimensions of the mask pattern formed as described above and a target value of the dimensions, as well as the in-plane uniformity of the dimensions of the mask pattern were determined. As a result, the difference between the average value and the target value of the dimensions was 10 nm, and the in-plane uniformity was 13 nm (3σ).

Further, in this embodiment, as an item for measuring the described location of the pattern, an average value of the locational deviation of the mask pattern, and the dispersion of the locational deviation were determined. As a result, the average value of the locational deviation was 5 nm, and the dispersion of the locational deviation was 10 nm (3σ).

Further, in this embodiment, as an item for measuring the optical properties of the half-tone type phase-shifting film, a difference between the average value of the transmittance of the phase-shifting film and the target value of the transmittance, the in-plane uniformity of the transmittance (a magnitude of the deviation from the. target transmittance), a difference between the average value of the phase difference and the target value of the phase difference, and the in-plane uniformity of the phase difference were determined. As a result, the difference between the average value of the transmittance and the target value of the transmittance was −0.5%, the in-plane uniformity of the transmittance was 0.7%(3σ), the difference between the average value of the phase difference and the target value of the phase difference was 5°, and the in-plane uniformity of the phase difference was 7°.

Then, on the basis of the results obtained from the measurement of the dimensions, an exposure latitude 1 to be determined depending on the dimensional accuracy on the occasion of transcribing a pattern onto a wafer by making use of this half-tone type phase-shifting mask is determined (ST. 4).

In this embodiment, among the dimensional accuracy, the exposure latitude 1A to be determined depending on the difference between the average value of the dimensions of the mask pattern and the target dimensional values, and the exposure latitude 1B to be determined depending on the in-plane uniformity of the dimensions of the mask pattern were determined. Then, as the exposure latitude 1A, the magnitude of deterioration deviated from the exposure dose latitude of the complete mask was calculated. The conditions of exposure employed for this calculation were selected to be the same as the exposure conditions to be actually employed for the mask, e.g., ArF stepper; NA=0.55; σ=0.75; and an annular illumination of a ⅔ shielding factor.

As a result of this calculation, the exposure latitude 1A was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 3.2% from the exposure dose latitude of the complete mask.

Likewise, the exposure latitude 1B was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 3.3% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this half-tone type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.6% from the exposure dose latitude of the complete mask.

Then, on the basis of the results measured of the optical properties of the phase-shifting film, an exposure latitude 3 to be determined depending on the optical properties of the phase-shifting film on the occasion of transcribing a pattern onto a wafer by making use of this half-tone type phase-shifting mask is determined (ST. 9).

As a result of the calculation performed under the same conditions as those of the exposure latitude 1, the exposure latitude 3 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.1% from the exposure dose latitude of the complete mask.

Then, on the basis of the results of the exposure latitudes 1A and 1B, the exposure latitude 2 and the exposure latitude 3, an exposure latitude on the occasion of transcribing a pattern onto a wafer by making use of this mask is determined (ST. 6).

In this embodiment, as the exposure latitude of the half-tone type phase-shifting mask formed as described above, a total magnitude of the deterioration was calculated on the basis of the exposure latitudes 1A and 1B, the exposure latitude 2 and the exposure latitude 3.

As a result of the calculation, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 8.1% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.4 μm, it was possible to secure an exposure dose latitude of 9.6%.

As a result, the exposure latitude of the half-tone type phase-shifting mask was found such that it was possible to obtain an exposure latitude of 1.5% under the condition wherein the focusing latitude was set to 0.4 µm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.4 µm, the exposure dose latitude of the mask was not less than 4%.

The exposure latitude of the half-tone type phase-shifting mask formed as described above was 1.5% as determined in the ST. 6. Therefore, as shown in FIG. 24, this half-tone type phase-shifting mask was found to satisfy the standard, thus judging this half-tone type phase-shifting mask as being non-defective.

12th Embodiment

Figure 26:
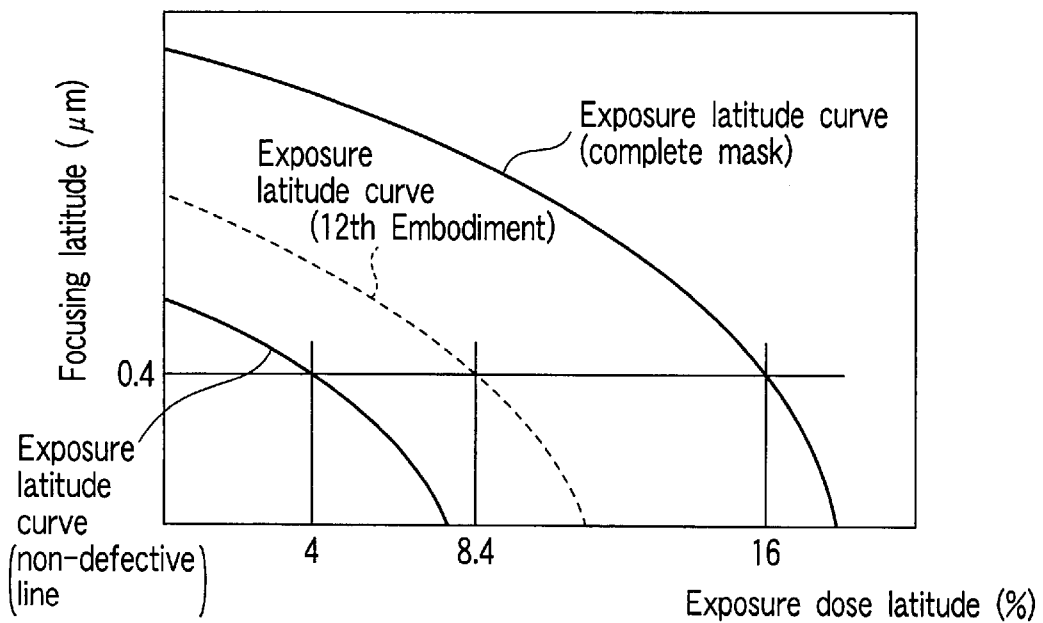
FIG. 26 is a graph showing an example of a relationship between the focusing latitude and the exposure dose latitude according to a twelfth example of the present invention.

FIG. 25 is a flow chart showing a method of manufacturing an alternating phase-shifting mask, for example, a Levenson type phase-shifting mask according to a twelfth embodiment of the present invention. FIG. 26 is a graph showing an example of a relationship between the focusing latitude and the exposure dose latitude according to a twelfth example of the present invention.

First, a mask pattern is formed on the surface of mask blanks as shown in FIG. 25 (ST. 1).

In this embodiment, an L/S type pattern of 0.52 µm was drawn on Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (mask pattern). Further, the Cr pattern was worked so as to enable a neighboring pair of Cr patterns to have a phase difference of 180° from each other, thereby forming a Levenson type phase-shifting mask.

Then, the dimensions of the mask pattern are measured (ST. 2).

Further, the location of the mask pattern drawn is measured (ST. 3).

Then, the optical properties of a phase-shifting film, i.e., in this embodiment, the optical properties of a Levenson type phase-shifting film are measured (ST. 8).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 20 nm (3σ).

Further, in this embodiment, as an item for measuring the described location of the pattern, an average value of the locational deviation of the Cr pattern, and the dispersion of the locational deviation were determined. As a result, the average value of the locational deviation was 5 nm, and the dispersion of the locational deviation was 10 nm (3σ).

Further, in this embodiment, as an item for measuring the optical properties of the Levenson type phase-shifting film, a difference between the average value of the phase difference of the phase-shifting film and the target value of the phase difference, and the in-plane uniformity of the phase difference were determined. As a result, the difference between the average value of the phase difference and the target value of the phase difference was 5%, and the in-plane uniformity of the phase difference was 0.7%.

Then, on the basis of the results obtained from the measurement of the dimensions, an exposure latitude 1 to be determined depending on the dimensional accuracy on the occasion of transcribing a pattern onto a wafer by making use of this Levenson type phase-shifting mask is determined (ST. 4).

In this embodiment, among the dimensional accuracy, the exposure latitude 1A to be determined depending on the difference between the average value of the dimensions of the Cr pattern and the target dimensional value, and the exposure latitude 1B to be determined depending on the in-plane uniformity of the dimensions of the Cr pattern were determined. Then, as the exposure latitude 1A, the magnitude of the deterioration deviated from the latitude of the exposure dose of the complete mask was calculated. The conditions of exposure employed for this calculation were selected to be the same as the exposure conditions to be actually employed for the mask, e.g., ArF stepper; NA=0.60; σ=0.30; and no annular shielding.

As a result of this calculation, the exposure latitude 1A was such that, under the condition wherein the fluctuation in the dimensions of the pattern could be confined to not more than 10%, and the focusing latitude could be retained at least 0.4 µm, the exposure dose latitude of the Levenson type phase-shifting mask was deteriorated 2.5% from the exposure dose latitude of the complete mask.

Likewise, the exposure latitude 1B was such that, under the condition wherein the fluctuation in the dimensions of the pattern could be confined to not more than 10%, and the focusing latitude could be retained at least 0.4 µm, the exposure dose latitude of the Levenson type phase-shifting mask was deteriorated 3.3% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this Levenson type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 µm, the exposure dose latitude of the Levenson type phase-shifting mask was deteriorated 2.6% from the exposure dose latitude of the complete mask.

Then, on the basis of the results measured of the optical properties of the phase-shifting film, an exposure latitude 3 to be determined depending on the optical properties of the phase-shifting film on the occasion of transcribing a pattern onto a wafer by making use of this Levenson type phase-shifting mask is determined (ST. 9).

As a result of the calculation performed under the same conditions as those of the exposure latitude 1, the exposure latitude 3 was such that, under the condition wherein the fluctuation in the dimensions of the pattern could be confined to not more than 10%, and the focusing latitude could be retained at least 0.4 µm, the exposure dose latitude of the Levenson type phase-shifting mask was deteriorated 2.1% from the exposure dose latitude of the complete mask.

Then, on the basis of the results of the exposure latitudes 1A and 1B, the exposure latitude 2 and the exposure latitude 3, an exposure latitude on the occasion of transcribing a pattern onto a wafer by making use of this mask is determined (ST. 6).

In this embodiment, as the exposure latitude of the Levenson type phase-shifting mask formed as described above, a total magnitude of the deterioration was calculated on the basis of the exposure latitudes 1A and 1B, the exposure latitude 2 and the exposure latitude 3.

As a result of the calculation, under the condition wherein the fluctuation in the dimensions of the pattern could be confined to not more than 10%, and the focusing latitude could be retained at least 0.4 μm, the exposure dose latitude of the Levenson type phase-shifting mask was deteriorated 7.6% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.4 μm, it was possible to secure an exposure dose latitude of 16%.

As a result, the exposure latitude of the Levenson type phase-shifting mask was found such that it was possible to obtain an exposure latitude of 8.4% under the condition wherein the focusing latitude was set to 0.4 μm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.4 μm, the exposure dose latitude of the mask was not less than 4%.

The exposure latitude of the Levenson type phase-shifting mask formed as described above was 8.4% as determined in the ST. 6. Therefore, as shown in FIG. 26, this Levenson type phase-shifting mask was found to satisfy the standard, thus judging this Levenson type phase-shifting mask as being non-defective.

According to this twelfth embodiment, almost the same effects as those of the aforementioned seventh embodiment can be derived.

13th Embodiment

Figure 27:
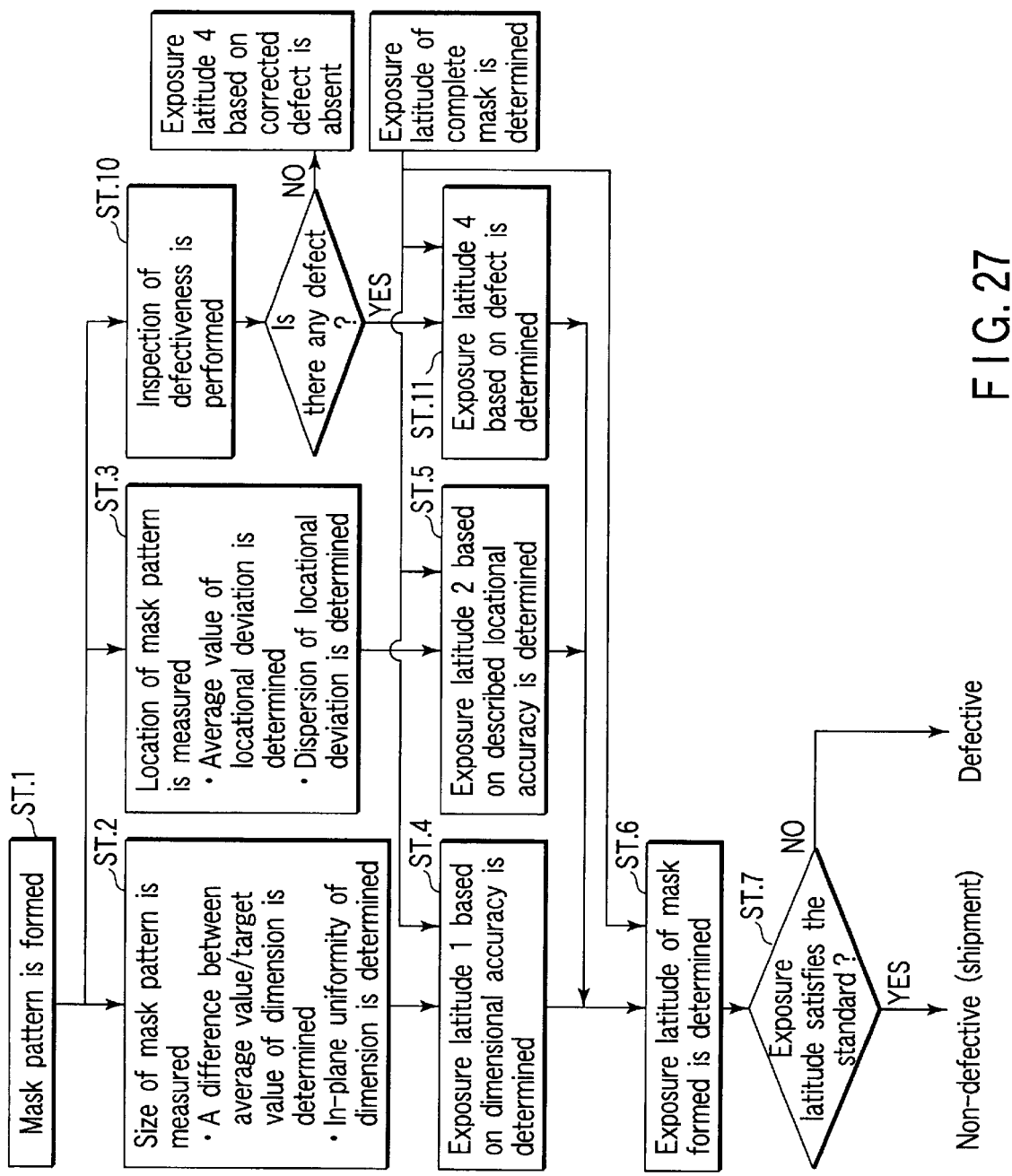
FIG. 27 is a flow chart showing a method of manufacturing a photomask according to a thirteenth embodiment of the present invention.

FIG. 27 is a flow chart showing a method of manufacturing a photomask according to a thirteenth embodiment of the present invention. FIG. 28 is a graph showing an example of a relationship between the focusing latitude and the exposure dose latitude according to a thirteenth example of the present invention.

First, a mask pattern is formed on the surface of mask blanks as shown in FIG. 21 (ST. 1).

In this embodiment, an L/S type pattern of 0.60 μm was drawn on Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (a mask pattern).

Then, the dimensions of the mask pattern are measured (ST. 2).

Further, the location of the mask pattern drawn is measured (ST. 3).

Furthermore, the defect-detecting inspection of the Cr mask formed as mentioned above is measured (ST. 10).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 20 nm (3σ).

Further, in this embodiment, as an item for measuring the described location of the pattern, an average value of the locational deviation of the Cr pattern, and the dispersion of the locational deviation were determined. As a result, the average value of the locational deviation was 5 nm, and the dispersion of the locational deviation was 10 nm (3σ).

Further, in this embodiment, an opaque foreign matter having an area of 10000 nm$^2$ was discovered. This opaque foreign matter differs from a desired configuration of the mask, and hence, is a defect.

Then, on the basis of the results obtained from the measurement of the dimensions, an exposure latitude 1 to be determined depending on the dimensional accuracy on the occasion of transcribing a pattern onto a wafer by making use of this Cr mask is determined (ST. 4).

In this embodiment, as the exposure latitude 1 to be determined depending on the dimensional accuracy, the magnitude of the deterioration deviated from the exposure dose latitude of a complete mask was calculated.

The conditions of exposure employed for this calculation were selected to be the same as the exposure conditions to be actually employed for the mask, e.g., KrF stepper; NA=0.68; σ=0.75; and an annular illumination of a ⅔ shielding factor.

As a result of this calculation, the exposure latitude 1 of the Cr mask was such that, under the condition wherein the fluctuation in the dimensions of the pattern could be confined to not more than 10%, and the focusing latitude could be retained at least 0.5 μm, the exposure dose latitude of the Cr mask was deteriorated 9.4% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this mask is determined (ST. 5).

As a result of the calculation performed under the same conditions as those of the exposure latitude 1, the exposure latitude 2 to be determined depending on the accuracy of the described location was such that, under the condition wherein the fluctuation in the dimensions of the pattern could be confined to not more than 10%, and the focusing latitude could be retained at least 0.5 μm, the exposure dose latitude of the Cr mask was deteriorated 2.6% from the exposure dose latitude of the complete mask.

Further, an exposure latitude 4 due to a defect is determined (ST. 11).

As a result of the calculation performed under the same conditions as those of the exposure latitude 1, the exposure latitude 4 due to a defect was such that, under the condition wherein the fluctuation in the dimensions of the pattern could be confined to not more than 10%, and the focusing latitude could be retained at least 0.5 μm, the exposure dose latitude of the Cr mask was deteriorated 1% from the exposure dose latitude of the complete mask.

Then, on the basis of the results of the exposure latitudes 1 and 2, and the exposure latitude 4, an exposure latitude on the occasion of transcribing a pattern onto a wafer by making use of this mask is determined (ST. 6).

In this embodiment, as the exposure latitude of the Cr mask is formed as described above, a total magnitude of the deterioration was calculated on the basis of three kinds of deterioration that were determined as the aforementioned exposure latitudes 1 and 2, and the exposure latitude 4.

As a result of the calculation, the exposure latitude of the Cr mask was such that, under the condition wherein the fluctuation in the dimensions of the pattern could be confined to not more than 10%, and the focusing latitude could be retained at least 0.5 µm, the exposure dose latitude of the Cr mask was deteriorated 10.5% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.5 µm, it was possible to secure an exposure dose latitude of 15%.

As a result, the exposure latitude of the Cr mask was found such that it was possible to obtain an exposure latitude of 4.3% under the condition wherein the focusing latitude was set to 0.5 µm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.5 µm, the exposure dose latitude of the mask was not less than 5%.

The exposure latitude of the Cr mask formed as described above was 4.3% as determined in the ST. 6. Therefore, as shown in FIG. 28, this Cr mask failed to satisfy the standard, thus judging this Cr mask as being defective.

14th Embodiment

Figure 29:
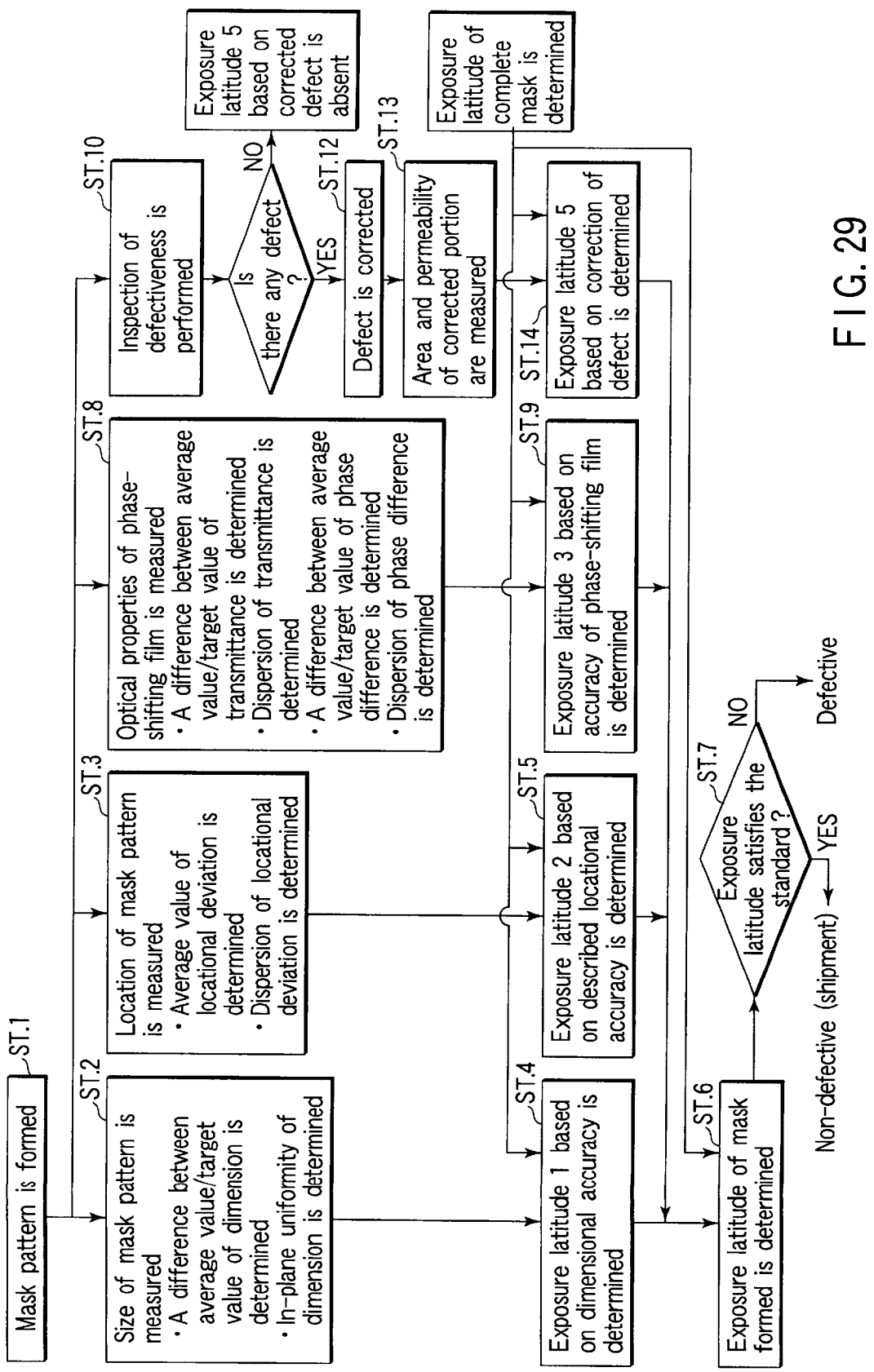
FIG. 29 is a flow chart showing a method of manufacturing a half-tone phase-shifting mask according to a fourteenth embodiment of the present invention.

FIG. 29 is a flow chart showing a method of manufacturing a half-tone phase-shifting mask according to a fourteenth embodiment of the present invention. FIG. 30 is a graph showing an example of a relationship between the focusing latitude and the exposure dose latitude according to a fourteenth example of the present invention.

First, a mask pattern is formed on the surface of mask blanks as shown in FIG. 29 (ST. 1).

In this embodiment, an isolated line pattern of 0.70 µm was drawn on HT mask blanks coated thereon with a layer of chemical amplification type positive tone resist, and then, subjected to a development process to form a resist pattern.

Then, by making use of this resist pattern as an etching mask, the half tone film was etched to form a mask pattern.

Then, the dimensions of the mask pattern are measured (ST. 2).

Further, the location of the mask pattern drawn is measured (ST. 3).

Then, the optical properties of a phase-shifting film, i.e., in this embodiment, the optical properties of a half-tone type phase-shifting film, are measured (ST. 8)

Furthermore, the defect-detecting inspection of the half-tone type phase-shifting mask formed as mentioned above is measured (ST. 10).

In this embodiment, as an item for measuring the dimensions, the difference between an average value of the dimensions of the mask pattern formed as described above and a target value of the dimensions, as well as the in-plane uniformity of the dimensions of the mask pattern were determined. As a result, the difference between the average value and the target value of the dimensions was 10 nm, and the in-plane uniformity was 5 nm (3σ)

Further, in this embodiment, as an item for measuring the described location of the pattern, an average value of the locational deviation of the mask pattern, and the dispersion of the locational deviation were determined. As a result, the average value of the locational deviation was 5 nm, and the dispersion of the locational deviation was 10 nm (3σ).

Further, in this embodiment, as an item for measuring the optical properties of the half-tone type phase-shifting film, a difference between the average value of the transmittance of the phase-shifting film and the target value of the transmittance, the in-plane uniformity of the transmittance (a magnitude of the deviation from the target transmittance), a difference between the average value of the phase difference and the target value of the phase difference, and the in-plane uniformity of the phase difference were determined. As a result, the difference between the average value of the transmittance and the target value of the transmittance was −0.5%, the in-plane uniformity of the transmittance was 0.7% (3σ), the difference between the average value of the phase difference and the target value of the phase difference was 5°, and the in-plane uniformity of the phase difference was 7°

Further, in this embodiment, a pin-hole having an area of 40000 $nm^2$ was discovered in the defect-detecting inspection step. Therefore, the defect, i.e., the pinhole in this embodiment, was corrected by making use of a defect-correcting device (ST. 12).

Then, the area and transmittance of this corrected pin-hole portion were measured (ST. 13).

When the area and transmittance of this corrected pin-hole portion were measured, the area of the corrected pin-hole portion was 44000 $nm^2$, and the transmittance was 0%.

Then, on the basis of the results obtained from the measurement of the dimensions, an exposure latitude 1 to be determined depending on the dimensional accuracy on the occasion of transcribing a pattern onto a wafer by making use of this half-tone type phase-shifting mask is determined (ST. 4).

In this embodiment, among the dimensional accuracy, the exposure latitude 1A to be determined depending on the difference between the average value of the dimensions of the mask pattern and the target dimensional values, and the exposure latitude 1B to be determined depending on the in-plane uniformity of the dimensions of the mask pattern were determined. Then, as the exposure latitude 1A, the magnitude of the deterioration deviated from the exposure dose latitude of the complete mask was calculated. The conditions of exposure employed for this calculation were selected to be the same as the exposure conditions to be actually employed for the mask, e.g., ArF stepper; NA =0.60; σ=0.75; and an annular illumination of a ⅔ shielding factor.

As a result of this calculation, the exposure latitude 1A was such that, under the condition wherein the fluctuation in the dimensions of the pattern could be confined to not more than 10%, and the focusing latitude could be retained at least 0.4 µm, the exposure dose latitude of the half-tone type phase-shifting mask was deteriorated 1.7% from the exposure dose latitude of the complete mask.

Likewise, the exposure latitude 1B was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1.1% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this half-tone type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.6% from the exposure dose latitude of the complete mask.

Then, on the basis of the results measured of the optical properties of the phase-shifting film, an exposure latitude 3 to be determined depending on the optical properties of the phase-shifting film on the occasion of transcribing a pattern onto a wafer by making use of this half-tone type phase-shifting mask is determined (ST. 9).

As a result of the calculation performed under the same conditions as those of the exposure latitude 1, the exposure latitude 3 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.1% from the exposure dose latitude of the complete mask.

Further, an exposure latitude 5 due to the correction of the defect is determined (ST. 14).

As a result of the calculation performed under the same conditions as those of the exposure latitude 1, the exposure latitude 5 due to the correction of the defect was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1%. from the exposure dose latitude of the complete mask.

Then, on the basis of the results of the exposure latitudes 1A and 1B, the exposure latitude 2, the exposure latitude 3 and the exposure latitude 5, an exposure latitude on the occasion of transcribing a pattern onto a wafer by making use of this mask is determined (ST. 6).

In this embodiment, as the exposure latitude of the half-tone type phase-shifting mask formed as described above, a total magnitude of the deterioration was calculated on the basis of the exposure latitudes 1A and 1B, the exposure latitude 2, the exposure latitude 3 and the exposure latitude 5.

As a result of the calculation, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 5.4% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.4 μm, it was possible to secure an exposure dose latitude of 11%.

As a result, the exposure latitude of the half-tone type phase-shifting mask was found such that it was possible to obtain an exposure latitude of 5.6% under the condition wherein the focusing latitude was set to 0.4 μm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.4 μm, the exposure dose latitude of the mask was not less than 4%.

The exposure latitude of the half-tone type phase-shifting mask formed as described above was 5.6% as determined in the ST. 6. Therefore, as shown in FIG. 30, this half-tone type phase-shifting mask was found to satisfy the standard, thus judging this half-tone type phase-shifting mask as being non-defective.

According to this fourteenth embodiment, almost the same effects as those of the aforementioned seventh embodiment can be derived.

15th Embodiment

Figure 32:
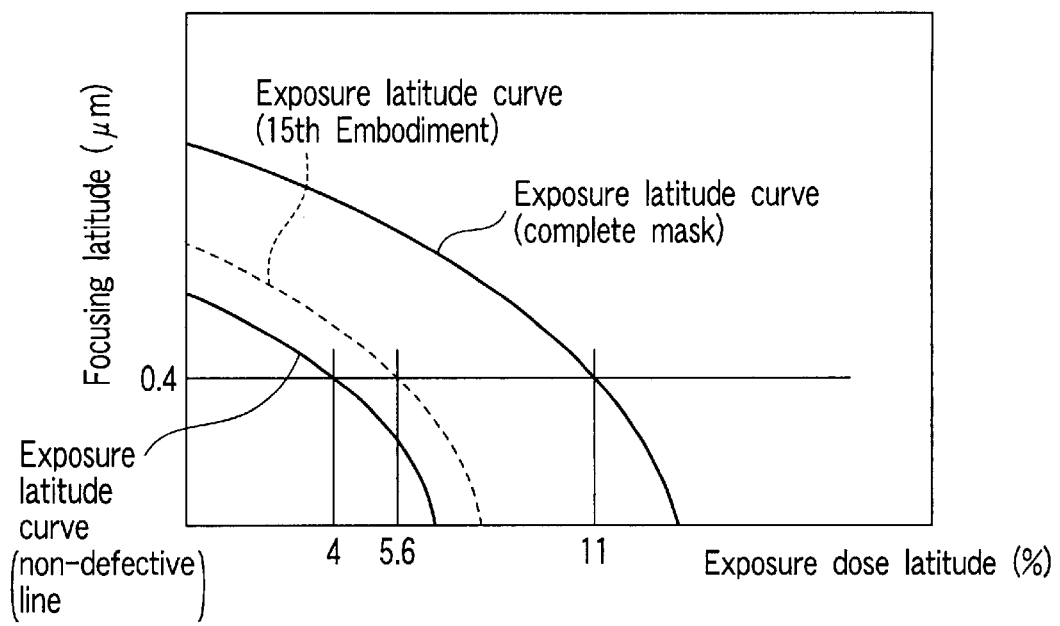
FIG. 32 is a graph showing an example of a relationship between the focusing latitude and the exposure dose latitude according to a fifteenth example of the present invention.

FIG. 31 is a flow chart showing a method of manufacturing a half-tone phase-shifting mask according to a fifteenth embodiment of the present invention. FIG. 32 is a graph showing an example of a relationship between the focusing latitude and the exposure dose latitude according to a fifteenth example of the present invention.

First, a mask pattern is formed on the surface of mask blanks as shown in FIG. 31 (ST. 1).

In this embodiment, an isolated line pattern of 0.70 μm was drawn on HT mask blanks coated thereon with a layer of chemical amplification type positive tone resist, and then, subjected to a development process to form a resist pattern.

Then, by making use of this resist pattern as an etching mask, the half tone film was etched to form a mask pattern.

Then, the dimensions of the mask pattern are measured (ST. 2).

Further, the location of the mask pattern drawn is measured (ST. 3).

Then, the optical properties of a phase-shifting film, i.e., in this embodiment, the optical properties of a half-tone type phase-shifting film are measured (ST. 8).

Furthermore, the defect-detecting inspection of the half-tone type phase-shifting mask formed as mentioned above is measured (ST. 10).

In this embodiment, as an item for measuring the dimensions, the difference between an average value of the dimensions of the mask pattern formed as described above and a target value of the dimensions, as well as the in-plane uniformity of the dimensions of the mask pattern were determined. As a result, the difference between the average value and the target value of the dimensions was 10 nm, and the in-plane uniformity was 5 nm ($3\sigma$).

Further, in this embodiment, as an item for measuring the described location of the pattern, an average value of the locational deviation of the mask pattern, and the dispersion of the locational deviation were determined. As a result, the average value of the locational deviation was 5 nm, and the dispersion of the locational deviation was 10 nm ($3\sigma$).

Further, in this embodiment, as an item for measuring the optical properties of the half-tone type phase-shifting film, a difference between the average value of the transmittance of the phase-shifting film and the target value of the transmittance, the in-plane uniformity of the transmittance (a magnitude of the deviation from the target transmittance), a difference between the average value of the phase difference and the target value of the phase difference, and the in-plane uniformity of the phase difference were determined. As a result, the difference between the average value of the transmittance and the target value of the transmittance was −0.5%, the in-plane uniformity of the transmittance was 0.7% (3σ), the difference between the average value of the phase difference and the target value of the phase difference was 5°, and the in-plane uniformity of the phase difference was 7°

Further, in this embodiment, a pin-hole having an area of 200 nm×200 nm was discovered in the defect-detecting inspection step. Therefore, the defect, i.e., the pin-hole in this embodiment, was corrected by making use of a defect-correcting device (ST. 12).

Then, the area and transmittance of this corrected pin-hole portion were measured (ST. 13).

When the area and transmittance of this corrected pin-hole portion were measured, the area of the corrected pin-hole portion was 200 nm×200 nm, and the transmittance was 0%.

Then, on the basis of the results obtained from the measurement of the dimensions, an exposure latitude 1 to be determined depending on the dimensional accuracy on the occasion of transcribing a pattern onto a wafer by making use of this half-tone type phase-shifting mask is determined (ST. 4).

In this embodiment, among the dimensional accuracy, the exposure latitude 1A to be determined depending on the difference between the average value of the dimensions of the mask pattern and the target dimensional value, and the exposure latitude 1B to be determined depending on the in-plane uniformity of the dimensions of the mask pattern were determined. Then, as the exposure latitude 1A, the magnitude of the deterioration deviated from the exposure dose latitude of the complete mask was calculated. The conditions of exposure employed for this calculation were selected to be the same as the exposure conditions to be actually employed for the mask, e.g., ArF stepper; NA =0.60; σ=0.75; and an annular illumination of a ⅔ shielding factor.

As a result of this calculation, the exposure latitude 1A was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1.7% from the exposure dose latitude. of the complete mask.

Likewise, the exposure latitude 1B was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1.1% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this half-tone type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.6% from the exposure dose latitude of the complete mask.

Then, on the basis of the results measured of the optical properties of the phase-shifting film, an exposure latitude 3 to be determined depending on the optical properties of the phase-shifting film on the occasion of transcribing a pattern onto a wafer by making use of this half-tone type phase-shifting mask is determined (ST. 9).

As a result of the calculation performed under the same conditions as those of the exposure latitude 1, the exposure latitude 3 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.1% from the exposure dose latitude of the complete mask.

Further, an exposure latitude 5 due to the correction of the defect is determined (ST. 14).

As a result of the calculation performed under the same conditions as those of the exposure latitude 1, the exposure latitude 5 due to the correction of the defect was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1% from the exposure dose latitude of the complete mask.

Then, on the basis of the results of the exposure latitudes 1A and 1B, the exposure latitude 2, the exposure latitude 3 and the exposure latitude 5, an exposure latitude on the occasion of transcribing a pattern onto a wafer by making use of this mask is determined (ST. 6).

In this embodiment, as the exposure latitude of the half-tone type phase-shifting mask formed as described above, a total magnitude of the deterioration was calculated on the basis of the exposure latitudes 1A and 1B, the exposure latitude 2, the exposure latitude 3 and the exposure latitude 5.

As a result of the calculation, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 5.4% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.4 μm, it was possible to secure an exposure dose latitude of 11%.

As a result, the exposure latitude of the half-tone type phase-shifting mask was found such that it was possible to obtain an exposure latitude of 5.6% under the condition wherein the focusing latitude was set to 0.4 μm.

Then, a determination is made to determine if the exposure latitude of this mask satisfies the specified standard (ST. 7).

In the case of this embodiment, the exposure latitude desired as the standard was such that, under the condition wherein the focusing latitude could be retained at least 0.4 μm, the exposure dose latitude of the mask was not less than 4%.

The exposure latitude of the half-tone type phase-shifting mask formed as described above was 5.6% as determined in the ST. 6. Therefore, as shown in FIG. 32, this half-tone type phase-shifting mask was found to satisfy the standard, thus judging this half-tone type phase-shifting mask as being non-defective.

According to this fifteenth embodiment, almost the same effects as those of the aforementioned seventh embodiment can be derived.

16th Embodiment

Figure 34:
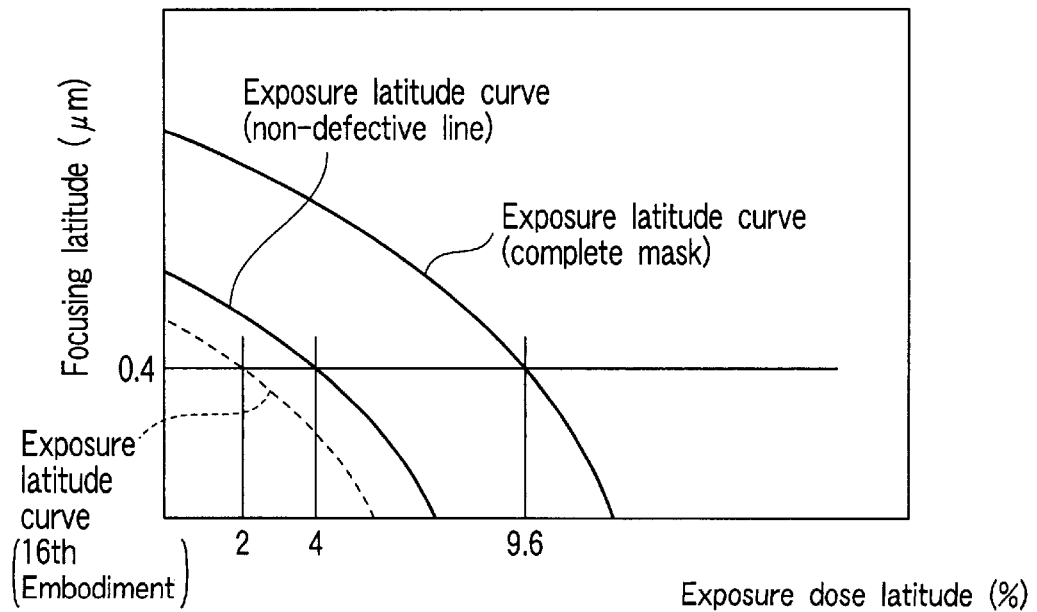
FIG. 34 is a graph showing an example of a relationship between the focusing latitude and the exposure dose latitude according to a sixteenth embodiment of the present invention.
Figure 33:
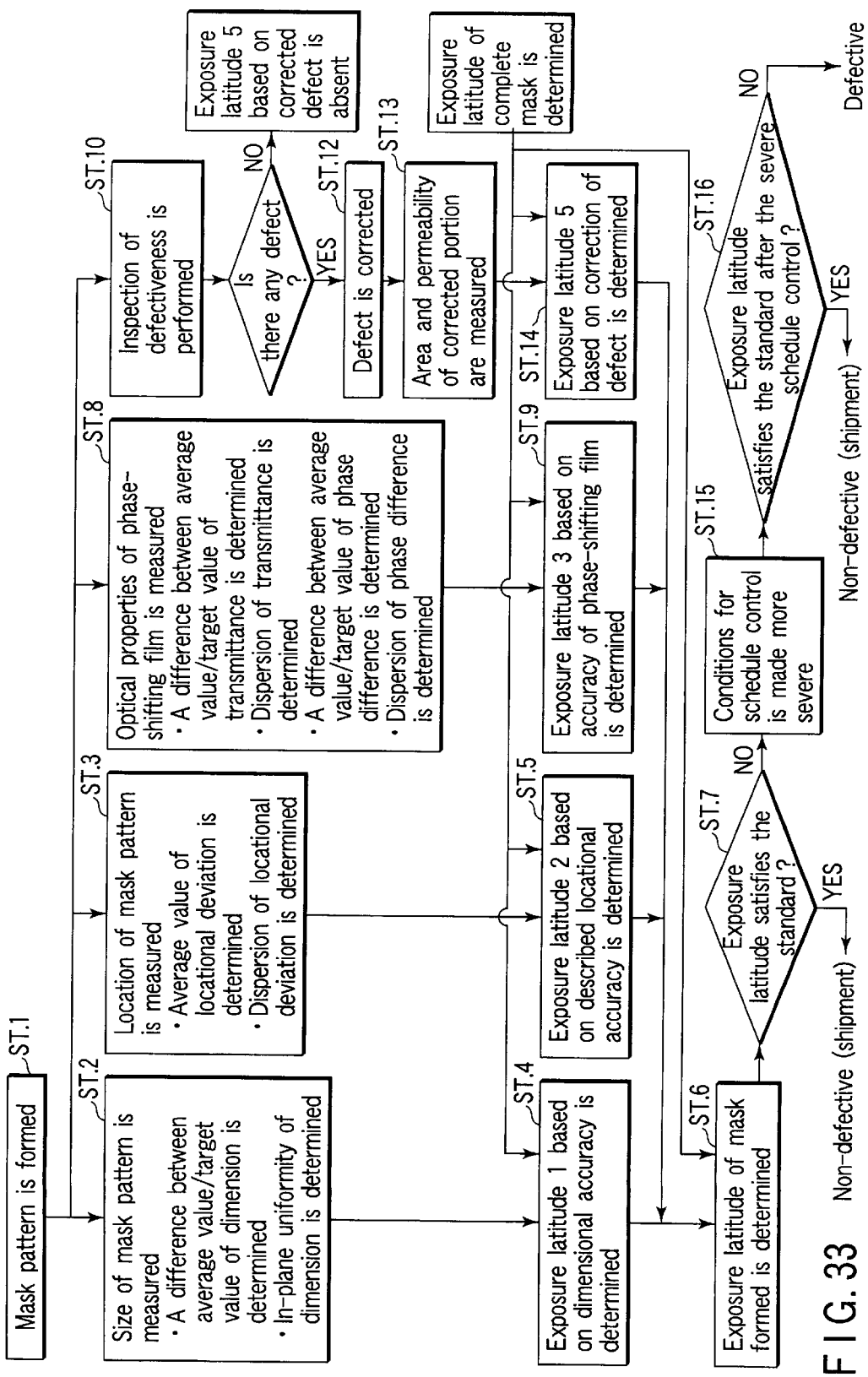
FIG. 33 is a flow chart showing a method of manufacturing a half-tone phase-shifting mask according to a sixteenth embodiment of the present invention.
Figure 35:
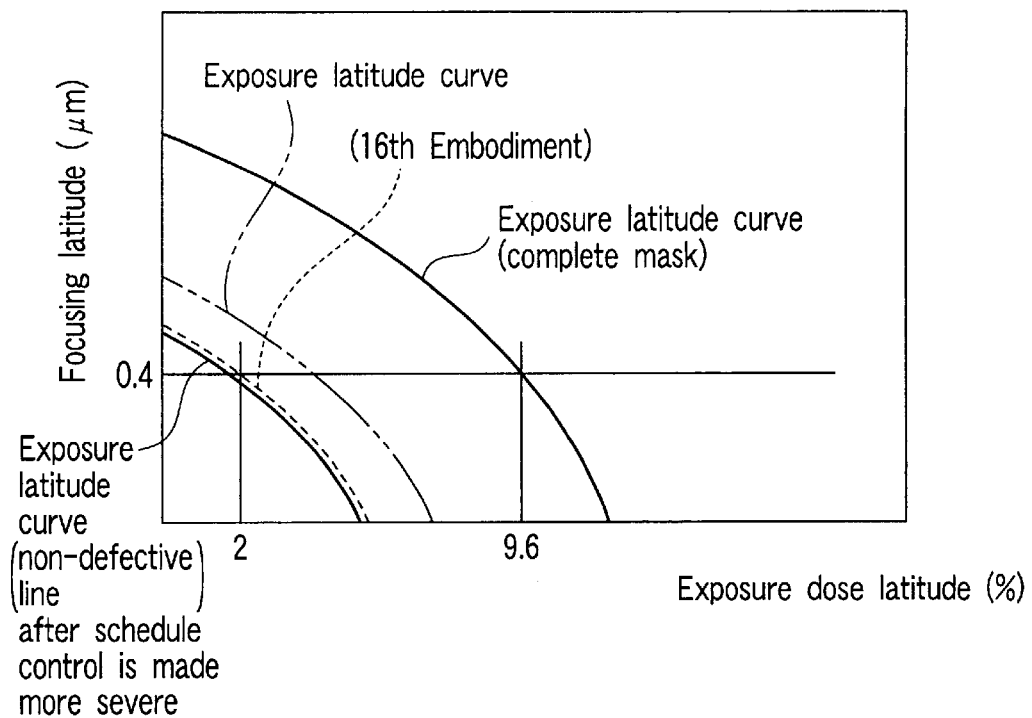
FIG. 35 is a graph showing an example of a relationship between the focusing latitude and the exposure dose latitude to a sixteenth embodiment of the present invention (after the process administration was tightened)

FIG. 33 is a flow chart showing a method of manufacturing a half-tone phase-shifting mask according to a sixteenth embodiment of the present invention. FIG. 34 is a graph showing an example of a relationship between the focusing latitude and the exposure dose latitude according to a sixteenth embodiment of the present invention. FIG. 35 is a graph showing an example of a relationship between the focusing latitude and the exposure dose latitude to a sixteenth embodiment of the present invention (after the process administration was tightened).

First, a mask pattern is formed on the surface of mask blanks as shown in FIG. 33 (ST. 1).

In this embodiment, an isolated line pattern of 0.70 µm was drawn on HT mask blanks coated thereon with a layer of chemical amplification type positive tone resist, and then, subjected to a development process to form a resist pattern.

Then, by making use of this resist pattern as an etching mask, the half tone film was etched to form a mask pattern.

Then, the dimensions of the mask pattern are measured (ST. 2).

Further, the location of the mask pattern drawn is measured (ST. 3).

Then, the optical properties of a phase-shifting film, i.e., in this embodiment, the optical properties of a half-tone type phase-shifting film, are measured (ST. 8).

Furthermore, the defect-detecting inspection of the half-tone type phase-shifting mask formed as mentioned above is measured (ST. 10). In this embodiment, as an item for measuring the dimensions, the difference between an average value of the dimensions of the mask pattern formed as described above and a target value of the dimensions, as well as the in-plane uniformity of the dimensions of the mask pattern were determined. As a result, the difference between the average value and the target value of the dimensions was 10 nm, and the in-plane uniformity was 5 nm (3σ).

Further, in this embodiment, as an item for measuring the described location of the pattern, an average value of the locational deviation of the mask pattern, and the dispersion of the locational deviation were determined. As a result, the average value of the locational deviation was 5 nm, and the dispersion of the locational deviation was 10 nm (3σ).

Further, in this embodiment, as an item for measuring the optical properties of the half-tone type phase-shifting film, a difference between the average value of the transmittance of the phase-shifting film and the target value of the transmittance, the in-plane uniformity of the transmittance (a magnitude of the deviation from the target transmittance), a difference between the average value of the phase difference and the target value of the phase difference, and the in-plane uniformity of the phase difference were determined. As a result, the difference between the average value of the transmittance and the target value of the transmittance was −0.5%, the in-plane uniformity of the transmittance was 0.7% (3σ), the difference between the average value of the phase difference and the target value of the phase difference was 5°, and the in-plane uniformity of the phase difference was 7°

Further, in this embodiment, an opaque foreign matter having an area of 50000 nm$^2$ was discovered in the defect-detecting inspection step. Therefore, the defect, i.e., the pin-hole in this embodiment, was corrected by making use of a defect-correcting device (ST. 12).

Then, the area and transmittance of this corrected pin-hole portion were measured (ST. 13).

When the area and transmittance of this corrected portion were measured, the area of the corrected portion was 30000 nm$^2$, and the transmittance was 96%.

Then, on the basis of the results obtained from the measurement of the dimensions, an exposure latitude 1 to be determined depending on the dimensional accuracy on the occasion of transcribing a pattern onto a wafer by making use of this half-tone type phase-shifting mask is determined (ST. 4).

In this embodiment, among the dimensional accuracy, the exposure latitude 1A to be determined depending on the difference between the average value of the dimensions of the mask pattern and the target dimensional value, and the exposure latitude 1B to be determined depending on the in-plane uniformity of the dimensions of the mask pattern were determined. Then, as the exposure latitude 1A, the magnitude of the deterioration deviated from the exposure dose latitude of the complete mask was calculated. The conditions of exposure employed for this calculation were selected to be the same as the exposure conditions to be actually employed for the mask, e.g., ArF stepper; NA =0.55; σ=0.75; and an annular illumination of a ⅔ shielding factor.

As a result of this calculation, the exposure latitude 1A was such that, under the condition wherein the fluctuation in the dimensions of the pattern could be confined to not more than 10%, and the focusing latitude could be retained at least 0.4 µm, the exposure dose latitude of the half-tone type phase-shifting mask was deteriorated 3.2% from the exposure dose latitude of the complete mask.

Likewise, the exposure latitude 1B was such that, under the condition wherein the fluctuation in the dimensions of the pattern could be confined to not more than 10%, and the focusing latitude could be retained at least 0.4 µm, the exposure dose latitude of the half-tone type phase-shifting mask was deteriorated 1.3% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this half-tone type phase-shifting mask is determined (ST. 5).

As a result of the calculation performed under the same conditions as those of the exposure latitude 1, the exposure latitude 2 was such that, under the condition wherein the fluctuation in the dimensions of the pattern could be confined to not more than 10%, and the focusing latitude could be retained at least 0.4 µm, the exposure dose latitude of the half-tone type phase-shifting mask was deteriorated 2.6% from the exposure dose latitude of the complete mask.

Then, on the basis of the results measured of the optical properties of the phase-shifting film, an exposure latitude 3 to be determined depending on the optical properties of the phase-shifting film on the occasion of transcribing a pattern onto a wafer by making use of this half-tone type phase-shifting mask is determined (ST. 9).

As a result of the calculation performed under the same conditions as those of the exposure latitude 1, the exposure latitude 3 was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 2.1% from the exposure dose latitude of the complete mask.

Further, an exposure latitude 5 due to the correction of the defect is determined (ST. 14).

As a result of the calculation performed under the same conditions as those of. the exposure latitude 1, the exposure latitude 5 due to the correction of the defect was such that, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 1.5% from the exposure dose latitude of the complete mask.

Then, on the basis of the results of the exposure latitudes 1A and 1B, the exposure latitude 2, the exposure latitude 3 and the exposure latitude 5, an exposure latitude on the occasion of transcribing a pattern onto a wafer by making use of this mask is determined (ST. 6).

In this embodiment, as the exposure latitude of the half-tone type phase-shifting mask formed as described above, a total magnitude of the deterioration was calculated on the basis of the exposure latitudes 1A and 1B, the exposure latitude 2, the exposure latitude 3 and the exposure latitude 5.

As a result of the calculation, under the condition wherein the fluctuation in the dimensions of the pattern could be confined to not more than 10%, and the focusing latitude could be retained at least 0.4 μm, the exposure dose latitude of the half-tone type phase-shifting mask was deteriorated 7.6% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.4 μm, it was possible to secure an exposure dose latitude of 9.6%.

As a result, the exposure latitude of the half-tone type phase-shifting mask was found such that it was possible to obtain an exposure latitude of 2.0% under the condition wherein the focusing latitude was set to 0.4 μm.

Then, a determination is made to determine the exposure latitude of this mask satisfies the specified standard (ST. 7).

In the case of this embodiment, the exposure latitude desired as the standard was such that, under the condition wherein the focusing latitude could be retained at least 0.4 μm, the exposure dose latitude of the mask was not less than 4%.

The exposure latitude of the half-tone type phase-shifting mask formed as described above was 2.0% as determined in the ST. 6. Therefore, as shown in FIG. 34, this half-tone type phase-shifting mask failed to satisfy the standard, thus judging this half-tone type phase-shifting mask as being defective.

However, the conditions for process control on the occasion of employing this mask to be performed by a customer using this half-tone type phase-shifting mask are made more strict. For example, the frequency of controlling the exposure dose or the frequency of QC in the exposure apparatus, which is to be employed in the process of transcribing a pattern onto a wafer from this mask is increased from every second lot up to every other lot, thus making the process control more strict (ST. 15).

When the conditions for process control, such as the frequency of controlling the exposure dose, etc. were made more strict, the exposure dose required turned out to be sufficient even if it was as low as 2% as shown in FIG. 35.

Thus, by making the conditions for process control to be performed by a customer more severe, this half-tone type phase-shifting mask was turned out to satisfy the standard and judged as being non-defective (ST. 16).

17th Embodiment

Figure 37:
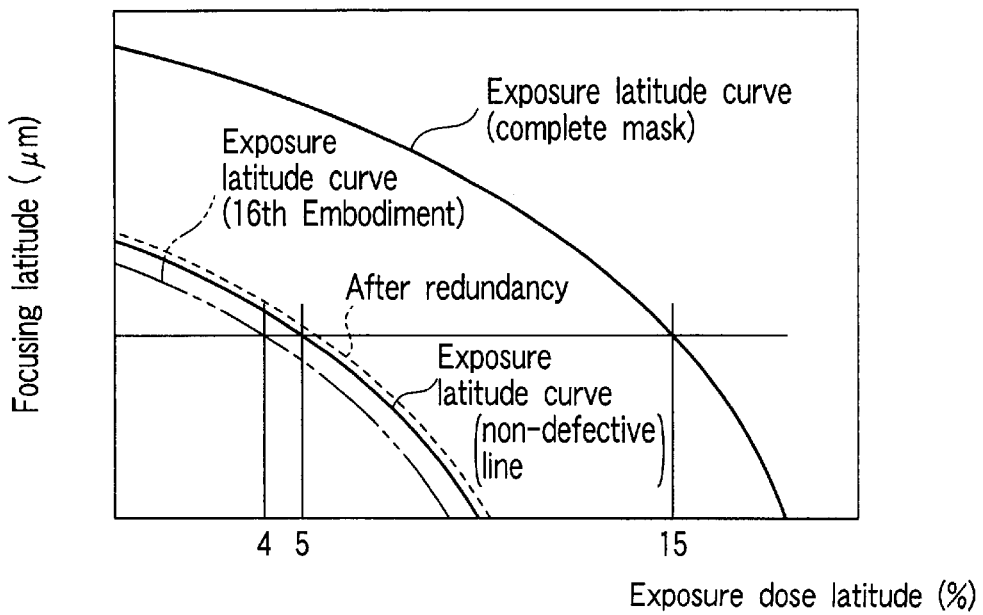
FIG. 37 is a graph showing an example of a relationship between the focusing latitude and the exposure dose latitude according to a seventeenth example of the present invention.
Figure 36:
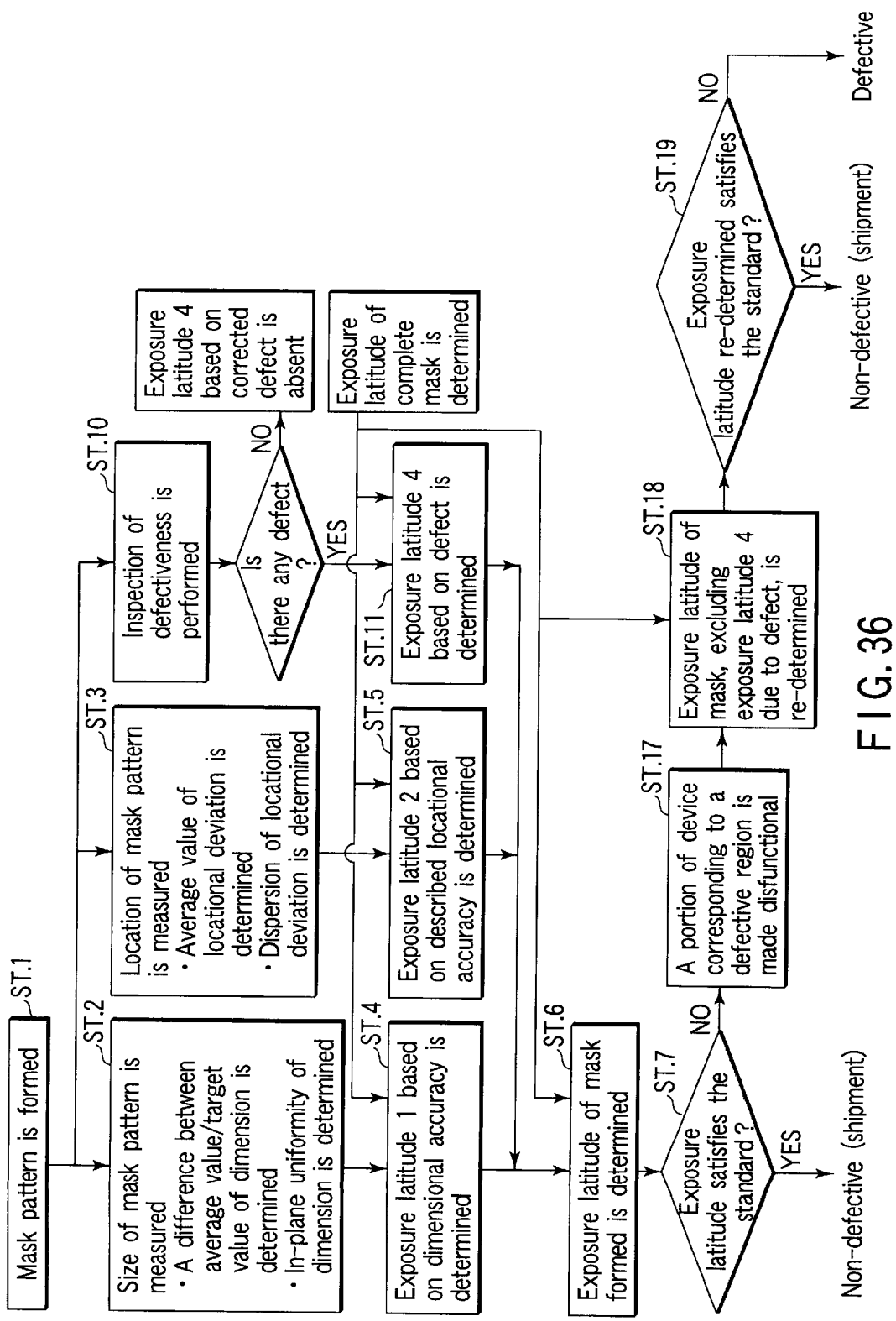
FIG. 36 is a flow chart showing a method of manufacturing a photomask according to a seventeenth embodiment of the present invention.

FIG. 36 is a flow chart showing a method of manufacturing a photomask according to a seventeenth embodiment of the present invention. FIG. 37 is a graph showing an example of a relationship between the focusing latitude and the exposure dose latitude according to a seventeenth example of the present invention.

First, a mask pattern is formed on the surface of mask blanks as shown in FIG. 36 (ST. 1).

In this embodiment, an L/S type pattern of 0.60 μm was drawn on Cr mask blanks coated thereon with a layer of chemical amplification type positive tone resist, and then, subjected to a development process to form a resist pattern.

Then, by making use of this resist pattern as an etching mask, the Cr film was etched to form a Cr pattern (a mask pattern).

Then, the dimensions of the mask pattern are measured (ST. 2).

Further, the location of the mask pattern drawn is measured (ST. 3).

Furthermore, the defect-detecting inspection of the Cr mask formed as mentioned above is measured (ST. 10).

In this embodiment, as an item for measuring the dimensions, the difference between an average value of the dimensions of the Cr pattern and a target value of the dimensions, as well as the in-plane uniformity of the dimensions of the Cr pattern were determined. As a result, the difference between the average value and the target value of the dimensions was 10 nm, and the in-plane uniformity was 25 nm (3σ).

Further, in this embodiment, as an item for measuring the described location of the pattern, an average value of the locational deviation of the Cr pattern, and the dispersion of the locational deviation were determined. As a result, the average value of the locational deviation was 5 nm, and the dispersion of the locational deviation was 10 nm (3σ).

Further, in this embodiment, an opaque foreign matter having an area of 100 $nm^2$ was discovered.

Then, on the basis of the results obtained from the measurement of the dimensions, an exposure latitude 1 to be determined depending on the dimensional accuracy on the occasion of transcribing a pattern onto a wafer by making use of this Cr mask is determined (ST. 4).

In this embodiment, as the exposure latitude 1 to be determined depending on the dimensional accuracy, the magnitude of the deterioration deviated from the exposure dose latitude of a complete mask was calculated.

The conditions of exposure employed for this calculation were selected to be the same as the exposure conditions to be actually employed for the mask, e.g., KrF stepper; NA =0.68; σ=0.75; and an annular illumination of a ⅔ shielding factor.

As a result of this calculation, the exposure latitude 1 of the Cr mask was such that, under the condition wherein the fluctuation in the dimensions of the pattern could be confined to not more than 10%, and the focusing latitude could be retained at least 0.5 μm, the exposure dose latitude of the Cr mask was deteriorated 9.4% from the exposure dose latitude of the complete mask.

Then, on the basis of the results obtained from the measurement of the described location, an exposure latitude 2 to be determined depending on the accuracy of the described location on the occasion of transcribing a pattern onto a wafer by making use of this mask is determined (ST. 5).

As a result of the calculation performed under the same conditions as those of the exposure latitude 1, the exposure latitude 2 to be determined depending on the accuracy of the described location was such that, under the condition wherein the fluctuation in the dimensions of the pattern could be confined to not more than 10%, and the focusing latitude could be retained at least 0.5 μm, the exposure dose latitude of the Cr mask was deteriorated 2.6% from the exposure dose latitude of the complete mask.

Further, an exposure latitude 4 due to a defect is determined (ST. 11).

As a result of the calculation performed under the same conditions as those of the exposure latitude 1, the exposure latitude 4 due to a defect was such that, under the condition wherein the fluctuation in the dimensions of the pattern could be confined to not more than 10%, and the focusing latitude could be retained at least 0.5 μm, the exposure dose latitude of the Cr mask was deteriorated 1% from the exposure dose latitude of the complete mask.

Then, on the basis of the results of the exposure latitudes 1 and 2, and the exposure latitude 4, an exposure latitude on the occasion of transcribing a pattern onto a wafer by making use of this mask is determined (ST. 6).

In this embodiment, as the exposure latitude of the Cr mask formed as described above, a total magnitude of the deterioration was calculated on the basis of three kinds of the deterioration that were determined as the aforementioned exposure latitudes 1 and 2, and the exposure latitude 4.

As a result of the calculation, the exposure latitude of the Cr mask was such that, under the condition wherein the fluctuation in the dimensions of the pattern could be confined to not more than 10%, and the focusing latitude could be retained at least 0.5 μm, the exposure dose latitude of the Cr mask deteriorated 11.0% from the exposure dose latitude of the complete mask.

As a result of this calculation, the exposure latitude of the complete mask was found such that, under the condition wherein the fluctuation in the dimensions of the pattern could be confined to not more than 10%, and the focusing latitude could be retained at least 0.5 μm, it was possible to secure an exposure dose latitude of 15%.

As a result, the exposure latitude of the Cr mask was found such that it was possible to obtain an exposure latitude of 4% under the condition wherein the focusing latitude was set to 0.5 μm.

Then, a determination is made to determine the exposure latitude of this mask satisfies the specified standard (ST. 7).

In the case of this embodiment, the exposure latitude desired as the standard was such that, under the condition wherein the focusing latitude could be retained at least 0.5 μm, the exposure dose latitude of the mask was not less than 5%.

The exposure latitude of the Cr mask formed as described above was 4.3% as determined in the ST. 6. Therefore, as shown in FIG. 37 this Cr mask failed to satisfy the standard, thus judging this Cr mask as being defective.

However, the portion of the device which was recognized as being defective was cut out by means of the redundancy technology commonly employed in the field of semiconductor memory, thus making this defective portion disfunctional as a device (ST. 17).

As a result, this Cr mask turned out as being non-defective.

Then, on the basis of the exposure latitude 1 to be determined depending on the dimensional precision, and of the exposure latitude 2 to be determined depending on the locational precision of the pattern described, wherein the exposure latitude 1 due to the defect was excluded, on the occasion of transcribing a pattern onto a wafer by making use of this mask is re-determined (ST. 18).

As a result, the exposure latitude of the Cr mask was found such that it was possible to obtain an exposure latitude of 5% under the condition wherein the focusing latitude was set to 0.5 μm.

Thus, by making the defective portion of the device disfunctional as a device, this Cr mask satisfies the standard and is judged as being non-defective (ST. 19).

18th Embodiment

Figure 38:
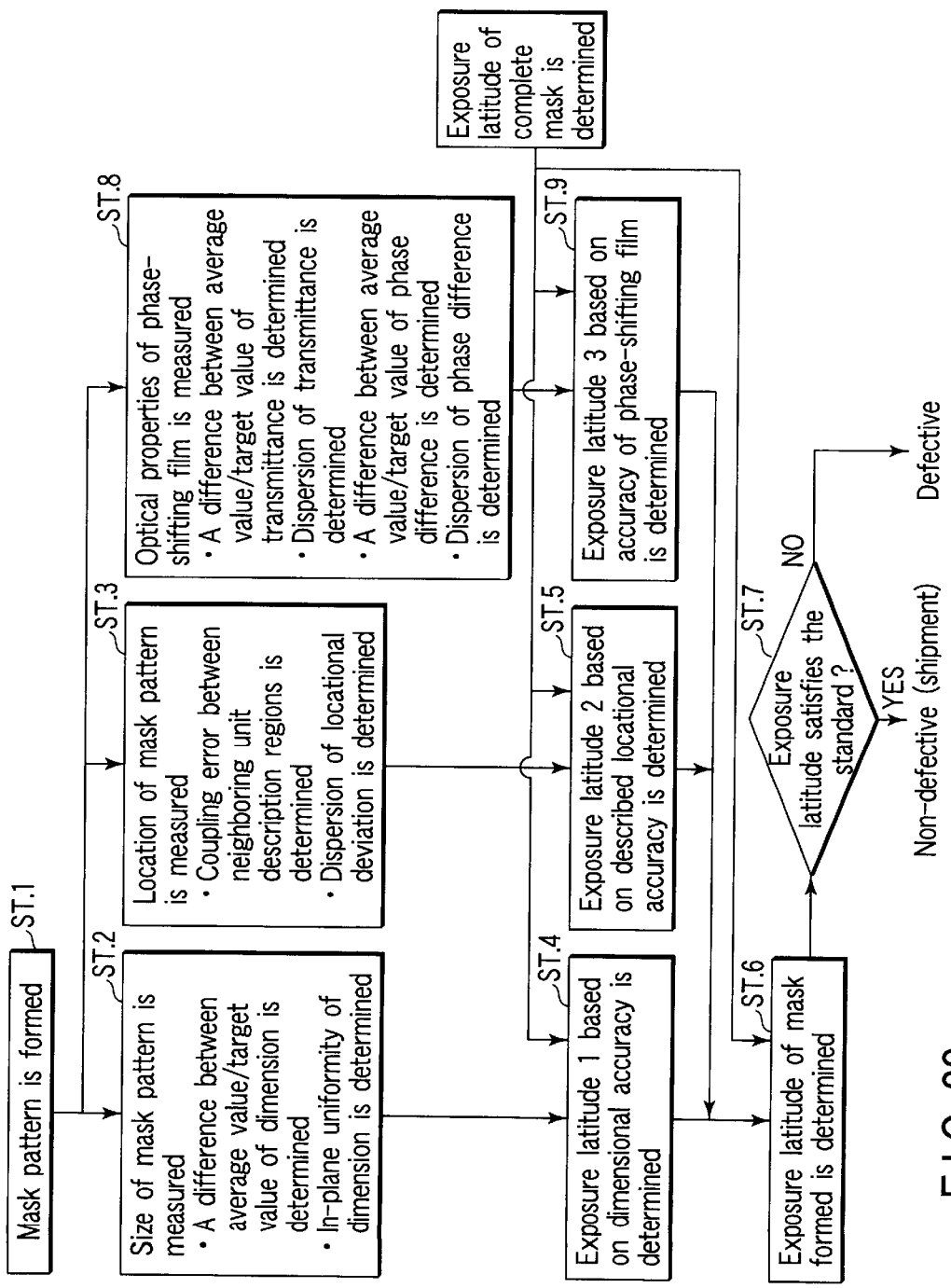
FIG. 38 is a flow chart showing a method of manufacturing a half-tone phase-shifting mask according to an eighteenth embodiment of the present invention.
Figure 39:
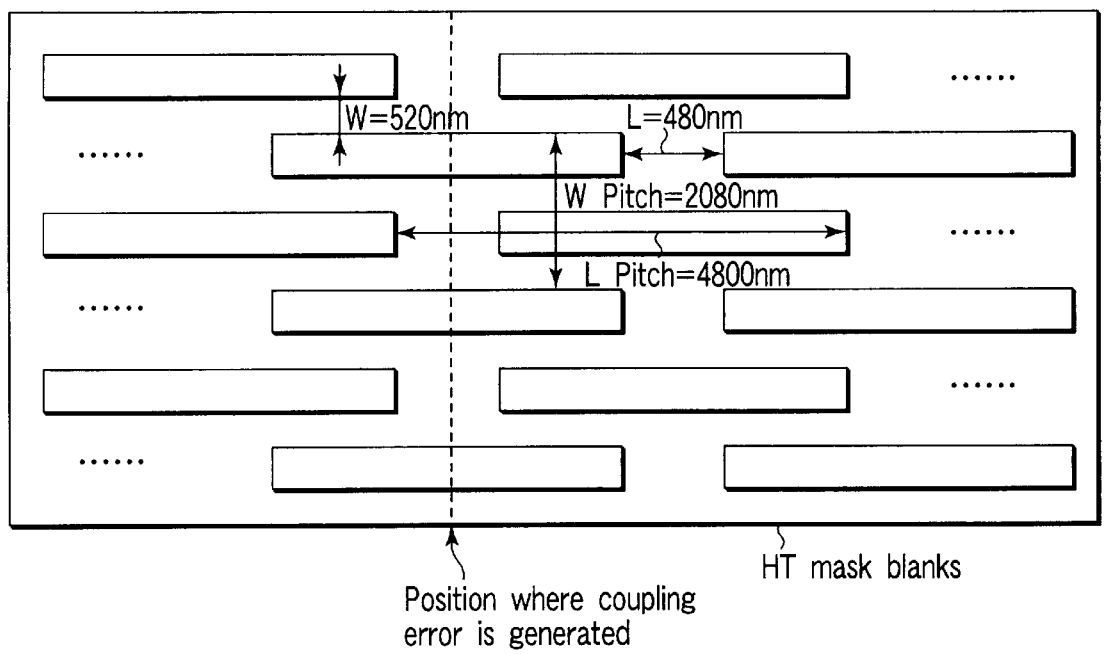
FIG. 39 is a plan view showing an example of an HT mask blank.
Figure 40:
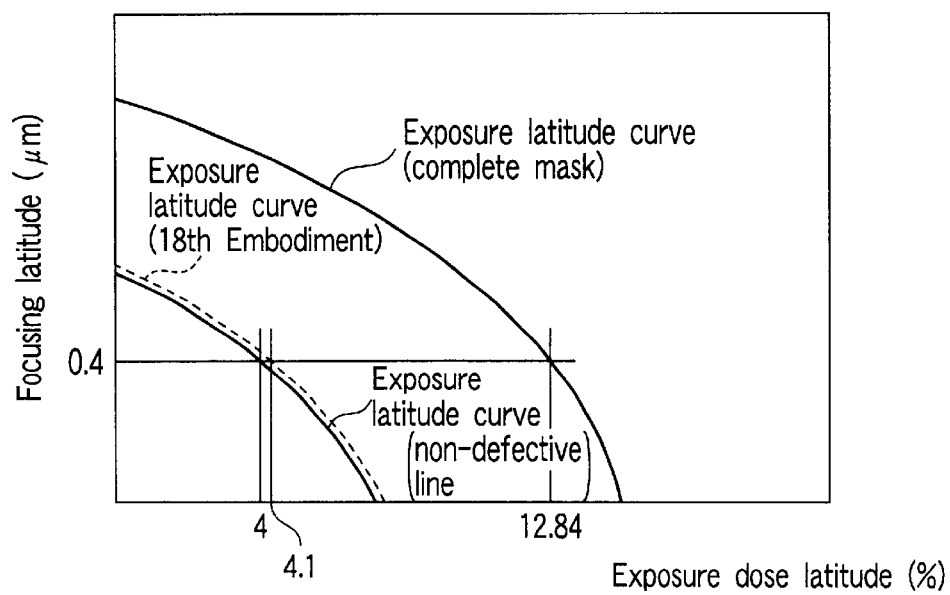
FIG. 40 is a graph showing an example of a relationship between the focusing latitude and the exposure dose latitude according to an eighteenth example of the present invention.

FIG. 38 is a flow chart showing a method of manufacturing a half-tone phase-shifting mask according to an eighteenth embodiment of the present invention. FIG. 39 is a plan view showing an example of an HT mask blanks. FIG. 40 is a graph showing an example of a relationship between the focusing latitude and the exposure dose latitude according to an eighteenth example of the present invention.

First, a mask pattern is formed on the surface of mask blanks as shown in FIG. 38 (ST. 1).

In this embodiment, as shown in FIG. 39, a rectangular pattern of W=520 nm, L=480 nm, Wpitch=2080 nm and Lpitch=4800 was drawn on HT mask blanks coated thereon with a layer of chemical amplification type positive tone resist, and then, worked to form a resist pattern.

When the dimension of this pattern in X-direction was measured at the portion of "L", the in-plane uniformity in X-direction was 10 nm, and the difference between the average value of this dimension and the target value was −10 nm. Likewise, when the dimension of this pattern in Y-direction was measured at the portion of "W", the in-plane uniformity in Y-direction was 10 nm, and the difference between the average value of this dimension and the target value was −10 nm (ST. 2).

Further, the in-plane uniformity of the transmittance of the phase-shifting film was 1.5% (range), a difference between the average value of the transmittance and the target transmittance was −0.5%, the in-plane uniformity of the phase difference was 1.5% (range), and the difference between the average value of the phase difference and the target phase difference was 30 (ST. 8).

On the other hand, the overlaying error between neighboring unit description regions was measured finding it 2.5 nm at the position generating this drawing-overlaying error (ST. 3).

Based on these data, the exposure latitude on the occasion of performing the exposure of wafer by making use of this mask was calculated using a KrF stepper under the conditions of: NA =0.68; σ=0.75; and a shielding factor of ⅔.

Under the conditions wherein the focusing latitude was set to 0.4 µm, the fluctuation of the dimensions of the pattern was confined to not more than 15 nm in X-direction and not more than 15 nm in Y-direction on the wafer, the magnitude of the deterioration from the exposure dose latitude of the complete mask which was free from any deviation from the target values was determined as being: 7.75% which was originated from the in-plane uniformity; 0.28% which was originated from the difference between the average value and the prescribed (desired) dimensions; 0.05% which was originated from the difference between the average value of the HT phase difference and the desired value; 0.13% which was originated from the uniformity of the phase difference; 0.19% which was originated from the difference between the average value of the HT transmittance and the desired value; 2.88% which was originated from the uniformity of the transmittance; and 0.71% which was originated from the locational precision; with the total deterioration being 8.83%.

The desired exposure latitude of the complete mask was found, through the calculation thereof, as being 12.84% in the exposure dose latitude on the occasion when the focusing latitude was set to 0.4 µm. As a result, the exposure latitude of this mask was determined such that it was possible to obtain an exposure latitude of 4.1% under the condition wherein the focusing latitude was set to 0.4 µm (ST. 4 to ST. 6 and ST. 9).

Since the exposure latitude was required to be at least 4% under the condition wherein the focusing latitude was set to 0.4 µm in the process of transcribing a pattern onto a wafer by making use of this mask, this mask satisfied the standard and hence, shipped as acceptable (ST. 7).

Although the present invention has been explained with reference to the foregoing first to eighteenth embodiments, it should be understood that the present invention would not be limited these embodiments but can be variously modified within the spirit of the present invention in executing the present invention.

For example, in the method of manufacturing the aforementioned half-tone type phase-shifting mask or Levenson type phase-shifting mask as set forth in the foregoing embodiments, an average value as well as an in-plane uniformity are determined with respect to the transmittance and the magnitude of the phase shift of the semi-light shielding region in the case of the half-tone type phase-shifting mask, whereas an average value as well as an in-plane uniformity are determined with respect to the magnitude of the phase shift of the light-transmitting region in the case of the Levenson type phase-shifting mask.

However, since there is a little fluctuation with regard to the magnitude of the in-plane uniformity between the masks, the magnitude of the in-plane uniformity would not be required to be calculated for every mask. Namely, the value of the in-plane uniformity which was obtained from the first mask may be utilized for the other mask.

Further, the value of the desired exposure latitude is not restricted to those which are illustrated in the foregoing embodiments, but can be optionally selected depending on the easiness of manufacturing the device or on the characteristics of resist.

As for the calculation for determining the exposure latitude, it may be determined from a pure optical image. However, the exposure latitude may be determined by taking the characteristics of resist or the features of the subsequent steps including the etching step, thereby making it possible to obtain a more accurate determination.

As for the pattern for determining the exposure latitude, it would. be preferable to select a pattern which is considered to exhibit a minimum exposure latitude. As long as a pattern of seemingly minimum exposure latitude is to be selected, it may be selected from any region of the device. For example, in the case of a semiconductor memory, the pattern may be selected from the cell pattern thereof or from the core circuit portion thereof as long as they are considered to be minimum in exposure latitude.

Further, in the case of the phase-shifting mask, if the measurement of the phase or the transmittance of the phase-shifting mask is considered to be difficult, the specification value for these phase and transmittance may be incorporated into the calculation of the exposure latitude, with only the values of the dimensions of the pattern which were actually measured on the actual mask being adapted in the calculation.

Additionally, the present invention will be variously modified in various ways without departing from the scope of the present invention. Further, the aforementioned embodiments may be executed singly or in combination thereof.

Furthermore, the aforementioned embodiments include the invention at various stages thereof, and hence, the invention can be extracted at various stages thereof.

Additional advantages and modifications will readily occur to those skilled in the art. Therefore, the invention is its broader aspects are not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photomask comprising:
   determining an average value of dimensions of a pattern of the photomask;
   determining an in-plane uniformity of the dimensions;
   determining an exposure latitude on the basis of the average value and the in-plane uniformity; and
   judging if the photomask is defective or non-defective on the basis of whether or not the exposure latitude falls within a prescribed exposure latitude.

2. A method of manufacturing a half-tone phase-shifting mask comprising:
   determining an average value of dimensions of a half-tone pattern of the half-tone phase-shifting mask;
   determining an in-plane uniformity of the dimensions;
   determining an average value of transmittance of the half-tone pattern;
   determining an In-plane uniformity of the transmittance;
   determining an average value of magnitude of phase-shift of the half-tone pattern;
   determining an in-plane uniformity of the magnitude of phase-shift;
   determining an exposure latitude on the basis of the average value and the in-plane uniformity in the dimensions, the average value and the in-plane uniformity in the transmittance, and the average value and the in-plane uniformity of the magnitude of phase-shift; and
   judging if the half-tone phase-shifting mask is defective or non-defective on the basis of whether or not the exposure latitude falls within a prescribed exposure latitude.

3. The method according to claim 2, wherein the in-plane uniformity of the transmittance and the in-plane uniformity of the magnitude of phase-shift are determined by making use of a previous mask, and the in-plane uniformities are determined not from subsequent masks after the previous mask.

4. A method of manufacturing an alternating phase-shifting mask comprising:
   determining an average value of dimensions of a pattern of the alternating phase-shifting mask;
   determining an in-plane uniformity of the dimensions;
   determining an average value of magnitude of phase-shift of a light-transmitting region in the alternating phase-shifting mask;
   determining an in-plane uniformity of the magnitude of phase-shift;
   determining an exposure latitude on the basis of the average value and the in-plane uniformity in the dimensions, and the average value and the in-plane uniformity of the magnitude of phase-shift; and
   judging if the alternating phase-shifting mask is defective or non-defective on the basis of whether or not the exposure latitude falls within a prescribed exposure latitude.

5. The method according to claim 4, wherein the in-plane uniformity of the magnitude of phase-shift is determined by making use of a previous mask, and the in-plane uniformity is determined not from subsequent masks after the previous mask.

6. The method according to claim 1, wherein the exposure latitude is defined from a defocusing latitude and from a latitude of exposure dose.

7. The method according to claim 2, wherein the exposure latitude is defined from a defocusing latitude and from a latitude of exposure dose.

8. The method according to claim 4, wherein the exposure latitude is defined from a defocusing latitude and from a latitude of exposure dose.

9. A method of manufacturing a photomask comprising:
   obtaining in advance a relationship between:
      an average value of dimensions of a pattern and
      an in-plane uniformity of the dimensions,
      the relationship satisfying a prescribed exposure latitude;
   determining an average value of dimensions of a pattern of the photomask;
   determining an in-plane uniformity of the dimensions; and
   judging if the photomask is defective or non-defective on the basis of whether or not the average value determined and the in-plane uniformity determined satisfy the relationship obtained in advance.

10. A method of manufacturing a half-tone phase-shifting mask comprising:
    obtaining in advance a relationship among
       an average value of dimensions of a half-tone pattern,
       an in-plane uniformity of the dimensions,
       an average value of transmittance of the half-tone pattern,
       an in-plane uniformity of the transmittance,
       an average value of magnitude of phase-shift of the half-tone pattern, and
       an in-plane uniformity of the magnitude of phase-shift,
    wherein the relationship satisfies a prescribed exposure latitude;
    determining an average value of dimensions of a half-tone pattern of the half-tone phase-shifting mask;
    determining an in-plane uniformity of the dimensions;
    determining an average value of transmittance of the half-tone pattern;
    determining an in-plane uniformity of the transmittance;
    determining an average value of magnitude of phase-shift of the half-tone pattern;
    determining an in-plane uniformity of the magnitude of phase-shift; and
    judging if the half-tone phase-shifting mask is defective or non-defective on the basis of whether or not the average value of the dimensions determined, the in-plane uniformity of the dimensions determined, the average value of the transmittance determined, the in-plane uniformity of the transmittance determined, the average value of the magnitude of phase-shift determined, and the in-plane uniformity of the magnitude of phase-shift determined satisfy the relationship obtained in advance.

11. The method according to claim 10, wherein the in-plane uniformity of the transmittance and the in-plane uniformity of the magnitude of phase-shift are determined by making use of a previous mask, and the in-plane uniformities are determined not from subsequent masks after the previous mask.

12. A method of manufacturing an alternating phase-shifting mask comprising:
    obtaining in advance a relationship among:
       an average value of dimensions of a pattern,
       an in-plane uniformity of the dimensions,
       an average value of magnitude of phase-shift of a light-transmitting region, and
       an in-plane uniformity of the magnitude of phase-shift,
    wherein the relationship satisfies a prescribed exposure latitude;
    determining an average value of dimensions of a pattern of the alternating phase-shifting mask;
    determining an in-plane uniformity of the dimensions;
    determining an average value of magnitude of phase-shift of a light-transmitting region in the alternating phase-shifting mask;
    determining an in-plane uniformity of the magnitude of phase-shift; and
    judging if the alternating phase-shifting mask is defective or non-defective on the basis of whether or not the average value of the dimensions determined, the in-plane uniformity of the dimensions determined, the average value of the magnitude of phase-shift determined, and the in-plane uniformity of the magnitude of phase-shift determined satisfy the relationship obtained in advance.

13. The method according to claim 12, wherein the in-plane uniformity of the magnitude of phase-shift is determined by making use of a previous mask, and the in-plane uniformity is determined not from subsequent masks after the previous mask.

14. The method according to claim 9, wherein the prescribed exposure latitude is defined from a defocusing latitude and from a latitude of exposure dose.

15. The method according to claim 10, wherein the prescribed exposure latitude is defined from a defocusing latitude and from a latitude of exposure dose.

16. The method according to claim 12, wherein the prescribed exposure latitude is defined from a defocusing latitude and from a latitude of exposure dose.

17. A method of manufacturing a photomask comprising:

determining an average value of dimensions of a pattern in a photomask;

determining an in-plane uniformity of the dimensions;

determining a locational accuracy of the pattern;

determining an exposure latitude 1 on the basis of the average value and the in-plane uniformity of the dimensions;

determining an exposure latitude 2 on the basis of the locational accuracy;

determining a totality exposure latitude on the basis of the exposure latitude 1 and the exposure latitude 2; and judging if the photomask is defective or non-defective on the basis of whether or not the totality exposure latitude falls within a prescribed exposure latitude.

18. A method of manufacturing a phase-shifting mask comprising:

determining an average value of dimensions of a pattern in a phase-shifting mask;

determining an in-plane uniformity of the dimensions;

determining a locational accuracy of the pattern;

determining optical properties of a phase-shifter in the phase-shifting mask;

determining an exposure latitude 1 on the basis the average value and the in-plane uniformity of the dimensions;

determining an exposure latitude 2 on the basis of the locational accuracy;

determining an exposure latitude 3 on the basis of the optical properties;

determining a totality exposure latitude on the basis of the exposure latitude 1, the exposure latitude 2, and the exposure latitude 3; and judging if the phase-shifting mask is defective or non-defective on the basis of whether or not the totality exposure latitude falls within a prescribed exposure latitude.

19. The method according to claim 17, further comprising:

extracting a defective portion from the pattern, the defective portion being not formed into a desired configuration;

determining a size of the defective portion;

determining a transmittance of the defective portion; and determining an exposure latitude 4 on the basis of the size and the transmittance of the defective portion, wherein a second totality exposure latitude is determined on the basis of the exposure latitude 1, the exposure latitude 2, and the exposure latitude 4.

20. The method according to claim 18, further comprising:

extracting a defective portion from the pattern, the defective portion being not formed into a desired configuration;

determining a size of the defective portion;

determining a transmittance of the defective portion; and determining an exposure latitude 4 on the basis of the size and the transmittance of the defective portion, wherein a second totality exposure latitude is determined on the basis of the exposure latitude 1, the exposure latitude 2, the exposure latitude 3, and the exposure latitude 4.

21. The method according to claim 17, further comprising:

extracting a defective portion from the pattern, the defective portion being not formed into a desired configuration;

correcting the defective portion;

determining a size of the corrected portion;

determining a transmittance of the corrected portion; and determining an exposure latitude 5 on the basis of the size and the transmittance of the corrected portion, wherein a second totality exposure latitude is determined on the basis of the exposure latitude 1, the exposure latitude 2, and the exposure latitude 5.

22. The method according to claim 18, further comprising:

extracting a defective portion from the pattern, the defective portion being not formed into a desired configuration;

correcting the defective portion;

determining a size of the corrected portion;

determining a transmittance of the corrected portion; and determining an exposure latitude on the basis of the size and the transmittance of the corrected portion, wherein a second totality exposure latitude is determined on the basis of the exposure latitude 1, the exposure latitude 2, the exposure latitude 3, and the exposure latitude 5.

23. The method according to claim 19, wherein the size of the defective portion is defined by an area of the defective portion.

24. The method according to claim 20, wherein the size of the defective portion is defined by an area of the defective portion.

25. The method according to claim 19, wherein the size of the defective portion is defined by a size in X-direction of the defective portion and by a size in Y-direction of the defective portion which is orthogonally intersected with the X-direction.

26. The method according to claim 20, wherein the size of the defective portion is defined by a size in X-direction of the defective portion and by a size in Y-direction of the defective portion which is orthogonally intersected with the X-direction.

27. The method according to claim 21, wherein the size of the corrected portion is defined by an area of the corrected portion.

28. The method according to claim 22, wherein the size of the corrected portion is defined by an area of the corrected portion.

29. The method according to claim 21, wherein the size of the corrected portion is defined by a size in X-direction of the corrected portion and by a size in Y-direction of the corrected portion which is orthogonally intersected with the X-direction.

30. The method according to claim 22, wherein the size of the corrected portion is defined by a size in X-direction of the corrected portion and by a size in Y-direction of the corrected portion which is orthogonally intersected with the X-direction.

31. The method according to claim 18, wherein determining the optical properties includes:

determining a phase of the phase-shifter, wherein the exposure latitude 3 determines on the basis of the phase.

32. The method according to claim 31, wherein determining the phase includes:

determining an average value of the phase, and
determining a dispersion of the phase;
and wherein determining the exposure latitude 3 includes:
determining an exposure latitude E on the basis of the average value of the phase, and
determining an exposure latitude F on the basis of the dispersion of the phase.

33. The method according to claim 18, wherein determining the optical properties includes:
determining a phase of the phase-shifter, and
determining a transmittance of the phase-shifter,
wherein the exposure latitude 3 determines on the basis of the phase and the transmittance.

34. The method according to claim 33, wherein determining the phase includes:
determining an average value of the phase, and
determining a dispersion of the phase;
wherein determining the transmittance includes:
determining an average value of the transmittance, and
determining a dispersion of the transmittance;
and wherein determining the third exposure latitude includes:
determining an exposure latitude E on the basis of the average value of the phase,
determining an exposure latitude F on the basis of the dispersion of the phase,
determining an exposure latitude G on the basis of the average value of the transmittance, and
determining an exposure latitude H on the basis of the dispersion of the transmittance.

35. The method according to claim 17, wherein determining the exposure latitude 1 includes:
determining an exposure latitude A on the basis of the average value of the dimensions, and
determining an exposure latitude B on the basis of the in-plane uniformity of the dimensions.

36. The method according to claim 18, wherein determining the exposure latitude 1 includes:
determining an exposure latitude A on the basis of the average value of the dimensions, and
determining an exposure latitude B on the basis of the in-plane uniformity of the dimensions.

37. The method according to claim 17, wherein determining the locational accuracy includes:
determining an average value of locational deviations of the pattern, and
determining a dispersion of the locational deviations; and
wherein the exposure latitude 2 determines on the basis of the average value of locational deviations and the dispersion of the locational deviations.

38. The method according to claim 18, wherein determining the locational accuracy includes:
determining an average value of locational deviations of the pattern, and
determining a dispersion of the locational deviations; and
wherein the exposure latitude 2 is determined on the basis of the average value of locational deviations and the dispersion of the locational deviations.

39. The method according to claim 17, wherein determining the average value of the dimensions includes:
determining an average value in X-direction of the dimensions, and
determining an average value in Y-direction of the dimensions;
and wherein determining the exposure latitude 1 includes:
determining an exposure latitude C on the basis of the average value in X-direction, and
determining an exposure latitude D on the basis of the average value in Y-direction.

40. The method according to claim 18, wherein determining the average value of the dimensions includes:
determining an average value in X-direction of the dimensions, and
determining an average value in Y-direction of the dimensions;
and wherein determining the exposure latitude 1 includes:
determining an exposure latitude C on the basis of the average value in X-direction, and
determining an exposure latitude D on the basis of the average value in Y-direction.

41. The method according to claim 17, wherein determining the locational accuracy includes at least one of:
determining an overlaying error between the pattern and another pattern,
determining a stretchable component of the photomask,
determining a deviation of orthogonally intersecting components of the photomask, and
determining a local locational deviation of the photomask; and
wherein the exposure latitude 2 is determined on the basis of the at least one of the overlaying error, the stretchable component, the deviation of orthogonally intersecting components, and the local locational deviation.

42. The method according to claim 18, wherein determining the locational accuracy includes at least one of:
determining an overlaying error between the pattern and another pattern,
determining a stretchable component of the phase-shifting mask,
determining a deviation of orthogonally intersecting components of the phase-shifting mask, and
determining a local locational deviation of the phase-shifting mask; and
wherein the exposure latitude 2 is determined on the basis of the at least one of the overlaying error, the stretchable component, the deviation of orthogonally intersecting components, and the local locational deviation.

43. The method according to claim 17, wherein the totality exposure latitude is defined from a defocusing latitude and from a latitude of exposure dose.

44. The method according to claim 18, wherein the totality exposure latitude is defined from a defocusing latitude and from a latitude of exposure dose.

45. The method according to claim 17, wherein the photomask which has been judged as defective, the method further comprising:
re-judging if the photomask is defective or non-defective, the re-judging including a condition for a process control in transcribing the pattern onto a wafer making use of the photomask has been judged as defective, by a customer.

46. The method according to claim 18, wherein the phase-shifting mask which has been judged as defective, the method further comprising:
re-judging if the phase-shifting mask is defective or non-defective, the re-judging including a condition for a process control in transcribing the pattern onto a wafer making use of the phase-shifting mask has been judged as defective, by a customer.

47. The method according to claim 45, wherein the condition for the process control includes an item to designate an apparatus to be employed in the transcribing the pattern onto the wafer by making use of the photomask.

48. The method according to claim 47, wherein the re-judging if the phase-shifting mask is defective or non-defective on the basis of the device to be formed includes a portion of the device is recognized as failing the prescribed exposure latitude and as being defective, the portion is made disfunctional as the device.

49. The method according to claim 45, wherein the condition for the process control includes an item to increase the number of times of QC to be employed in the transcribing the pattern onto the wafer by making use of the photomask.

50. The method according to claim 17, wherein the photomask which has been judged as defective, the method further comprising:

re-judging if the photomask is defective or non-defective on the basis of a device to be formed, by a customer.

51. The method according to claim 46, wherein the condition for the process control includes an item to designate an apparatus to be employed in the transcribing the pattern onto the wafer by making use of the phase-shifting mask.

52. The method according to claim 46, wherein the condition for the process control includes an item to increase the number of times of QC to be employed in the transcribing the pattern onto the wafer by making use of the phase-shifting mask.

53. The method according to claim 46, wherein the re-judging if the photomask is defective or non-defective on the basis of the device to be formed includes a portion of the device is recognized as failing the prescribed exposure latitude and as being defective, the portion is made disfunctional as the device.

54. The method according to claim 18, wherein the phase-shifting mask which has been judged as defective, the method further comprising:

re-judging if the phase-shifting mask is defective or non-defective on the basis of a device to be formed, by a customer.

55. A method of manufacturing a half-tone phase-shifting mask comprising:

determining an average value of dimensions of a half-tone pattern in a half-tone phase-shifting mask;

determining an in-plane uniformity of the dimensions;

determining an average value of transmittance of the half-tone pattern;

determining an in-plane uniformity of the transmittance;

determining an average value of magnitude of phase-shift of the half-tone pattern;

determining an in-plane uniformity of the magnitude of phase-shift;

determining a first exposure latitude on the basis of the average value and the in-plane uniformity of the dimensions;

determining a second exposure latitude on the basis of the average value of the transmittance, the in-plane uniformity of the transmittance, the average value of the magnitude of phase-shift, and the in-plane uniformity of the magnitude of phase-shift;

determining a totality exposure latitude on the basis of the first and second exposure latitudes; and judging if the half-tone phase-shifting mask is defective or non-defective on the basis of whether or not the totality exposure latitude falls within a prescribed exposure latitude.

56. The method according to claim 55, wherein the in-plane uniformity of the transmittance and the in-plane uniformity of the magnitude of phase-shift are determined by making use of a previous mask, and the in-plane uniformities are determined not from subsequent masks after the previous mask.

57. A method of manufacturing an alternating phase-shifting mask comprising:

determining an average value of dimensions of a pattern in an alternating phase-shifting mask;

determining an in-plane uniformity of the dimensions;

determining an average value of magnitude of phase-shift of a light-transmitting region in the alternating phase-shifting mask;

determining an in-plane uniformity of the magnitude of phase-shift;

determining a first exposure latitude on the basis of the average value and the in-plane uniformity of the dimensions;

determining a second exposure latitude on the basis of the average value and the in-plane uniformity of the magnitude of phase-shift;

determining a totality exposure latitude on the basis of the first and second exposure latitudes; and judging if the alternating phase-shifting mask is defective or non-defective on the basis of whether or not the totality exposure latitude falls within a prescribed exposure latitude.

58. The method according to claim 57, wherein the in-plane uniformity of the magnitude of phase-shift is determined by making use of a previous mask, and the in-plane uniformity is determined not from subsequent masks after the previous mask.

59. The method according to claim 55, wherein the totality exposure latitude is defined from a defocusing latitude and a latitude of exposure dose.

60. The method according to claim 57, wherein the totality exposure latitude is defined from a defocusing latitude and a latitude of exposure dose.

* * * * *

UNITED STATES PATENT AND TRADEMARK OFFICE
CERTIFICATE OF CORRECTION

PATENT NO.    : 6,649,310 B2
DATED         : November 18, 2003
INVENTOR(S)   : Itoh et al.

It is certified that error appears in the above-identified patent and that said Letters Patent is hereby corrected as shown below:

<u>Title page,</u>
Item [57], ABSTRACT,
Line 3, change "photomask." to -- photomask, --.

<u>Column 46,</u>
Line 53, change "In-plane" to -- in-plane --.

<u>Column 49,</u>
Line 26, change "basis the" to -- basis of the --.

Signed and Sealed this

Tenth Day of February, 2004

JON W. DUDAS
*Acting Director of the United States Patent and Trademark Office*